(12) United States Patent
Li et al.

(10) Patent No.: US 12,550,337 B2
(45) Date of Patent: Feb. 10, 2026

(54) METAL HALIDE RESISTIVE MEMORY DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chia-Shuo Li, Miaoli County (TW); Yu-Tien Wu, Taipei (TW); Bo-You Chen, Tainan (TW); I-Chih Ni, New Taipei (TW); Chih-I Wu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 941 days.

(21) Appl. No.: 17/681,545

(22) Filed: Feb. 25, 2022

(65) Prior Publication Data

US 2023/0276720 A1    Aug. 31, 2023

(51) Int. Cl.
*H10B 63/00* (2023.01)
*H10N 70/00* (2023.01)
*H10N 70/20* (2023.01)

(52) U.S. Cl.
CPC ........... *H10B 63/30* (2023.02); *H10N 70/021* (2023.02); *H10N 70/023* (2023.02); *H10N 70/066* (2023.02); *H10N 70/245* (2023.02); *H10N 70/841* (2023.02); *H10N 70/8416* (2023.02); *H10N 70/881* (2023.02)

(58) Field of Classification Search
CPC .. H10N 70/881; H10N 70/021; H10N 70/023; H10N 70/063; H10N 70/066; H10N 70/068; H10N 70/841; H10N 70/245; H10N 70/8416; H10B 63/30
See application file for complete search history.

(56) References Cited

U.S. PATENT DOCUMENTS

| 2011/0120856 A1* | 5/2011 | Karg ................. H10N 70/8833 204/229.7 |
| 2020/0212300 A1 | 7/2020 | Jung et al. |

(Continued)

FOREIGN PATENT DOCUMENTS

| WO | WO-2018004650 A1 * | 1/2018 | ............. H10N 70/20 |
| WO | WO-2021210733 A1 * | 10/2021 | ............. H10N 70/00 |

OTHER PUBLICATIONS

Ma, F., Zhou, M., Jiao, Y. et al. Single Layer Bismuth Iodide: Computational Exploration of Structural, Electrical, Mechanical and Optical Properties. Sci Rep 5, 17558 (2015). https://doi.org/10.1038/srep17558 (Year: 2015).*

(Continued)

*Primary Examiner* — Ratisha Mehta
*Assistant Examiner* — Brad A Knudson
(74) *Attorney, Agent, or Firm* — Maschoff Brennan

(57) ABSTRACT

A method includes forming a transistor over a substrate; and forming a resistive element over the transistor, in which forming the resistive element includes forming a bottom electrode electrically connected to a source/drain region of the transistor; forming a resistive switching layer over the bottom electrode, in which the resistive switching layer is made of metal halide; and forming a top electrode over the resistive switching layer.

20 Claims, 54 Drawing Sheets

(56) References Cited

U.S. PATENT DOCUMENTS

| | | | | |
|---|---|---|---|---|
| 2020/0388755 A1* | 12/2020 | Chang | ............. | H10N 70/041 |
| 2021/0036057 A1* | 2/2021 | Hsieh | ............. | H10B 63/30 |
| 2022/0059618 A1* | 2/2022 | Hsu | ............. | H10N 70/8833 |

OTHER PUBLICATIONS

C.-S. Li, S.-W. Kuo, Y.-T. Wu, F.-Y. Fu, I-C. Ni, M.-H. Chen, C.-I Wu, âForming-Free, Nonvolatile, and Flexible Resistive Random-Access Memory Using Bismuth Iodide/van der Waals Materials Heterostructuresâ; Adv. Mater. Interfaces 2020, 7, 2001146. https://doi.org/10.1002/admi.202001146 (Year: 2020).*

Ma, F., Zhou, M., Jiao, Y. et al. Single Layer Bismuth Iodide: Computational Exploration of Structural, Electrical, Mechanical and Optical Properties. (Sci Rep 5, 17558 (2015). https://doi.org/10.1038/srep17558 (Year: 2015).*

C.-S. Li, S.-W. Kuo, Y.-T. Wu, F.-Y. Fu, I-C. Ni, M.-H. Chen, C.-I Wu, Forming-Free, Nonvolatile, and Flexible Resistive Random-Access Memory Using Bismuth Iodide/van der Waals Materials Heterostructures; Adv. Mater. Interfaces 2020, 7, 2001146. https://doi.org/10.1002/admi.202001146 (Year: 2020).*

Kai Qian et al., "Uncovering the Indium Filament Revolution in Transparent Bipolar ITO/SiOx/ITO Resistive Switching Memories." ACS Applied Materials & Interfaces, vol. 12, Dec. 31, 2019, pp. 4579-4585.

Lai-Guo Wang et al., "Excellent resistive switching properties of atomic layer-deposited Al2O3/HfO2/Al2O3 trilayer structures for non-volatile memory applications." Nanoscale Research Letters 10:135, Sep. 3, 2015, pp. 1-8.

Firman Mangasa Simanjuntak et al., "Status and prospects of ZnO-based resistive switching memory devices." Nanoscale Research Letters 11:368, Aug. 19, 2016 pp. 1-31.

Xue Jiang et al., "Effect of deposition temperature on ultra-low voltage resistive switching behavior of Fe-doped SrTiO3 films." Applied Physics Letters116, 102101, Mar. 9, 2020.

Chandni Kumari et al., "Robust non-volatile bipolar resistive switching in sol-gel derived BiFeO3 thin films." Superlattices and Microstructures, Aug. 2018.

Feichi Zhou et al., "Low-Voltage, Optoelectronic CH3NH3PbI3-xClx Memory With Integrated Sensing And Logic Operations." Advanced Functional Materials, 1800080, Apr. 1, 2018.

Cuhadar Can et al., "All-Inorganic Bismuth Halide Perovskite-like Materials A3Bi2I9 and A3Bi1. 8Na0. 218. 6 (A= Rb and Cs) for Low-Voltage Switching Resistive Memory." ACS applied materials & interfaces, Jul. 3, 2018.

Xiaohan Wu et al., "Thinnest nonvolatile memory based on monolayer h-BN." Advanced Materials, 1806790, Feb. 17, 2019.

Feng Zhang et al., "Electric-field induced structural transition in vertical MoTe2-and Mo1-xWx Te2-based resistive memories." Nature Materials vol. 18, Jan. 18, 2019, pp. 55-61.

* cited by examiner

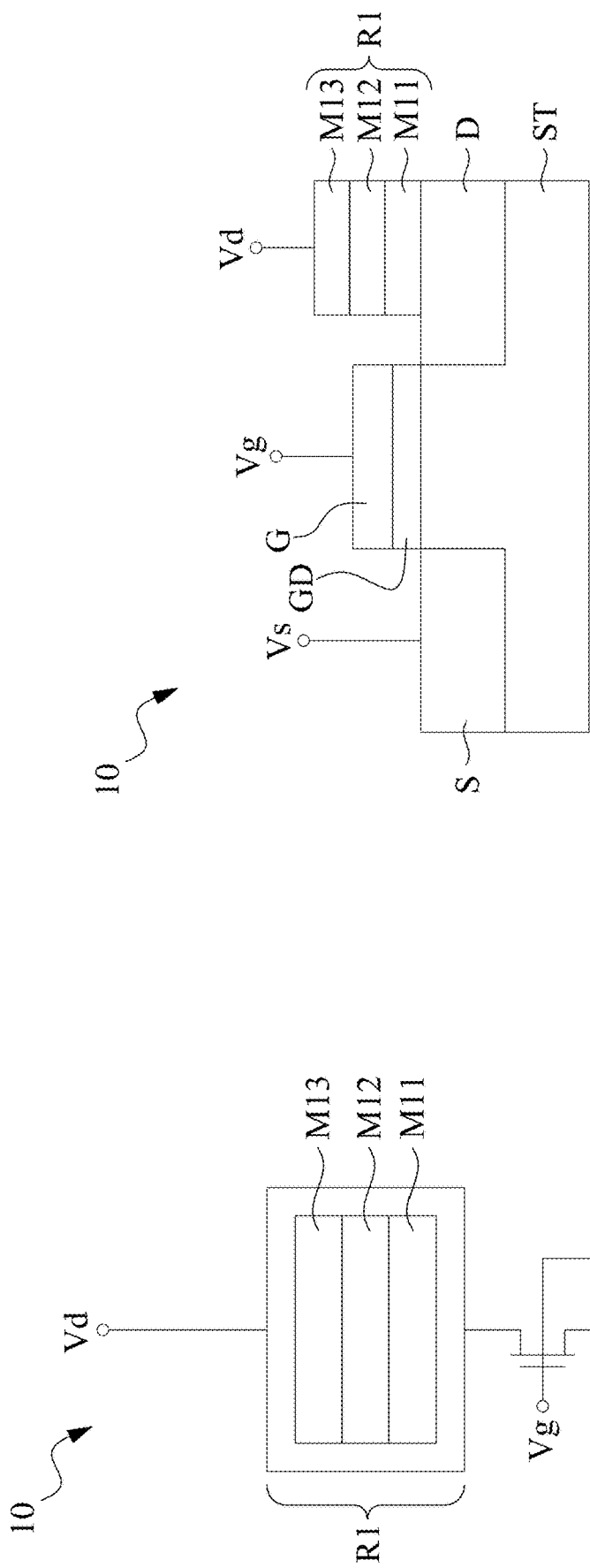

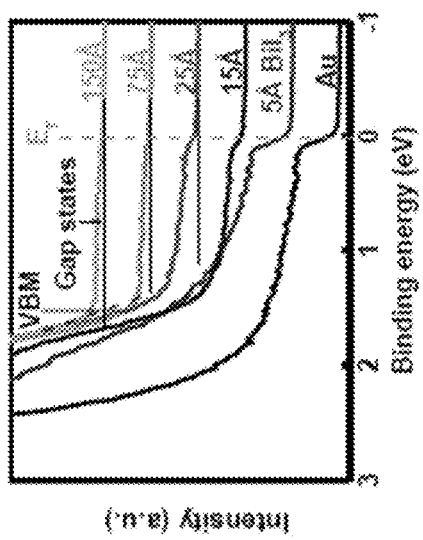
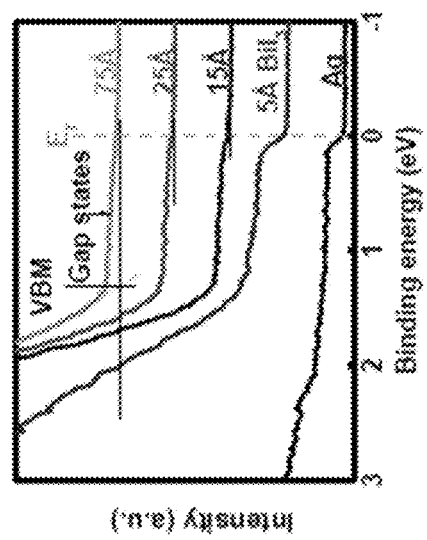
Fig. 7A
Fig. 7B

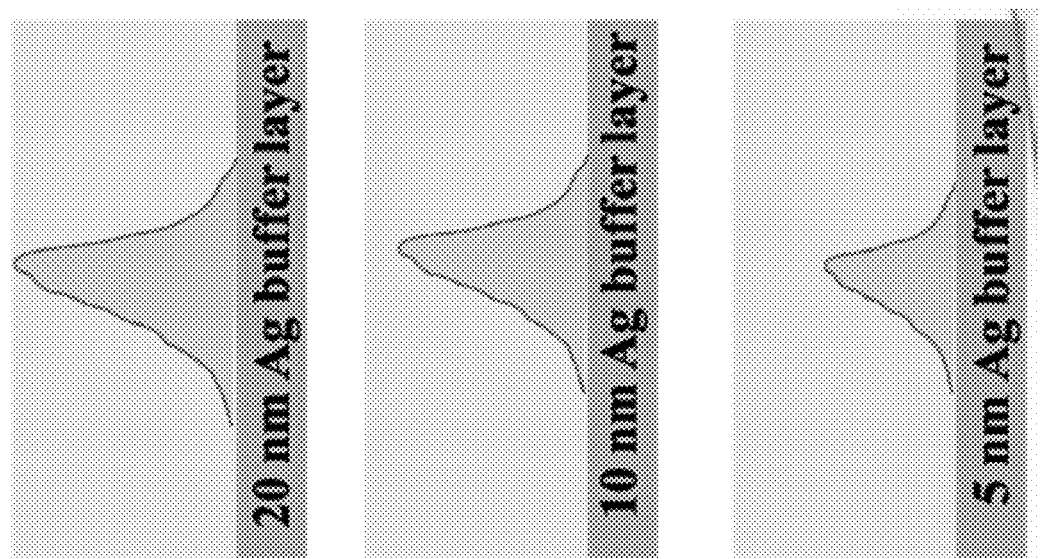
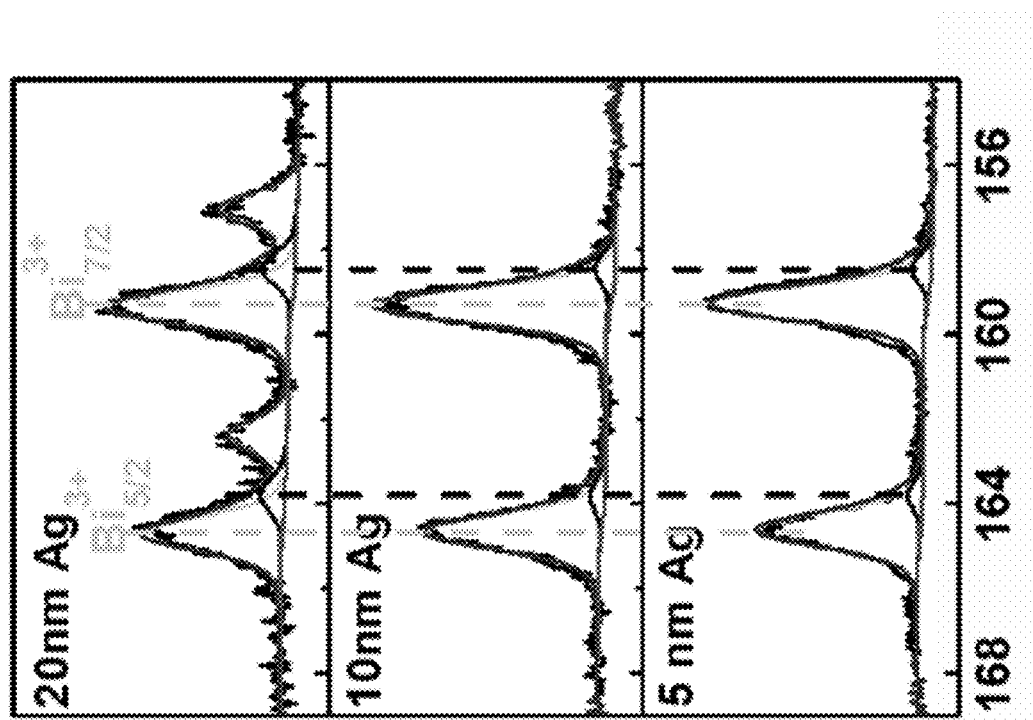
Fig. 12B
Fig. 12A

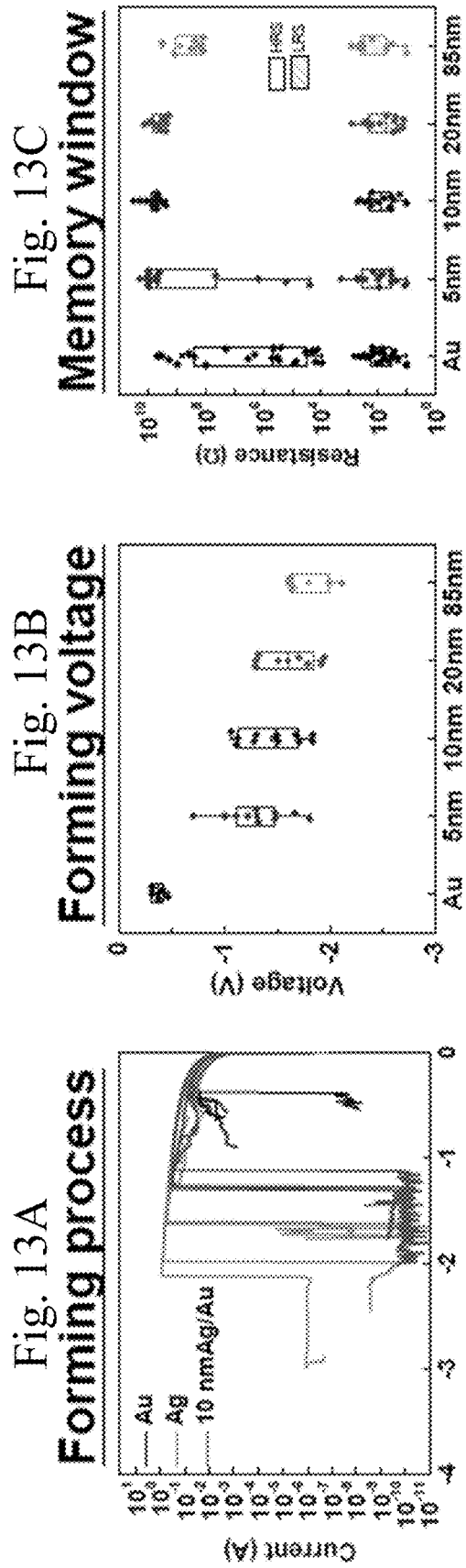
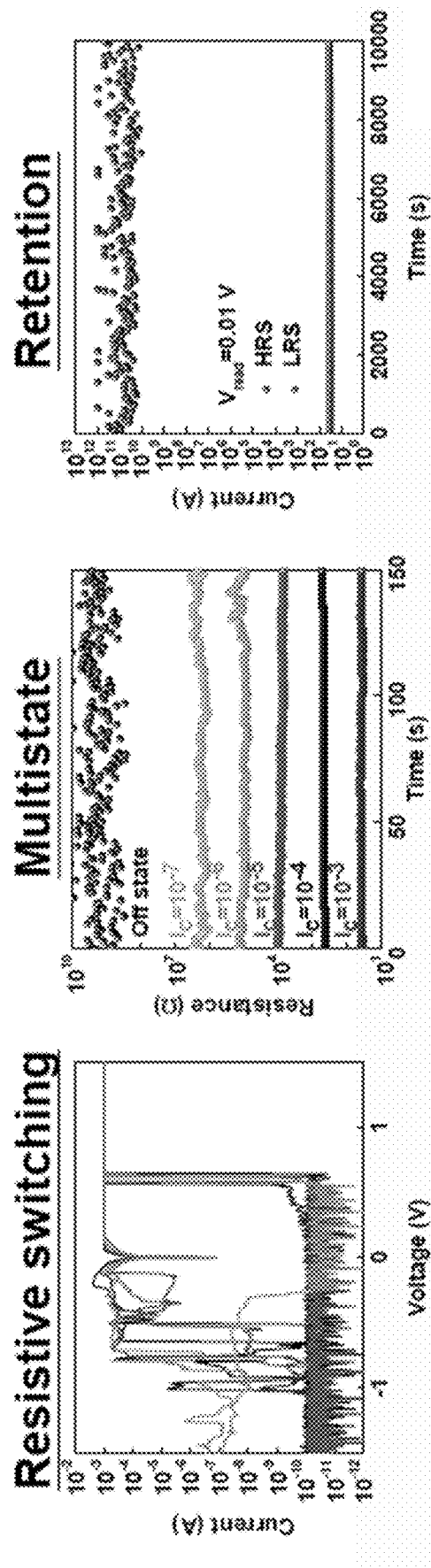
Fig. 13A Forming process
Fig. 13B Forming voltage
Fig. 13C Memory window
Fig. 13D Resistive switching
Fig. 13E Multistate
Fig. 13F Retention

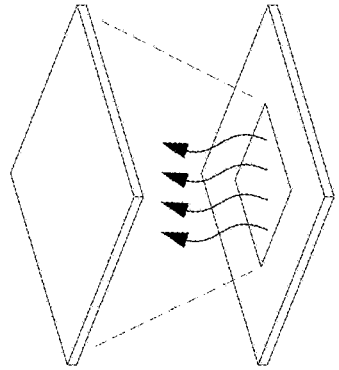
Fig. 15C
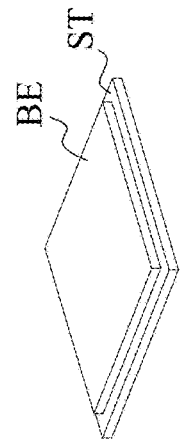
Fig. 15D
Fig. 15B
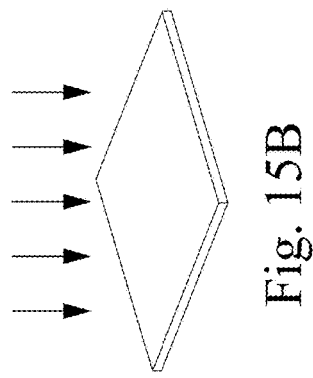
Fig. 15E
Fig. 15H
Fig. 15A
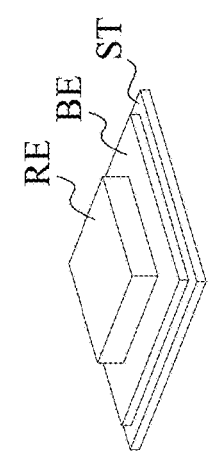
Fig. 15F
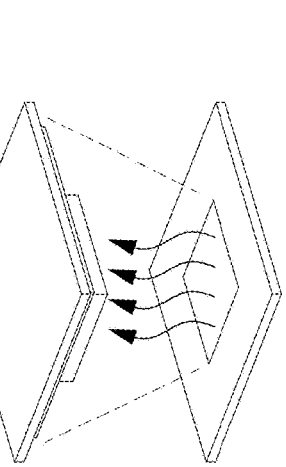
Fig. 15G
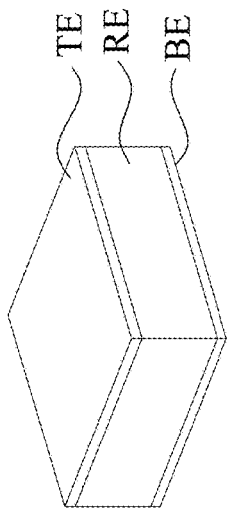

METAL HALIDE RESISTIVE MEMORY DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate schematic views of a memory device in accordance with some embodiments of the present disclosure.

FIGS. 7A and 7B are experiment results of memory devices in accordance with some embodiments of the present disclosure.

FIG. 12A illustrates experiment results of memory devices in accordance with some embodiments of the present disclosure.

FIG. 12B illustrates schematic views of resistive random access memory (RRAM) elements in accordance with some embodiments of the present disclosure.

FIGS. 13A to 13F illustrate experiment results of memory devices in accordance with some embodiments of the present disclosure.

FIGS. 15A to 15H illustrate a method for forming a resistive element in accordance to some embodiments of the present disclosure.

DETAILED DESCRIPTION

Figure 1C:
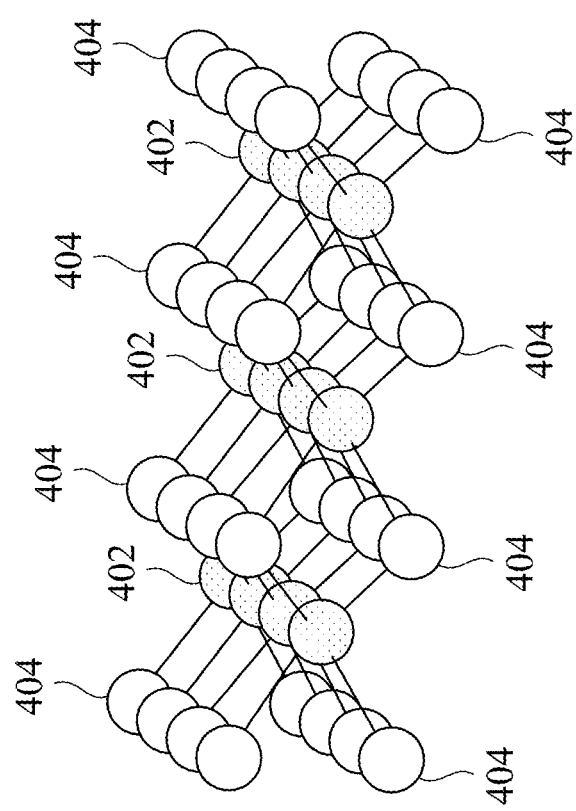
FIG. 1C illustrates a molecular diagram of a resistive switching layer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A and 1B illustrate schematic views of a memory device in accordance with some embodiments of the present disclosure. Shown there is a memory device 10. In some embodiments, the memory device 10 is a resistive random access memory (RRAM) device, which includes a transistor TR and a RRAM element R1. In some embodiments, the RRAM element R1 can also be referred to as a resistive memory cell.

As shown in FIG. 1B, the transistor TR may include a substrate ST, which may be made of a semiconductor material, such as silicon. The transistor TR may include a gate dielectric layer GD over the substrate ST and a gate structure G over the gate dielectric layer GD. The transistor TR may further include a source region S and a drain region D in the substrate ST and on opposite sides of the gate structure G.

The RRAM element R1 may include a metal layer M11, a resistive switching layer M12 over the metal layer M11, and a metal layer M13 over the resistive switching layer M12. In some embodiments, the metal layer M11 may be referred to as a bottom electrode, and may be made of gold (Au). In some embodiments, the resistive switching layer M12 may include metal halide materials, such as $PbI_2$, $CdI_2$, $PbCl_2$, $BiI_3$, or the like. In some embodiments, the resistive switching layer M12 may be made of $BiI_3$. In some embodiments, the metal layer M13 may be referred to as a top electrode, and may be made of gold (Au). In some embodiments, the metal layer M11 and the metal layer M13 are made of a same material.

In some embodiments, a thickness of the metal layer M11 is in a range from about 20 nm to 100 nm, a thickness of the resistive switching layer M12 is in a range from about 20 nm to 800 nm, and a thickness of the metal layer M13 is in a range from about 20 nm to 800 nm.

During operation of the memory device 10, source region S of the transistor TR is biased with a voltage Vs, the gate structure G of the transistor TR is biased with a voltage Vg, and the RRAM element R1 is biased with a voltage Vd.

FIG. 1C illustrates a molecular diagram of a resistive switching layer in accordance with some embodiments of the present disclosure. In some embodiments, the resistive switching layer (e.g., the resistive switching layer M12 of FIGS. 1A and 1B) may include a 2-D material crystalline structure. As used herein, consistent with the accepted definition within solid state material art, a "2-D material" may refer to a crystalline material consisting of a single layer of atoms. As widely accepted in the art, "2-D material" may also be referred to as a "mono-layer" material. In this disclosure, "2-D material" and "mono-layer" material are used interchangeably without differentiation in meanings, unless specifically pointed out otherwise. The 2-D material layer 110 may be 2-D materials of suitable thickness. In some embodiments, a 2-D material includes a single layer of atoms in each of its mono-layer structure, so the thickness of the 2-D material refers to a number of mono-layers of the 2-D material, which can be one mono-layer or more than one mono-layer. The coupling between two adjacent mono-layers of 2-D material includes van der Waals forces, which are weaker than the chemical bonds between/among atoms within the single mono-layer.

The one-molecule thick resistive switching layer includes atoms 402 of a metal and atoms 404 of a halogen. The metal atoms 402 may form a layer in a middle region of the one-molecule thick resistive switching layer, and the halogen atoms 404 may form a first layer over the middle layer of metal atoms 402, and a second layer underlying the middle layer of metal atoms 402. The metal atoms 402 may be Pb atoms, Cd atoms, Bi atoms, or the like. The halogen atoms 404 may be I atoms, Cl atoms, or the like. Throughout the description, the illustrated cross-bonded layers including one layer of metal atoms 402 and two layers of halogen atoms 404 in combination are referred to as a mono-layer of resistive switching layer.

Figures 2A, 2B:
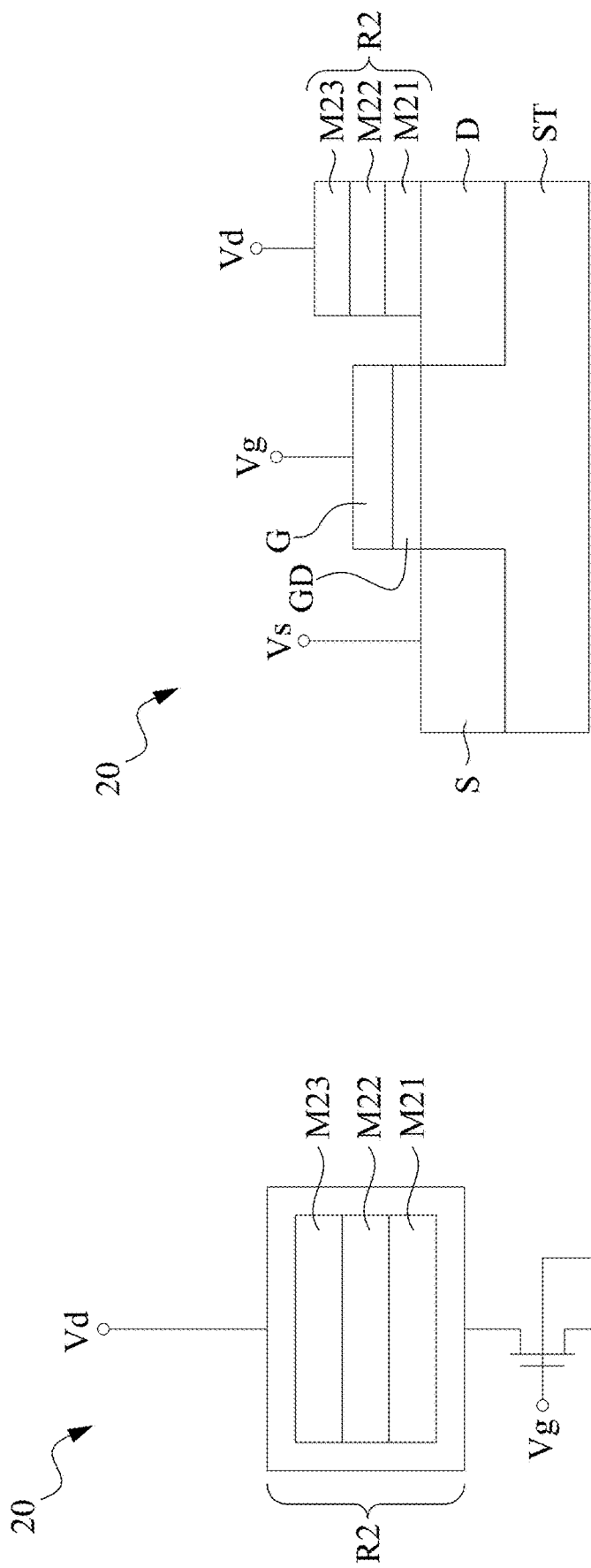
FIGS. 2A and 2B illustrate schematic views of a memory device in accordance with some embodiments of the present disclosure.

FIGS. 2A and 2B illustrate schematic views of a memory device in accordance with some embodiments of the present disclosure. Shown there is a memory device 20. In some embodiments, the memory device 20 is a resistive random access memory (RRAM) device, which includes a transistor TR and a RRAM element R2. It is noted that some elements of the memory device 20 are the same as the elements of the memory device 10 as discussed in FIGS. 1A and 1B, such elements are labeled the same, and relevant details will not be repeated for brevity.

The RRAM element R2 of the memory device 20 may include a metal layer M21, a resistive switching layer M22 over the metal layer M21, and a metal layer M23 over the resistive switching layer M22. In some embodiments, the metal layer M21 may be referred to as a bottom electrode, and may be made of silver (Ag). In some embodiments, the resistive switching layer M22 may include metal halide materials, such as $PbI_2$, $CdI_2$, $PbCl_2$, $BiI_3$, or the like. In some embodiments, the resistive switching layer M22 may be made of $BiI_3$. In some embodiments, the metal layer M23 may be referred to as a top electrode, and may be made of gold (Au). In some embodiments, the metal layer M21 and the metal layer M23 are made of different materials.

In some embodiments, a thickness of the metal layer M21 is in a range from about 20 nm to 100 nm, a thickness of the resistive switching layer M22 is in a range from about 20 nm to 800 nm, and a thickness of the metal layer M23 is in a range from about 20 nm to 800 nm.

In some embodiments, when a $BiI_3$ layer is formed over an Au bottom electrode, the structure exhibits a preferential growth along the in-plane direction, this will lead to the increase in roughness with increasing thickness of $BiI_3$ layer. However, when a $BiI_3$ layer is formed over the Ag bottom electrode, the structure exhibits a porous nanostructure, which is different from the result of the sample where $BiI_3$ layer is formed over the Au bottom electrode. This may be due to the $BiI_3$ chemical reacting with Ag, leading to the formation of AgI, which will be discussed later.

Figures 3A, 3B:
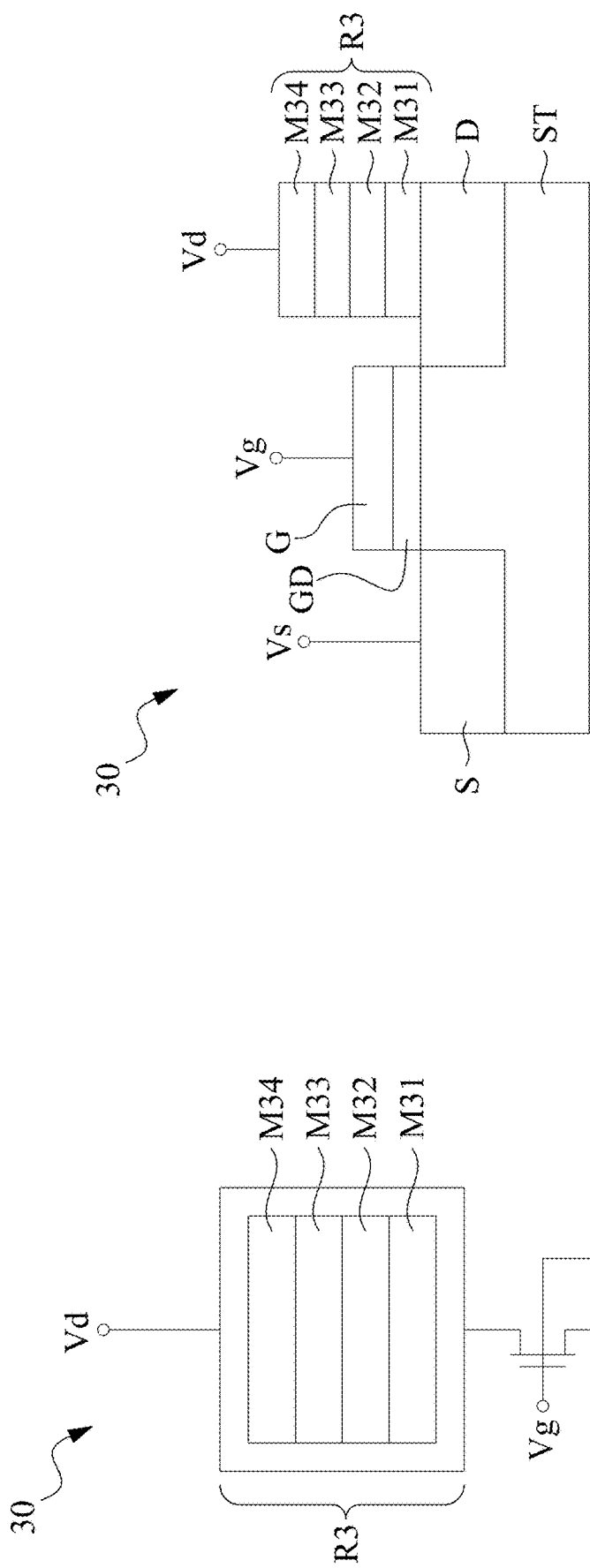
FIGS. 3A and 3B illustrate schematic views of a memory device in accordance with some embodiments of the present disclosure.

FIGS. 3A and 3B illustrate schematic views of a memory device in accordance with some embodiments of the present disclosure. Shown there is a memory device 30. In some embodiments, the memory device 30 is a resistive random access memory (RRAM) device, which includes a transistor TR and a RRAM element R3. It is noted that some elements of the memory device 30 are the same as the elements of the memory device 10 as discussed in FIGS. 1A and 1B and the elements of the memory device 20 as discussed in FIGS. 2A and 2B, such elements are labeled the same, and relevant details will not be repeated for brevity.

The RRAM element R3 of the memory device 30 may include a metal layer M31, a metal layer M32 over the metal layer M31, a resistive switching layer M33 over the metal layer M32, and a metal layer M34 over the resistive switching layer M33. In some embodiments, the metal layer M31 may be made of gold (Au), while the metal layer M32 may be made of silver (Ag). The metal layers M31 and M32 may be collective referred to as a bottom electrode. In some embodiments, the resistive switching layer M33 may include metal halide materials, such as $PbI_2$, $CdI_2$, $PbCl_2$, $BiI_3$, or the like. In some embodiments, the resistive switching layer M22 may be made of $BiI_3$. In some embodiments, the metal layer M34 may be referred to as a top electrode, and may be made of gold (Au). That is, the metal layers M31 and M34 are made of a same material, while the metal layers M31 and M34 are made of a material different from a material of the metal layer M32.

In some embodiments, a thickness of the metal layer M31 is in a range from about 20 nm to 100 nm, a thickness of the metal layer M32 is in a range from about 5 nm to 15 nm, a thickness of the resistive switching layer M33 is in a range from about 20 nm to 800 nm, and a thickness of the metal layer M34 is in a range from about 20 nm to 800 nm. In some embodiments, the metal layer M32 is thinner than the metal layer M31 and the metal layer M34.

Comparing the memory devices 10, 20, and 30 of FIGS. 1A, 2A, and 3A, the memory device 10 of FIG. 1A includes a RMS roughness in a range from about 11 nm to about 13 nm (such as 12 nm), a forming voltage in a range from about −0.3V to −0.7V (such as −0.5V), an ON/OFF ratio in a range from about 104 to about 105, a retention time in a range from about 500 s to about 600 s. The memory device 20 of FIG. 2A includes a RMS roughness in a range from about 13 nm to about 14 nm (such as 13.7 nm), a forming voltage in a range from about −1.8V to −2.2V (such as −2.0V), an ON/OFF ratio in a range from about 106 to about 107, a retention time in a range from about 103 s to about 104 s, and includes at least 4 multistate. The memory device 30 of FIG. 3A includes a RMS roughness in a range from about 8 nm to about 9 nm (such as 8.3 nm), a forming voltage in a range from about −0.6V to −1.0V (such as −0.85V), an ON/OFF ratio in a range from about 108 to about 109, a retention time in a range from about 103 s to about 104 s, and includes at least 4 multistate.

The present disclosure provides a RRAM device using metal halide material as a resistive switching layer, which will lead to several advantages. For example, the metal halide material may include a 2-D material structure, and may provide a flexible application. The 2-D material structure may include low carrier concentration (adopt in X-ray detection) and low conductivity in the out-of-plane direction, which make it a promising candidate as a resistive switching layer. Furthermore, the metal halide, such as $BiI_3$, is a nontoxic material and is environmentally-friendly. Moreover, the halide material can be easily fabricated (e.g., thermal deposition method), which will reduce the fabrication cost.

Figure 4:
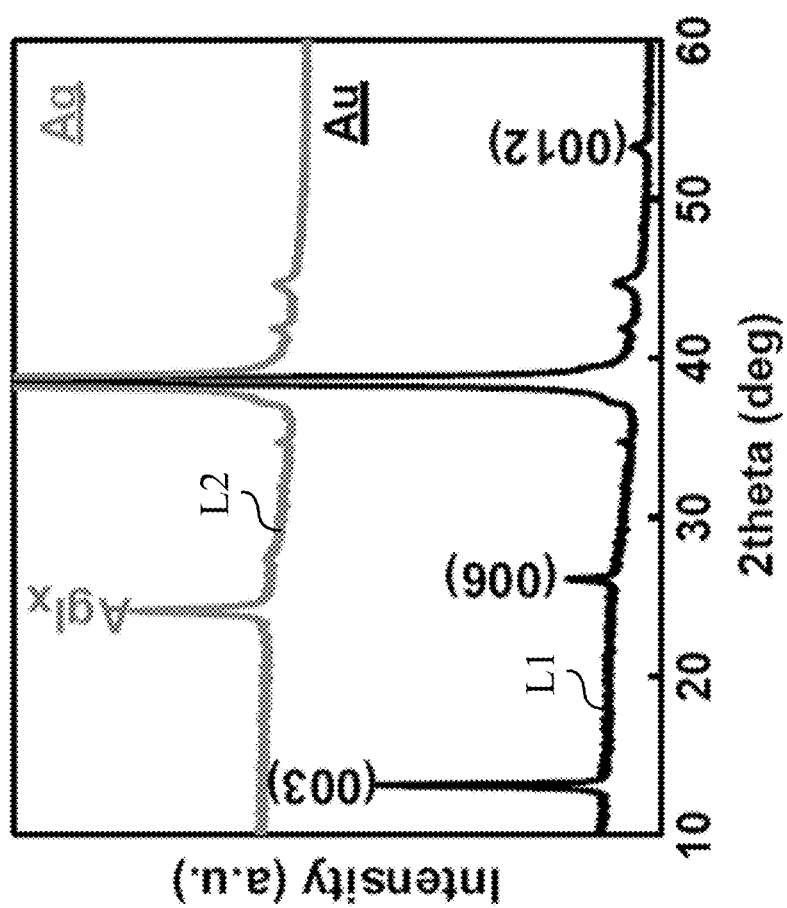
FIG. 4 illustrates experiment results of memory devices in accordance with some embodiments of the present disclosure.

FIG. 4 illustrates experiment results of memory devices in accordance with some embodiments of the present disclosure. As shown in FIG. 4, the lower curve L1 shows the experiment result of a sample where a $BiI_3$ layer is formed over an Au layer, and the upper curve L2 shows a sample where a $BiI_3$ layer is formed over an Ag layer. The results show that an $AgI_x$ peak is observed in the sample where $BiI_3$ layer is formed over an Ag layer. This may indicate that the $BiI_3$ layer may react with Ag, leading to the formation of $AgI_x$. However, $BiI_3$ layer may not react with the Au layer. Stated another way, Ag has a greater tendency to react with the $BiI_3$ layer than Au.

Figure 5C:
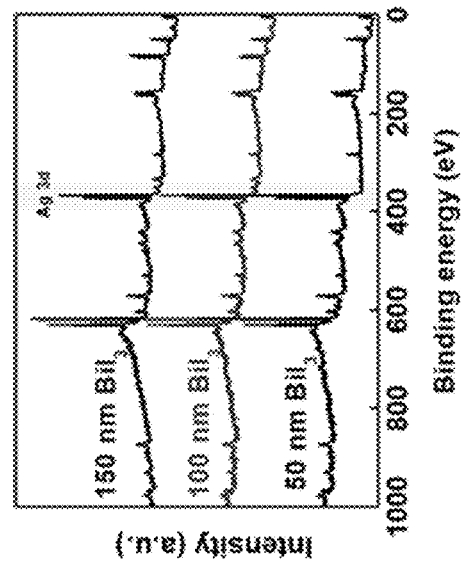
FIGS. 5A, 5B and 5C are experiment results of memory devices in accordance with some embodiments of the present disclosure.
Figure 5B:
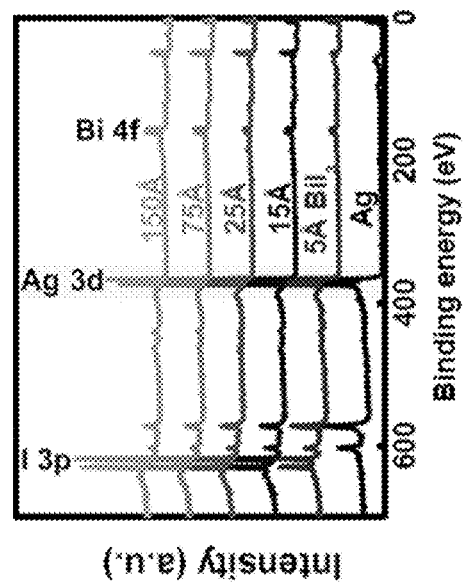
Figure 5A:
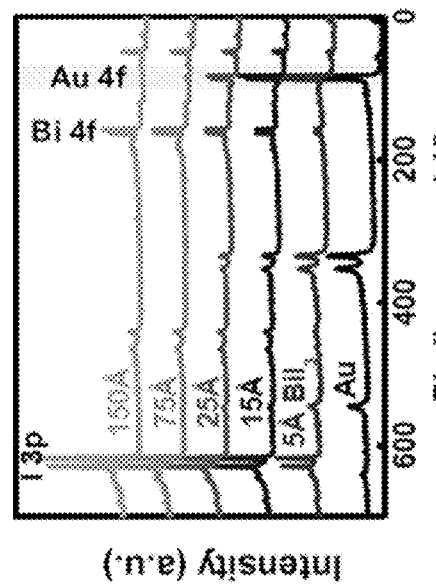

FIGS. 5A, 5B and 5C are experiment results of memory devices in accordance with some embodiments of the present disclosure. FIG. 5A illustrates X-ray photoelectron spectroscopy (XPS) results of a sample where a $BiI_3$ layer is formed over an Au layer, FIG. 5B illustrates XPS results of a sample where a $BiI_3$ layer is formed over an Ag layer, and FIG. 5C illustrates XPS results of samples where $BiI_3$ layers with different thicknesses are formed over Ag layers.

In FIG. 5A, it can be seen that the Au peaks decreases as a thickness of the $BiI_3$ layer increases. For example, almost no Au peak when the thickness of the $BiI_3$ layer is about 150 Å. In FIG. 5B, it can be seen that the Ag peaks remain strong when a thickness of the $BiI_3$ layer increases. For example, a strong Ag peak presents when the thickness of the $BiI_3$ layer is about 150 Å. As a result, when a $BiI_3$ layer is formed over an Ag layer, Ag peaks can be detected when the thickness of the $BiI_3$ layer ranges from about 15 Å to about 150 Å. In FIG. 5O, it can be seen that when the thickness of the $BiI_3$ layer increases to 50 nm, 100 nm, and 150 nm, respectively, strong Ag peaks can still be detected. The result may indicate that when a $BiI_3$ layer is formed over an Ag layer, Ag atoms may diffuse upwardly through the $BiI_3$ layer.

Figure 6A:
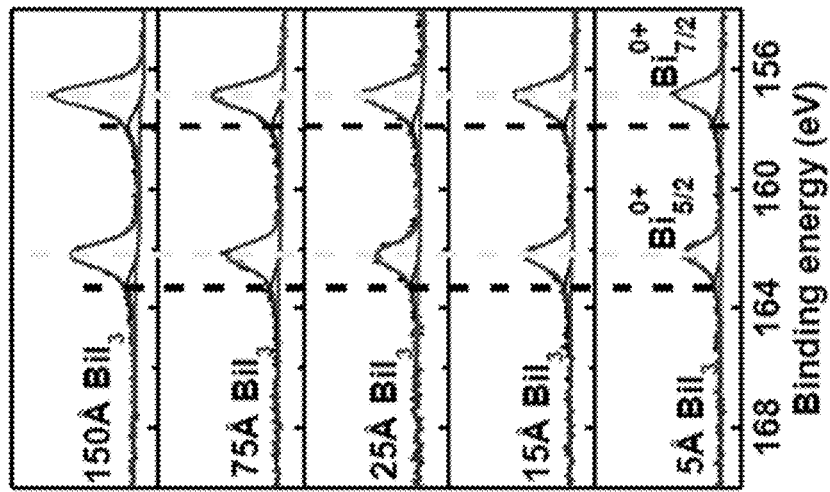
FIGS. 6A and 6B are experiment results of memory devices in accordance with some embodiments of the present disclosure.
Figure 6B:
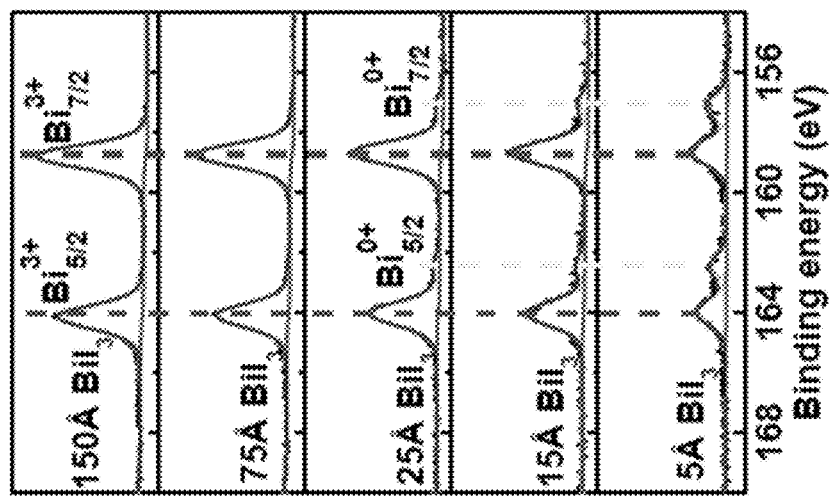

FIGS. 6A and 6B are experiment results of memory devices in accordance with some embodiments of the present disclosure. FIG. 6A illustrates X-ray photoelectron spectroscopy (XPS) results of a sample where a $BiI_3$ layer is formed over an Au layer, FIG. 6B illustrates XPS results of a sample where a $BiI_3$ layer is formed over an Ag layer.

In FIG. 6A, it can be seen that signals of $Bi^{0+}$ decrease when the thickness of the $BiI_3$ layer increases. For example, a small $Bi^{0+}$ peak presents when the thickness of the $BiI_3$ layer is about 5 Å, and almost no $Bi^{0+}$ peak presents when the thickness of the $BiI_3$ layer is over 75 Å. Moreover, signals of $Bi^{3+}$ increase when the thickness of the $BiI_3$ layer increases. For example, a largest $Bi^{3+}$ peak presents when the thickness of the $BiI_3$ layer is about 150 Å. The result may indicate that Bi metal (e.g., $Bi^{0+}$) only presents at $Au/BiI_3$ interface.

On the other hand, in FIG. 6B, it can be seen that the signals of $Bi^{0+}$ are strong throughout the whole $BiI_3$ layer. This is because, as discussed above, the Ag atoms may diffuse upwardly and react with $BiI_3$ to form $AgI_x$. Accordingly, Bi atoms of the $BiI_3$ layer may be released, which will also lead to the reduction of $Bi^{3+}$. For example, $Bi^{3+}$ peaks are low throughout the whole $BiI_3$ layer. In some embodiments, the released Bi atoms (Bi metal) may cause a self-formed conductive filament extending through the $BiI_3$ layer, which will be discussed later.

FIGS. 7A and 7B are experiment results of memory devices in accordance with some embodiments of the present disclosure. FIG. 7A illustrates ultraviolet photoelectron spectroscopy (UPS) results of a sample where a $BiI_3$ layer is formed over an Au layer, FIG. 7B illustrates UPS results of a sample where a $BiI_3$ layer is formed over an Ag layer.

FIGS. 7A and 7B show that in both conditions, there are energy states that extend to fermi level ($E_f$). This shows that both devices are in low-resistance state. That is, when the RRAM device is first formed, the resistive switching layer is in a low-resistance state rather than a high-resistance state.

Figure 8A:
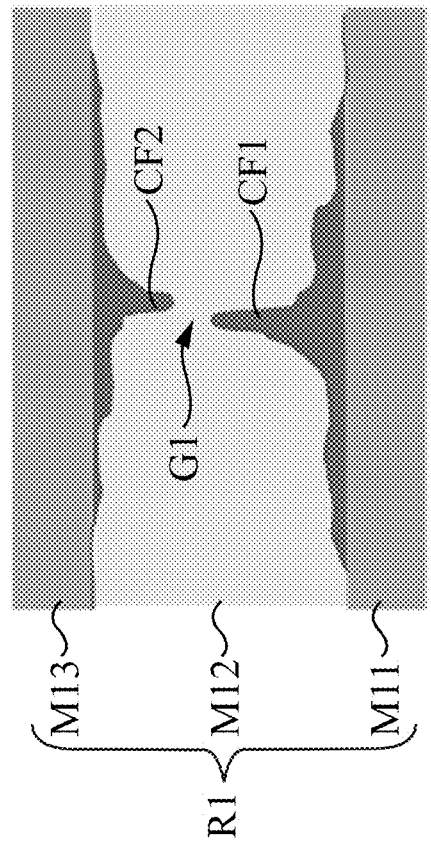
FIGS. 8A and 8B are schematic views of resistive random access memory (RRAM) element in accordance with some embodiments of the present disclosure.
Figure 8B:
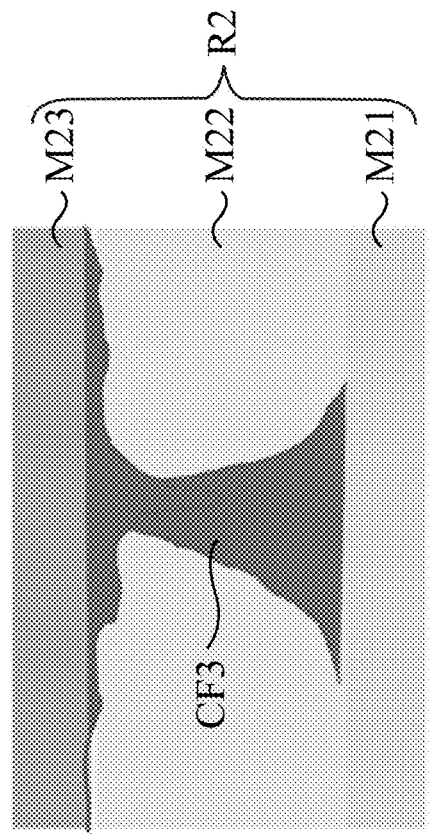

FIGS. 8A and 8B are schematic views of resistive random access memory (RRAM) element in accordance with some embodiments of the present disclosure. The RRAM element R1 of FIG. 8A is the same as the RRAM element R1 discussed in FIGS. 1A and 1B. The RRAM element R2 of FIG. 8B is the same as the RRAM element R2 discussed in FIGS. 2A and 2B.

In FIG. 8A, a resistive switching layer M12 is sandwiched between a metal layer M11 and a metal layer M13. In some embodiments, the resistive switching layer M12 is made of $BiI_3$, and the metal layers M11 and M13 are made of gold (Au). When the RRAM element R1 is first formed (e.g., without any operation), a conductive filament CF1 extends upwardly from an interface of the metal layer M11 and the resistive switching layer M12, and a conductive filament CF2 extends downwardly from an interface of the metal layer M13 and the resistive switching layer M12. In some embodiments, the conductive filament CF1 and the conductive filament CF2 extend toward each other, while there is still a gap G1 between the conductive filament CF1 and the conductive filament CF2.

On the other hand, in FIG. 8B, a resistive switching layer M22 is sandwiched between a metal layer M21 and a metal layer M23. In some embodiments, the resistive switching layer M22 is made of $BiI_3$, the metal layers M21 is made of silver (Ag), and the metal layer M33 is made of gold (Au).

When the RRAM element R2 is first formed (e.g., without any operation), a conductive filament CF3 extends through the entire resistive switching layer M22 and forms a conductive path between the metal layer M21 and a metal layer M23. That is, the conductive filament CF3 extends from an interface between the metal layer M21 and the resistive switching layer R22 to an interface between the metal layer M23 and the resistive switching layer R22. This phenomenon corresponds to the experiments results discussed above, in which Ag atoms may diffuse from the metal layer M21 upwardly and vertically throughout the resistive switching layer M22, and may react with $BiI_3$ layer to form $AgI_x$, which will release Bi atoms and form the Bi conductive filament CF3 throughout the resistive switching layer M22. Accordingly, once the memory device is fabricated (without applying any bias to the resistive switching layer), a spontaneous or self-formed conductive filament will present in the resistive switching layer of the memory device. That is, once the memory device is fabricated, the resistive switching layer is in a low-resistance state rather than a high-resistance state. Stated another way, once the resistive switching layer is formed over an Ag bottom electrode, a self-formed conductive filament will present in the resistive switching layer, and will extend from an interface of the resistive switching layer and the Ag bottom electrode to a top surface of the resistive switching layer. In some embodiments, the self-formed conductive filament will present in the resistive switching layer prior to forming a top electrode over the resistive switching layer.

Figure 9:
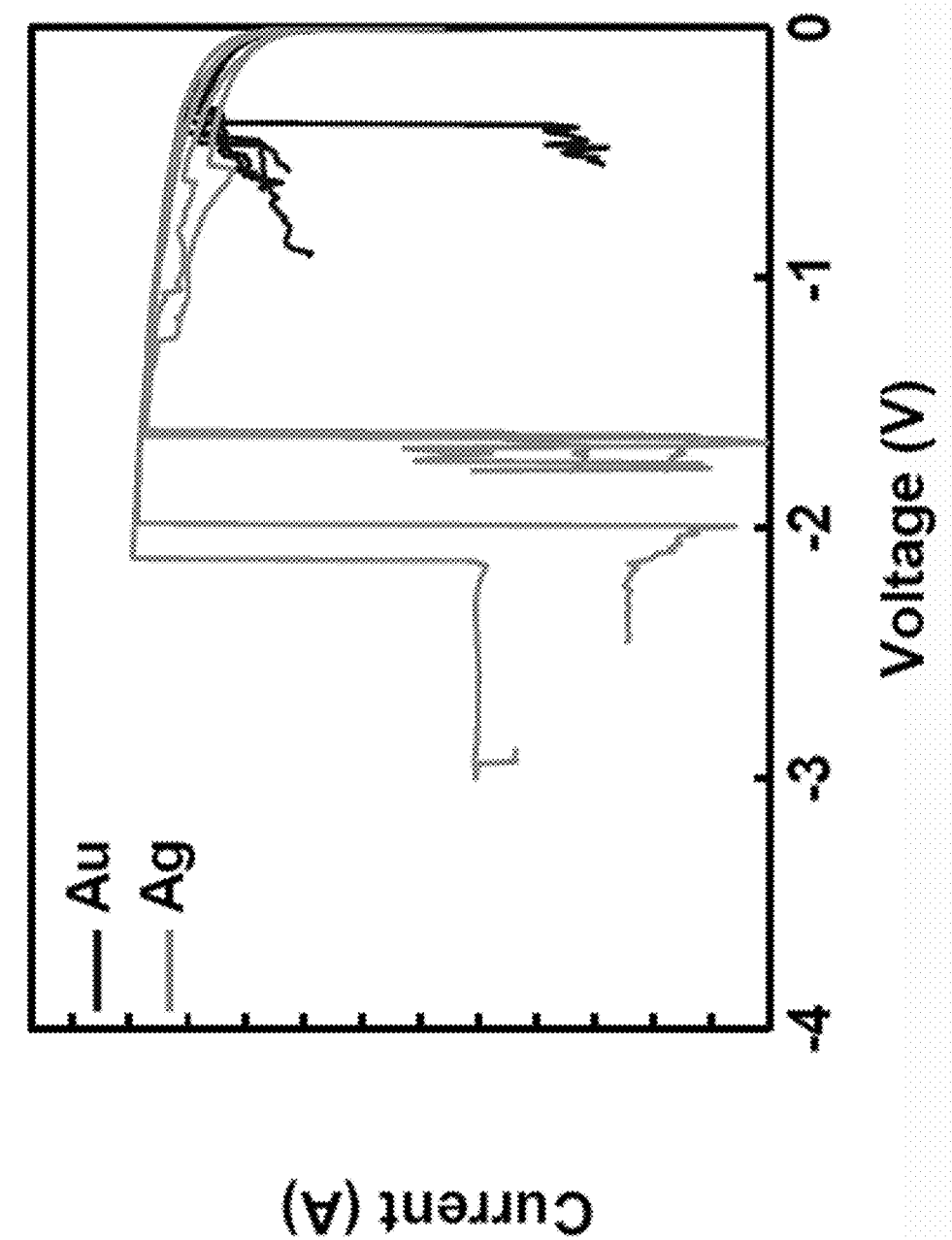
FIG. 9 illustrates I-V curves of memory devices in accordance with some embodiments of the present disclosure.

FIG. 9 illustrates I-V curves of memory devices in accordance with some embodiments of the present disclosure. FIG. 9 illustrates I-V curves of the samples of FIGS. 8A and 8B, respectively. It can be seen that a larger negative voltage (e.g., about −2.0V) is needed to change the resistive element which includes Ag bottom electrode from a low resistive state (large current) to a high resistive state (low current). On the other hand, a lower negative voltage (e.g., about −1.5V) is needed to change the resistive element which includes Au bottom electrode from a low resistive state (large current) to a high resistive state (low current). This is because, as discussed above, a thick conductive filament (e.g., conductive filament CF3 of FIG. 8B) may be self-formed in the resistive switching layer when the resistive switching layer is formed over an Ag bottom electrode. Therefore, a larger negative voltage is needed to break the conductive filament to change the resistive element from low resistive state (large current) to a high resistive state (low current).

Figure 10B:
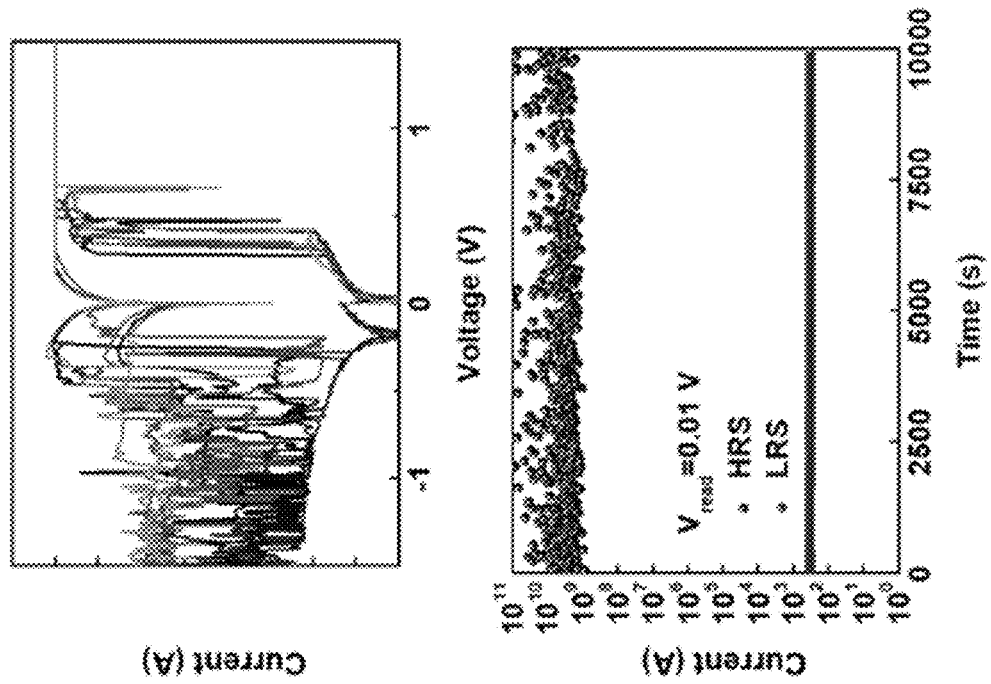
FIGS. 10A and 10B illustrate I-V curves and retention properties of memory devices in accordance with some embodiments of the present disclosure.
Figure 10A:
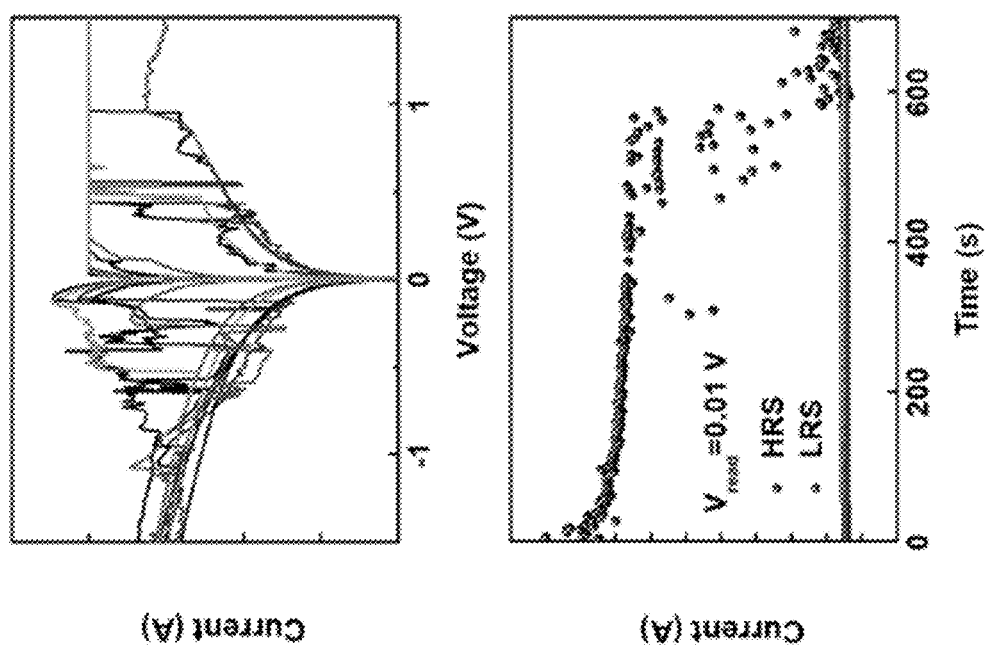

FIGS. 10A and 10B illustrate I-V curves and retention properties of memory devices in accordance with some embodiments of the present disclosure. In greater details, FIG. 10A is an experiment result of the memory device 10 of FIGS. 1A and 1B, in which the resistive element includes a resistive switching layer formed over an Au bottom electrode. FIG. 10B is an experiment result of the memory device 20 of FIGS. 2A and 2B, in which the resistive element includes a resistive switching layer formed over an Ag bottom electrode. The results show that both cases have RRAM memory properties, this shows that metal halide materials are promising candidates for RRAM memory.

Figure 11:
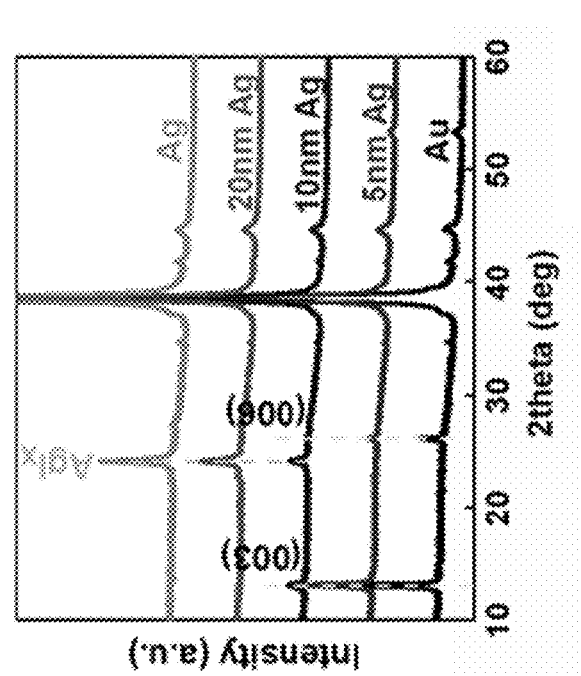
FIG. 11 illustrates experiment results of memory devices in accordance with some embodiments of the present disclosure.

FIG. 11 illustrates experiment results of memory devices in accordance with some embodiments of the present disclosure. As shown in FIG. 11, the experiment results of sample where $BiI_3$ layers are formed over Ag layers having different thicknesses (e.g., 5 nm, 10 nm, 20 nm) are shown. The results show that $AgI_x$ peaks get stronger when the thickness of the Ag layer increases. This may indicate that thicker Ag layer will lead to more Ag atoms diffusing upwardly and react with $BiI_3$, which will result in the increasing formation of $AgI_x$.

FIG. 12A illustrates experiment results of memory devices in accordance with some embodiments of the present disclosure. FIG. 12B illustrates schematic views of resistive random access memory (RRAM) elements in accordance with some embodiments of the present disclosure. In greater details, FIG. 12A illustrates X-ray photoelectron spectroscopy (XPS) results of samples where $BiI_3$ layers are formed over Ag layer having different thicknesses (e.g., 5 nm, 10 nm, 20 nm). FIG. 12B illustrates schematic views of RRAM elements corresponding to three conditions of FIG. 12A, respectively.

As shown in FIG. 12A, it can be seen that when the Ag layer gets thicker, the $Bi^{0+}$ peak may increase, while the $Bi^{3+}$ peak may decrease. This is because when the Ag layer is thicker, more Ag atoms may diffuse upwardly and react with $BiI_3$, leading to the increase of Bi atoms. In FIG. 12B, it can be seen that when the Ag layer gets thicker, more Bi atoms will be released as a result of the upward diffusion of more Ag atoms. Accordingly, a conductive filament may be self-formed throughout the whole resistive switching layer.

FIGS. 13A to 13F illustrate experiment results of memory devices in accordance with some embodiments of the present disclosure. The results show that by using metal halide materials as resistive switching layer, and by using Au or Ag as bottom electrode, the devices may include general properties of an RRAM memory device.

Figure 14:
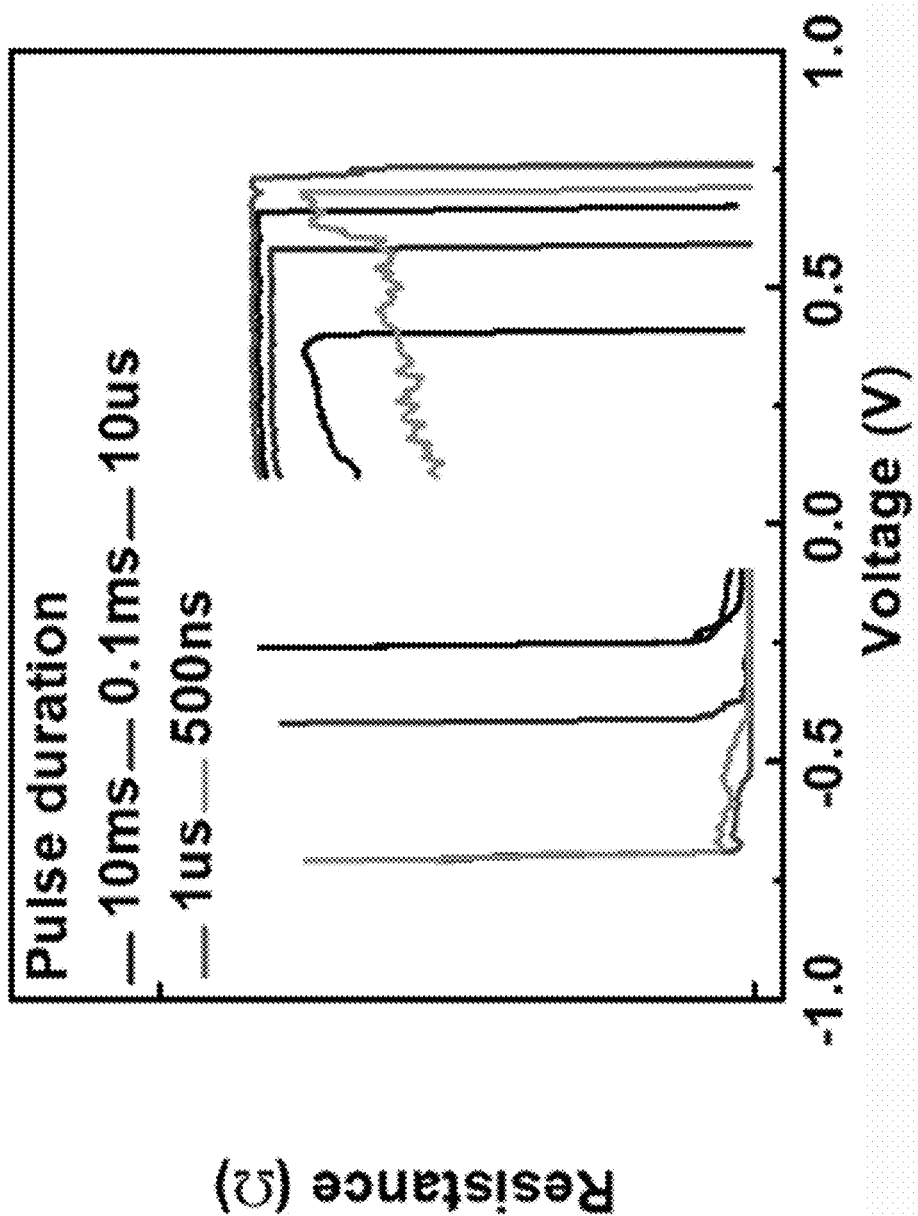
FIG. 14 illustrates experiment results of memory devices in accordance with some embodiments of the present disclosure.

FIG. 14 illustrates experiment results of memory devices in accordance with some embodiments of the present disclosure. In greater details, FIG. 14 illustrates experiment results of sample where a $BiI_3$ layer is formed over an Ag layer. The results show that the switching speed of the memory device can be down to lower than 500 ns. Accordingly, by using an Ag layer as a bottom electrode, the device performance can be improved.

FIGS. 15A to 15H illustrate a method for forming a resistive element in accordance to some embodiments of the present disclosure. For example, FIGS. 15A to 15H illustrate a method for forming the resistive element R1, R2 and R3 as discussed in FIGS. 1A to 3B.

In FIG. 15A, a substrate ST is provided. Here, the substrate ST is similar the substrate ST discussed in FIGS. 1A to 3B, in which source region S, drain region D, and gate structure G are formed over the substrate ST.

A first cleaning process is performed to the substrate ST. In some embodiments, the first cleaning process may include a first cleaning step using DI water, a second cleaning step using Acetone, a third cleaning step using Methanol, and a forth cleaning step using IPA. Each of the first, second, third, and fourth cleaning steps may be performed for about 8 min to about 12 min, such as 10 min in some embodiments.

In FIG. 15B, a second cleaning process is performed to the substrate ST. In some embodiments, the second cleaning process may include performing a UV-ozone treatment. The second cleaning process may be performed for about 13 min to about 17 min, such as 15 min in some embodiments.

In FIG. 15C, the substrate ST is transferred to a first deposition chamber, and a first deposition process is performed. As a result, a bottom electrode BE is formed over the substrate ST, and the resulting structure is shown in FIG. 15D. In some embodiments, the first deposition process may be thermal evaporation. In some embodiments, the bottom electrode BE may be the metal layers M11, M21, M31, and M32 as discussed in FIGS. 1A to 3B.

In FIG. 15E, the substrate ST is transferred to a second deposition chamber, and a second deposition process is performed. As a result, a resistive switching layer RE is formed over the bottom electrode BE, and the resulting structure is shown in FIG. 15F. In some embodiments, the second deposition process may be thermal evaporation. In some embodiments, the resistive switching layer RE may be the resistive switching layers M12, M22, and M33 as discussed in FIGS. 1A to 3B.

In FIG. 15G, the substrate ST is transferred to a third deposition chamber, and a third deposition process is performed. As a result, a top electrode TE is formed over the resistive switching layer RE, and the resulting structure is shown in FIG. 15H. In some embodiments, the third deposition process may be thermal evaporation. In some embodiments, the top electrode TE may be the metal layers M13, M23, and M34 as discussed in FIGS. 1A to 3B.

FIGS. 16 to 31 illustrate a method in various stages of fabricating a memory device in accordance with some embodiments of the present disclosure. It is noted that the FIGS. 16 to 31 illustrate a method for forming the memory device 10 of FIGS. 1A and 1B.

Figure 16:
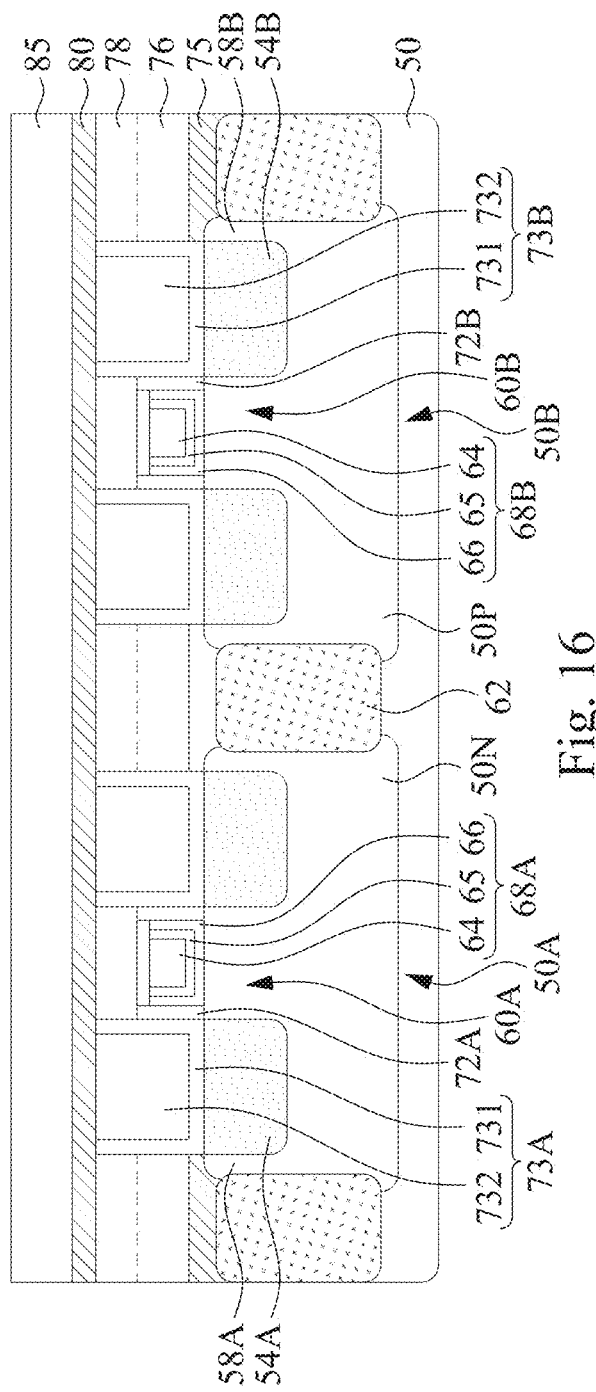
FIGS. 16 to 31 illustrate a method in various stages of fabricating a memory device in accordance with some embodiments of the present disclosure.

Reference is made to FIG. 16. A semiconductor substrate 50 in which various electronic devices may be formed, in accordance with some embodiments. Generally, the substrate 50 illustrated in FIG. 16 may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

In some embodiments, appropriate wells may be formed in the semiconductor substrate 50. For example, a N-well region 50N may be formed in a first region 50A of the semiconductor substrate 50, and an P well region 50P may be formed in the second region 50B of the semiconductor substrate 50.

The different implant steps for the different regions 50A and 50B may be achieved using a photoresist or other masks (not shown). For example, a photoresist is formed over the semiconductor substrate 50 in the first region 50A. The photoresist is patterned to expose the second region 50B of the substrate 50, such as a NMOS region. Once the photoresist is patterned, a P-type impurity implant is performed in the second region 50B, and the photoresist may act as a mask to substantially prevent P-type impurities from being implanted into the first region 50A, such as an PMOS region.

Following the implanting of the second region 50B, a photoresist is formed over the semiconductor substrate 50 in the second region 50B. The photoresist is patterned to expose the first region 50A of the substrate 50, such as the PMOS region. Once the photoresist is patterned, a N-type impurity implant may be performed in the first region 50A, and the photoresist may act as a mask to substantially prevent N-type impurities from being implanted into the second region 50B, such as the NMOS region.

Fin-type field effect transistors (FinFET) devices 60A and 60B are formed disposed over the first region 50A and the second region 50B of the substrate 50, respectively. In some embodiments, the FinFET devices 60A and 60B illustrated in FIG. 16 are three-dimensional MOSFET structures formed in fin-like strips of semiconductor fins 58A and 58B, respectively. The cross-section shown in FIG. 16 is taken along a longitudinal axis of the fins 58A and 58B in a direction parallel to the direction of the current flow. The fins 58A and 58B may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fins 58A and 58B by etching a trench into the substrate 50 using, for example, reactive ion etching (RIE).

Shallow trench isolation (STI) regions 62 formed along opposing sidewalls of the fins 58A and 58B are illustrated in FIG. 16. STI regions 62 may be formed by depositing one or more dielectric materials (e.g., silicon oxide) to completely fill the trenches around the fins 58A and 58B and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58A and 58B protrudes from surrounding insulating STI regions 62. In some cases, the patterned hard mask used to form the fins 58A and 58B may also be removed by the planarization process.

In some embodiments, the gate structures 68A and 68B of the FinFET devices 60A and 60B illustrated in FIG. 16 are high-k metal gate (HKMG) gate structures that may be formed using a gate-last process flow. In a gate last process flow, sacrificial dummy gate structures (not shown) are formed after forming the STI regions 62. The dummy gate structures each may include a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structures are then formed by patterning the hard mask and transferring that pattern to the dummy gate dielectric and dummy gate material using suitable photolithography and etching techniques. The dummy gate structures may extend along multiple sides of the protruding fins and extend between the fins over the surface of the STI regions 62. As described in greater detail below, the dummy gate structures may be replaced by the HKMG gate structures 68A and 68B as illustrated in FIG. 16. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54A and spacers 72A of FinFET 60A, and source and drain regions 54B and spacers 72B of FinFET 60B, illustrated in FIG. 16, are formed, for example, self-aligned to the dummy gate structures. Spacers 72A and 72B may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72A and 72B remaining along the sidewalls of the dummy gate structures.

Source and drain regions 54A and 54B are semiconductor regions in direct contact with the semiconductor fins 58A and 58B, respectively. In some embodiments, the source and drain regions 54A and 54B may include heavily-doped regions and relatively lightly-doped drain extensions, or LDD regions. Generally, the heavily-doped regions are spaced away from the dummy gate structures using the spacers 72A and 72B, whereas the LDD regions may be formed prior to forming spacers 72A and 72B, and hence, extend under the spacers 72A and 72B and in some embodiments, extend further into a portion of the semiconductor below the dummy gate structure. The LDD regions may be formed, for example, by implanting dopants (e.g., As, P, B, In, or the like) using an ion implantation process. In some embodiments, the source and drain regions 54A are P-type doped regions in the N-well region 50N, while the source and drain regions 54N are N-type doped regions in the P-well region 50P.

The source and drain regions 54A and 54B may include an epitaxially grown region. For example, after forming the LDD regions, the spacers 72A and 72B may be formed and, subsequently, the heavily-doped source and drain regions may be formed self-aligned to the spacers 72A and 72B by first etching the fins to form recesses, and then depositing a crystalline semiconductor material in the recess by a selective epitaxial growth (SEG) process that may fill the recess and, typically, extend beyond the original surface of the fin to form a raised source-drain structure. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

A contact etch stop layer (CESL) 75 is deposited over the structure, and a first interlayer dielectric (ILD) 76 is deposited over the CESL 75. In some embodiments, the CESL 75 can be made of suitable dielectric (e.g., silicon nitride, silicon carbide, or the like, or a combination thereof). A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76. The HKMG gate structures 68A and 68B may then be formed by first removing the dummy gate structures using one or more etching techniques, thereby creating trenches between respective spacers 72A and between respective spacers 72B. Next, a replacement gate dielectric layer 66 comprising one more dielectrics, a replacement work function metal layer 65, followed by a replacement conductive gate layer 64 comprising one or more conductive materials, are deposited to completely fill the recesses. Excess portions of the gate structure layers 64, 65, and 66 may be removed from over the top surface of first ILD layer 76 using, for example a CMP process. The resulting structure may be a substantially coplanar surface comprising an exposed top surface of first ILD layer 76, spacers 72A and 72B, and remaining portions of the HKMG gate layers 66, 65, and 64 inlaid between respective spacers 72A and between respective spacers 72B.

A second ILD layer 78 may be deposited over the first ILD layer 76. In some embodiments, the insulating materials to form the first ILD layer 76 and the second ILD layer 78 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, physical vapor deposition (PVD), ALD, PEALD, PECVD, SACVD, FCVD, spin-on coating, and/or the like, or a combination thereof.

Source/drain contacts 73A and 73B are formed in the first ILD layer 76 and the second ILD layer 78 and make electrical connections to the source and drain regions 54A and 54B, respectively. The source/drain contacts 73 may be formed using photolithography techniques. For example, a patterned mask may be formed over the first ILD layer 76 and the second ILD layer 78, and may be used to etch openings that extend through the second ILD layer 78, the first ILD layer 76, and the CESL 75 to expose portions of the source and drain regions 54A and 54B. In some embodiments, an anisotropic dry etch process may be used.

In some embodiments, a conductive liner 731 may be formed in the openings in the first ILD layer 76 and the second ILD layer 78. Subsequently, the openings are filled with a conductive fill material 732. The conductive liner includes metals used to reduce out-diffusion of conductive materials from the source/drain contacts 73A and 73B into the surrounding dielectric materials. In some embodiments, the conductive liner may include two metal layers. The first metal layer are in contact with the semiconductor materials in the source and drain regions 54A and 54B, and may be subsequently chemically reacted with the heavily-doped semiconductor in the source and drain regions 54A and 54B to form a low resistance ohmic contact, after which the unreacted metal may be removed. For example, if the heavily-doped semiconductor in the source and drain regions 54A and 54B are silicon or silicon-germanium alloy semiconductor, then the first metal layer may include Ti, Ni, Pt, Co, other suitable metals, or their alloys. The second metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the first ILD layer 76 and the second ILD layer 78. The resulting conductive plugs extend into the first ILD layer 76 and the second ILD layer 78, and constitute the source/drain contacts 73A and 73B making physical and electrical connections to the electrodes of electronic devices, such as the FinFET 60A and 60B.

The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. The work function layer 65 may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The conductive gate layer 64 which fills the remainder of the recess may include metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

An etch stop layer (ESL) 80 is deposited over the second ILD layer 78, and an inter-metal dielectric (IMD) layer 85 is deposited over the ESL 80. In some embodiments, the ESL 80 includes one or more insulator layers (e.g., SiN, SiC, SiCN, SiCO, CN, combinations thereof, or the like) having an etch rate different than an etch rate of an overlying IMD layer 85. In some embodiments, the IMD layer 85 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ESL 80 and the IMD layer 85 may be deposited using suitable method, such as CVD, physical vapor deposition (PVD), ALD, PEALD, PECVD, SACVD, FCVD, spin-on, and/or the like, or a combination thereof.

Figure 17:
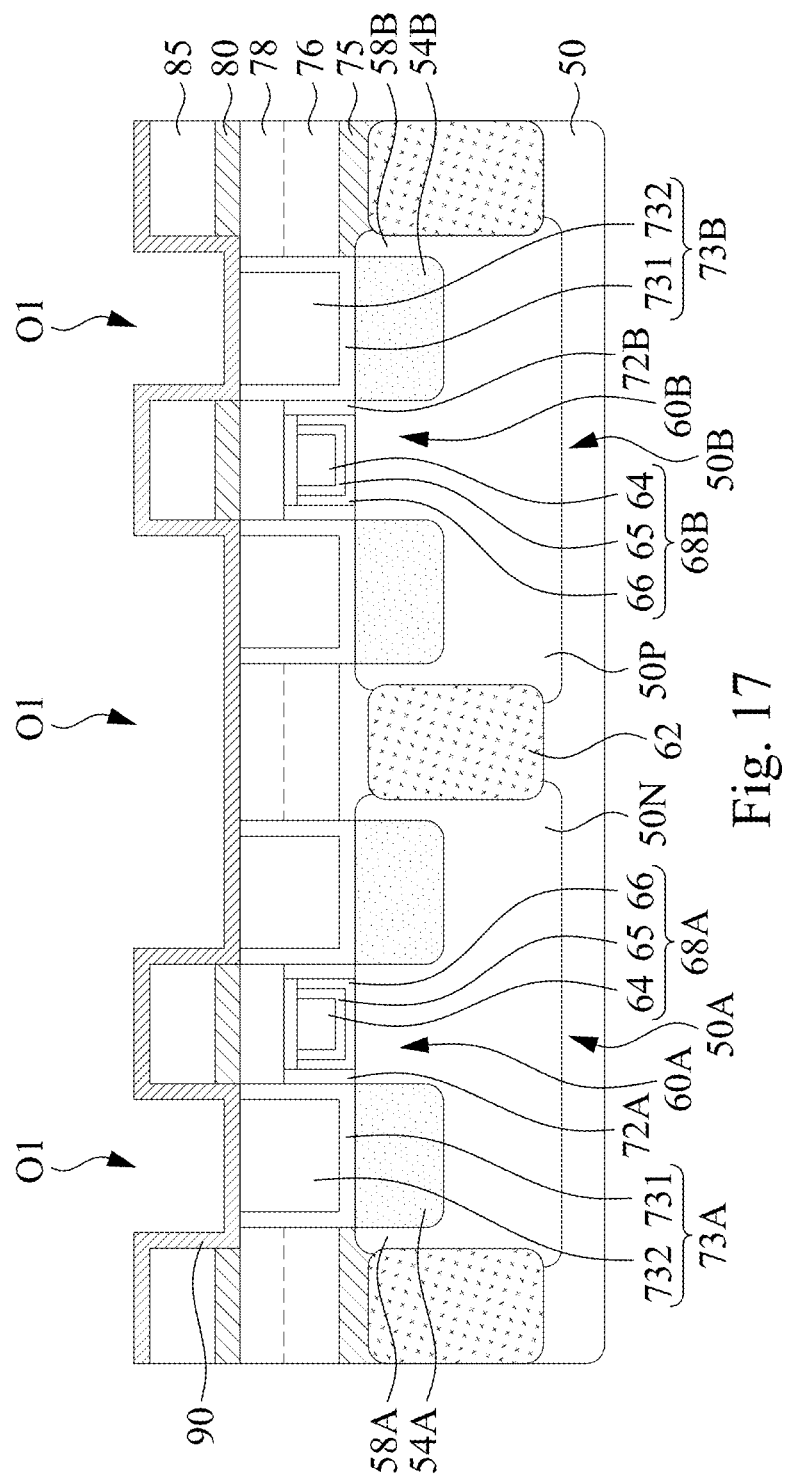

Reference is made to FIG. 17. The ESL 80 and the IMD layer 85 are patterned to form openings O1. The openings O1 may expose the source/drain contacts 73A and 73B. In some embodiments, the openings O1 may be formed by, for example, forming a mask layer over the IMD layer 85, patterning the mask layer to expose unwanted portions of the IMD layer 85, and then performing an etching process to remove the unwanted portions of the IMD layer 85 and portions of the underlying ESL 80.

A diffusion barrier layer 90 is deposited over the IMD layer 85 and lining the openings O1. In some embodiments, the diffusion barrier layer 90 may be deposited in a conformal manner, such that the diffusion barrier layer 90 may extend along exposed surfaces of the IMD layer 85, ESL 80, and the source/drain contacts 73A and 73B. In some embodiments, the diffusion barrier layer 90 may include barrier materials such as titanium (Ti), titanium nitride (TiN), tantalum (Ta), tantalum nitride (TaN), and combinations thereof, and can be formed using CVD, ALD, PVD, or the like.

Figure 18:
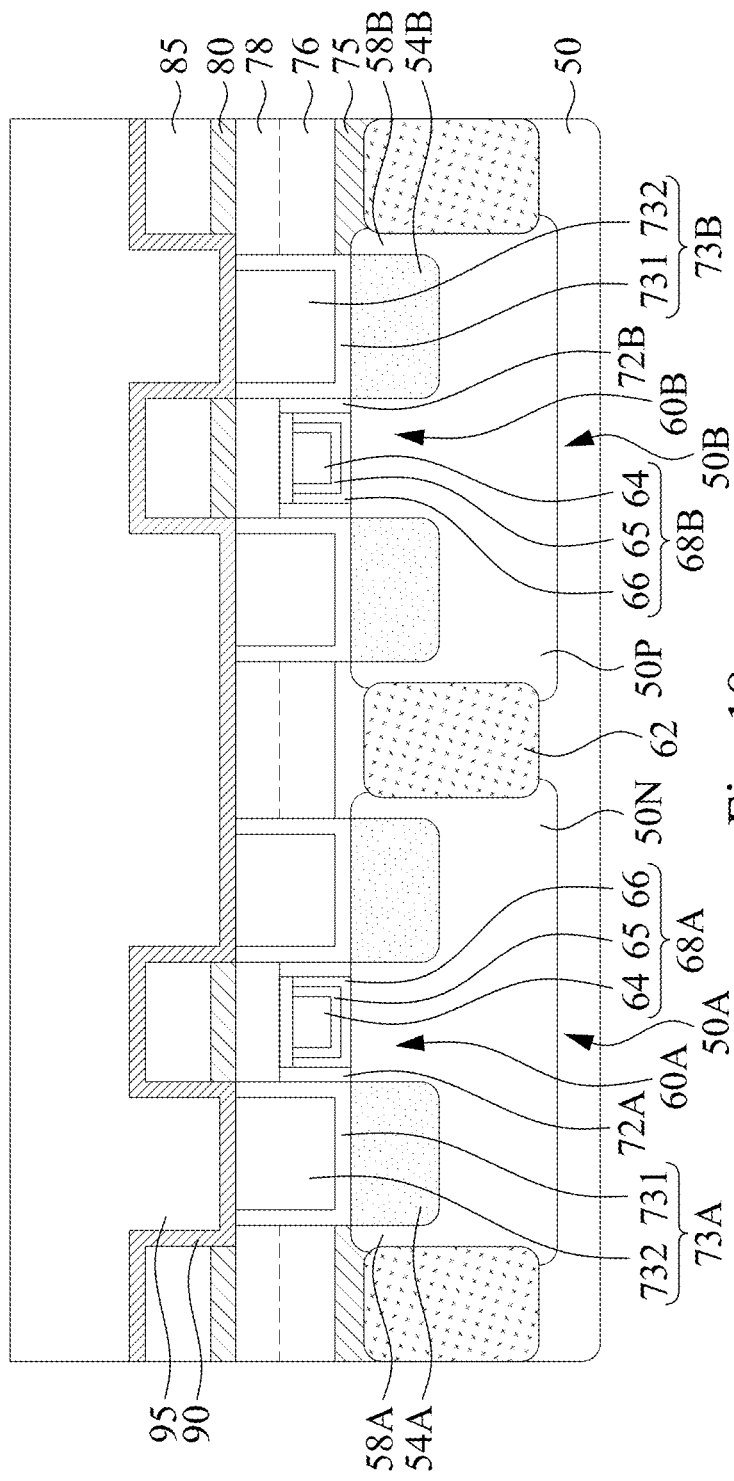

Reference is made to FIG. 18. A metal layer 95 is deposited over the diffusion barrier layer 90 and overfilling the openings O1. In some embodiments, material of the metal layer 95 can include copper or copper alloys, or other suitable conductive materials, such as silver, gold, tungsten, aluminum, or other suitable materials. In some embodiments, the metal layer 95 may be formed by, for example, CVD, ALD, PVD, or the like.

Figure 19:
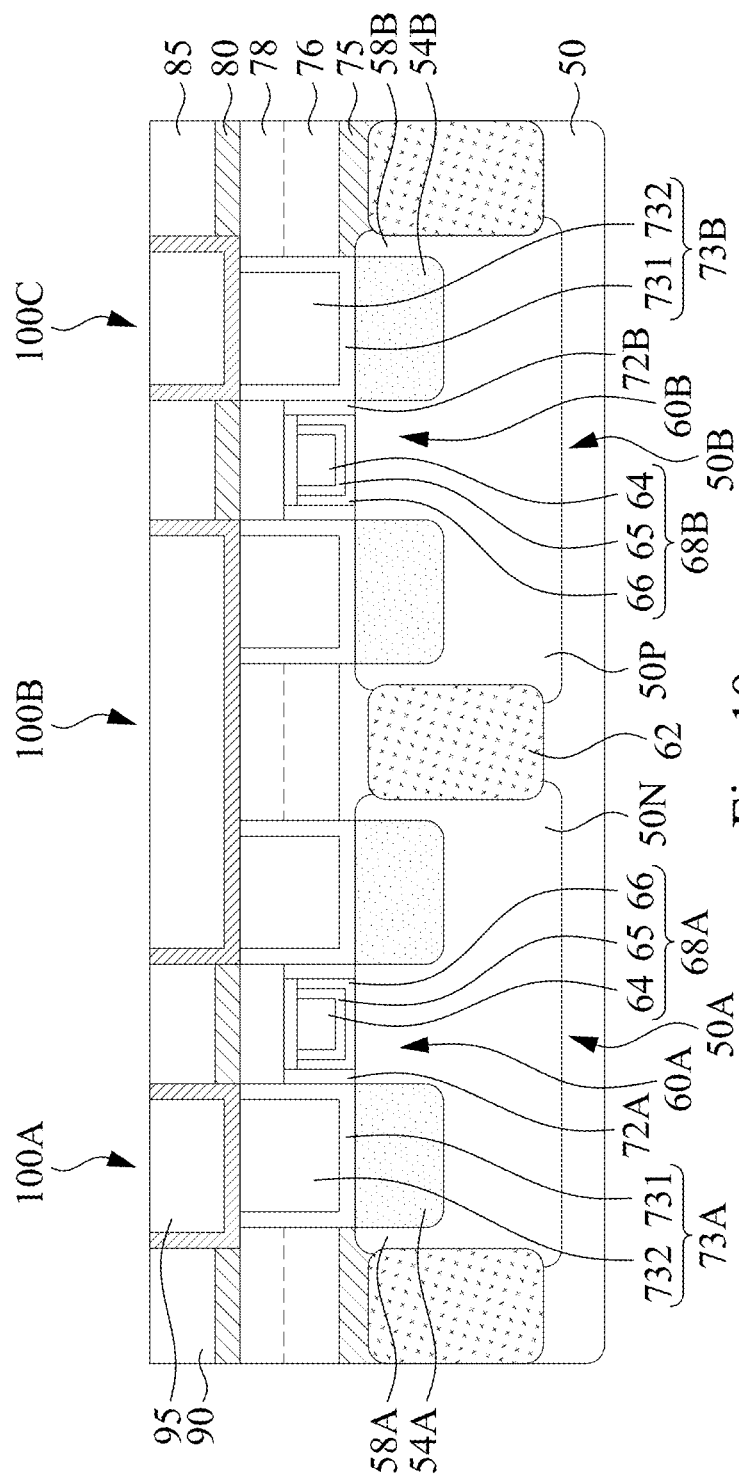

Reference is made to FIG. 19. A chemical mechanical polish (CMP) process is performed to remove excess materials of the diffusion barrier layer 90 and the metal layer 95 until the top surface of the IMD layer 85 is exposed. After the CMP process is completed. Interconnect structures 100A, 100B, and 100C are formed, in which the interconnect structures 100A, 100B, and 100C each includes remaining portions of the diffusion barrier layer 90 and the metal layer 95. In some embodiments, the interconnect structures 100A is electrically connected to one source/drain contact 73A (the leftmost source/drain contact 73A in FIG. 19), the interconnect structures 100C is electrically connected to one source/drain contact 73B (the rightmost source/drain contact 73B in FIG. 19), while the interconnect structures 100B electrically connects one source/drain contact 73A to an adjacent source/drain contact 73B.

Figure 20:
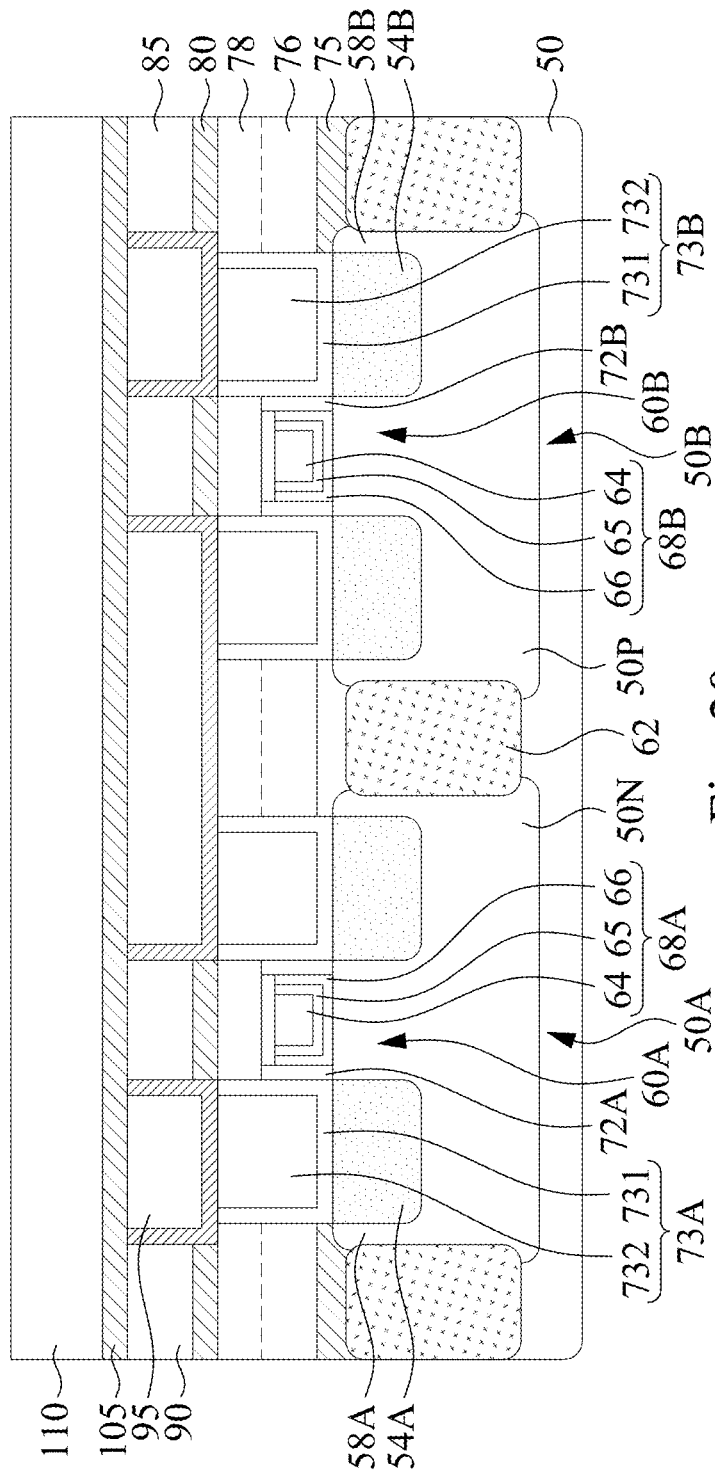

Reference is made to FIG. 20. An etch stop layer (ESL) 105 is deposited over IMD layer 85, and an interlayer dielectric (ILD) layer 110 is deposited over the ESL 105. In some embodiments, the ESL 105 includes one or more insulator layers (e.g., SiN, SiC, SiCN, SiCO, CN, combinations thereof, or the like) having an etch rate different than an etch rate of an overlying ILD layer 110. In some embodiments, the ILD layer 110 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ESL 105 and the ILD layer 110 may be deposited using suitable method, such as CVD, physical vapor deposition (PVD), ALD, PEALD, PECVD, SACVD, FCVD, spin-on, and/or the like, or a combination thereof.

Figure 21:
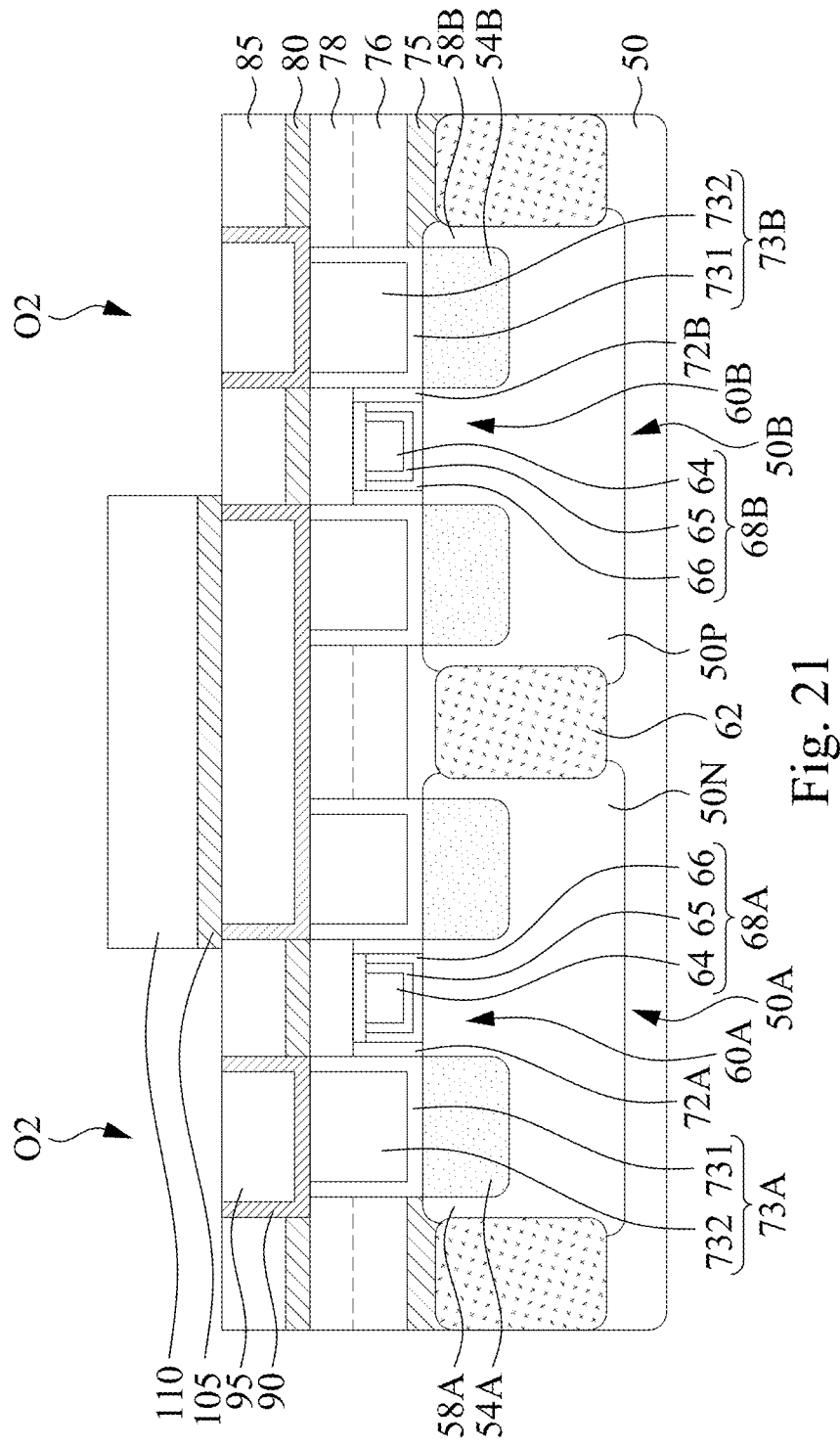

Reference is made to FIG. 21. The ESL 105 and the ILD layer 110 are patterned to form openings O2. The openings O2 may expose the interconnect structures 100A and 100C, respectively. In some embodiments, the openings O2 may be formed by, for example, forming a mask layer over the ILD layer 110, patterning the mask layer to expose unwanted portions of the ILD layer 110, and then performing an etching process to remove the unwanted portions of the ILD layer 110 and portions of the underlying ESL 105.

Figure 22:
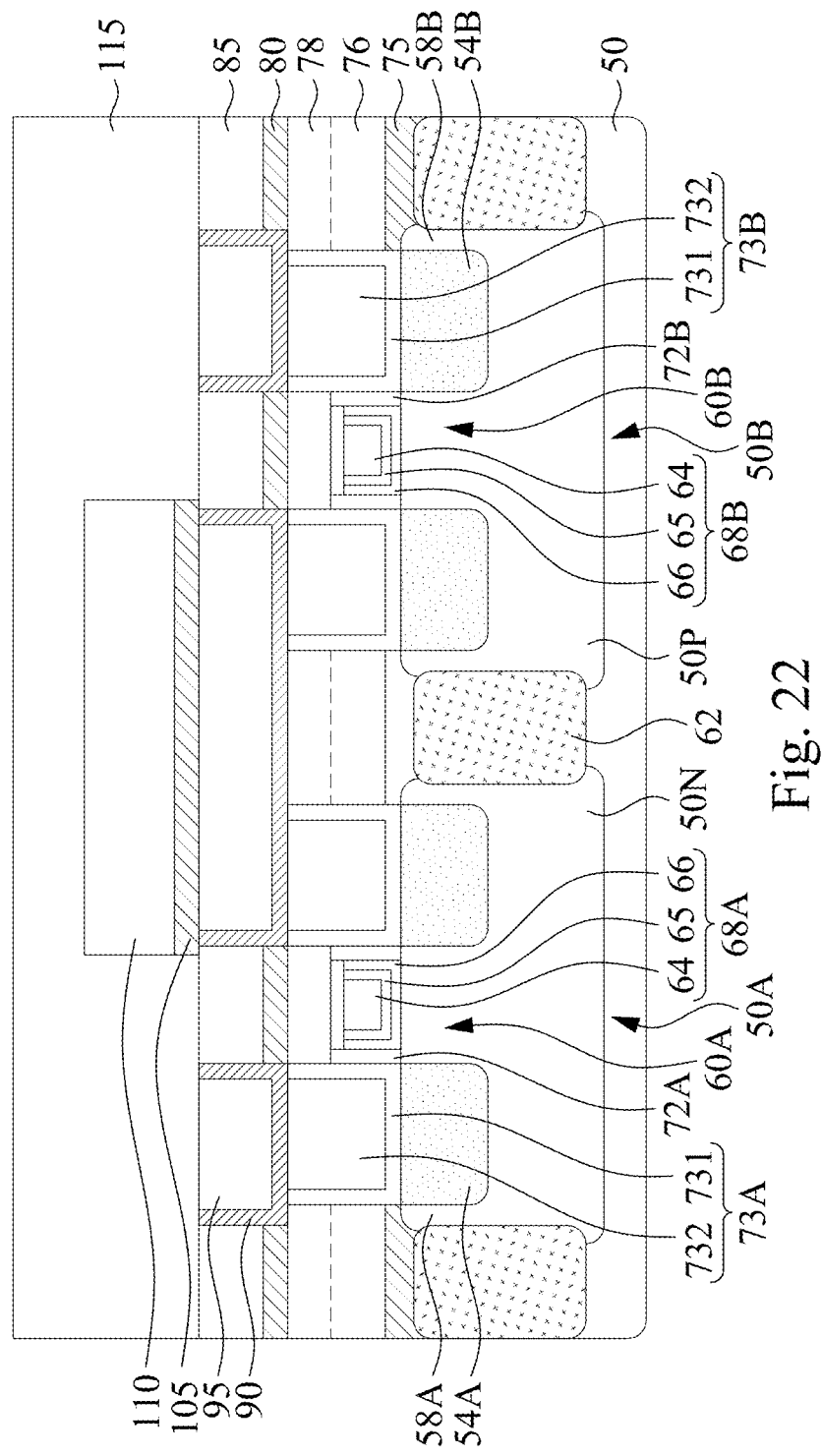

Reference is made to FIG. 22. A metal layer 115 is deposited over the ILD layer 110 and overfilling the openings O2. In some embodiments, material of the metal layer 115 may be made of gold (Au). In some embodiments, the metal layer 115 may be formed by, for example, CVD, ALD, PVD, or the like.

Figure 23:
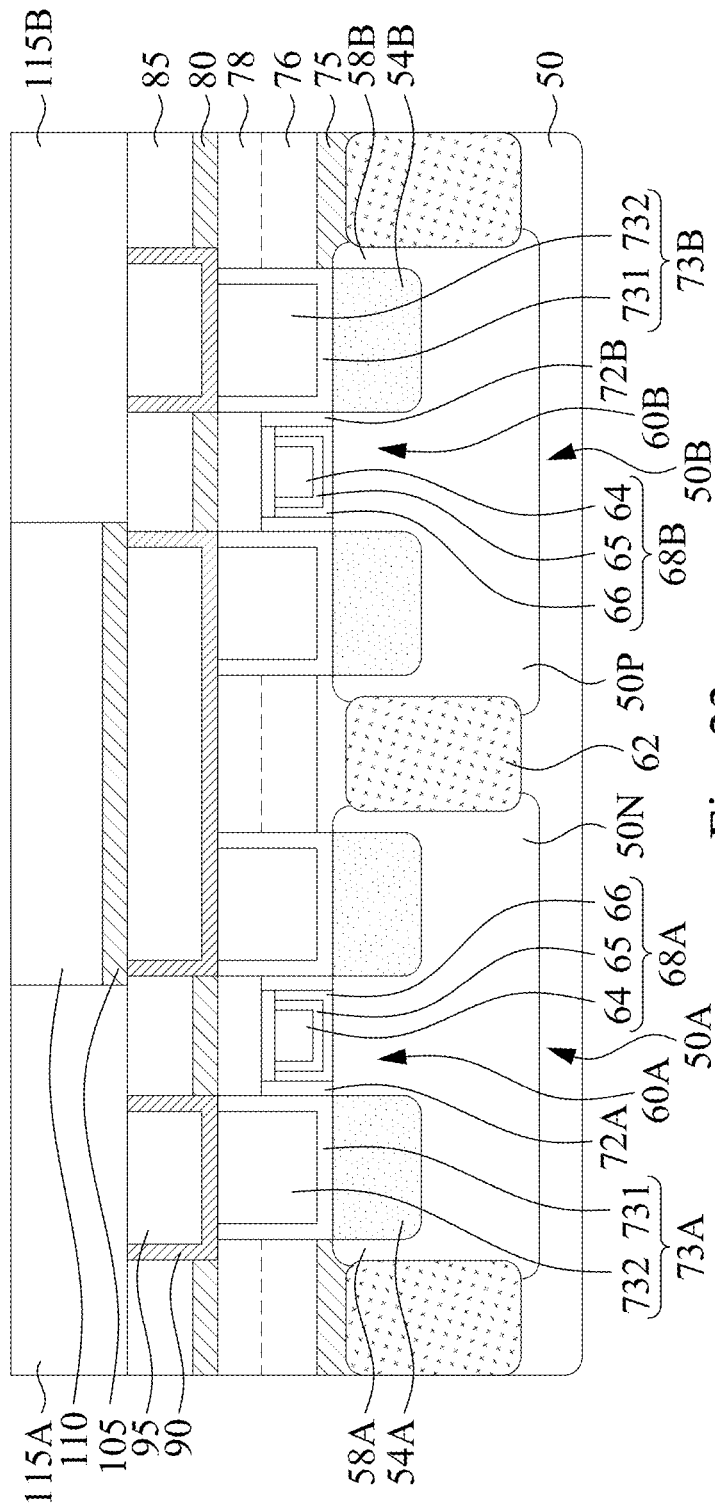

Reference is made to FIG. 23. A chemical mechanical polish (CMP) process is performed to remove excess materials of the metal layer 115 until the top surface of the ILD layer 110 is exposed. After the CMP process is completed, bottom electrodes 115A and 115B are formed, in which the bottom electrodes 115A and 115B each includes remaining portions of the metal layer 115. In some embodiments, the bottom electrode 115A is over and in contact with the interconnect structure 100A, and the bottom electrode 115B is over and in contact with the interconnect structure 100C.

Figure 24:
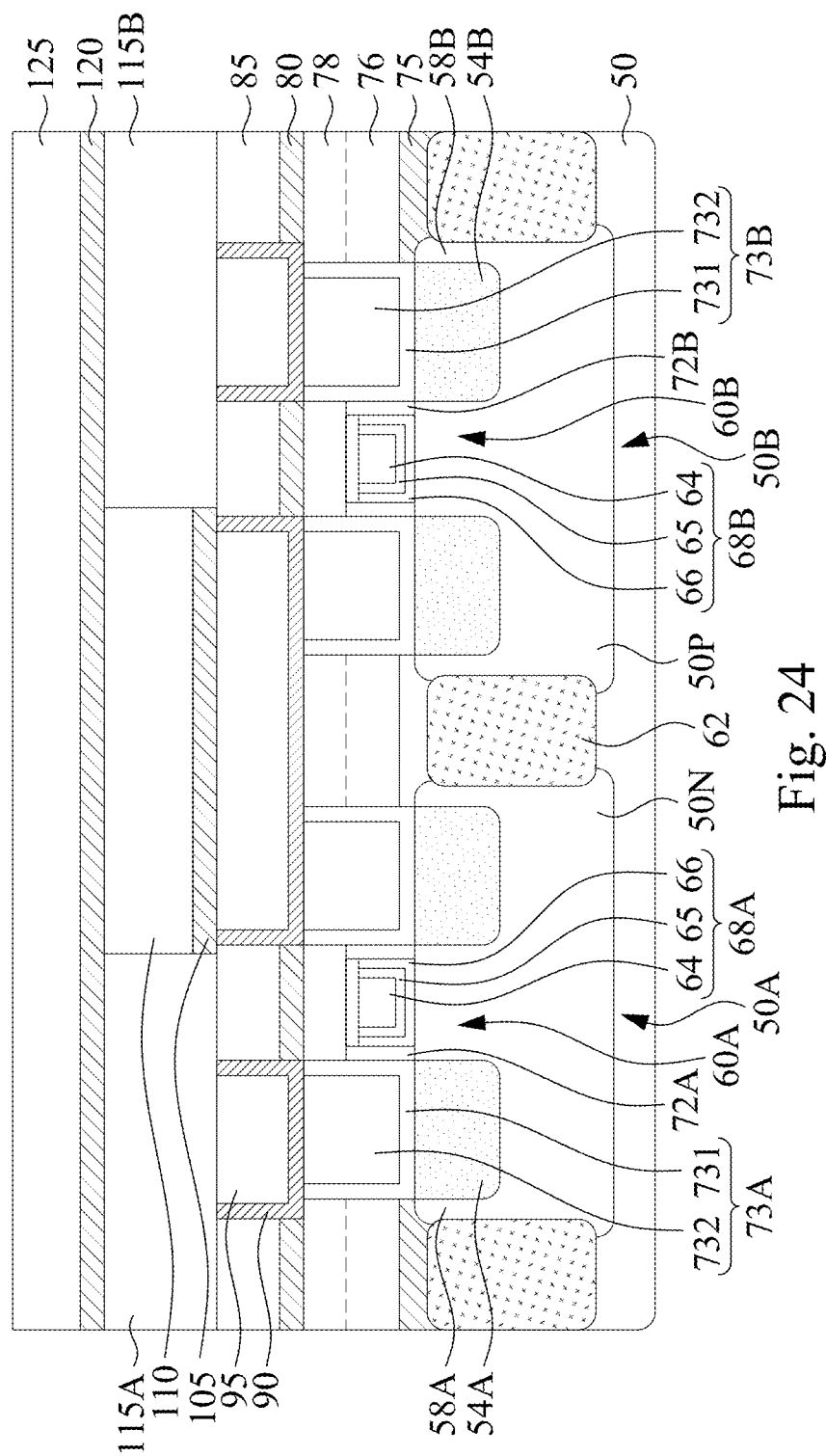

Reference is made to FIG. 24. An etch stop layer (ESL) 120 is deposited over ILD layer 110, and an interlayer dielectric (ILD) layer 125 is deposited over the ESL 120. In some embodiments, the ESL 120 includes one or more insulator layers (e.g., SiN, SiC, SiCN, SiCO, CN, combinations thereof, or the like) having an etch rate different than an etch rate of an overlying ILD layer 125. In some embodiments, the ILD layer 125 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ESL 120 and the ILD layer 125 may be deposited using suitable method, such as CVD, physical vapor deposition (PVD), ALD, PEALD, PECVD, SACVD, FCVD, spin-on, and/or the like, or a combination thereof.

Figure 25:
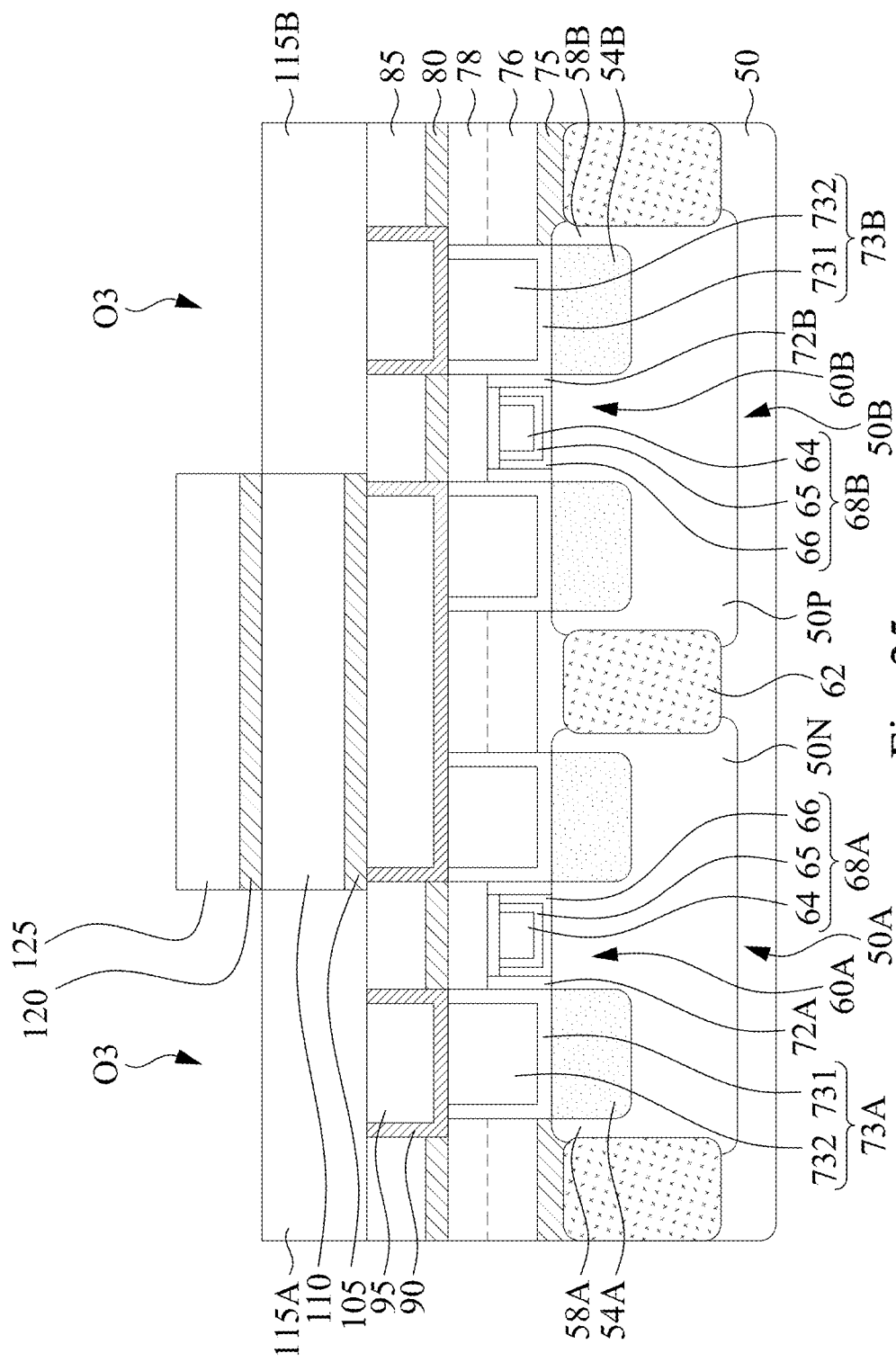

Reference is made to FIG. 25. The ESL 120 and the ILD layer 125 are patterned to form openings O3. The openings O3 may expose bottom electrodes 115A and 115B, respectively. In some embodiments, the openings O3 may be formed by, for example, forming a mask layer over the ILD layer 125, patterning the mask layer to expose unwanted portions of the ILD layer 125, and then performing an etching process to remove the unwanted portions of the ILD layer 125 and portions of the underlying ESL 120.

Figure 26:
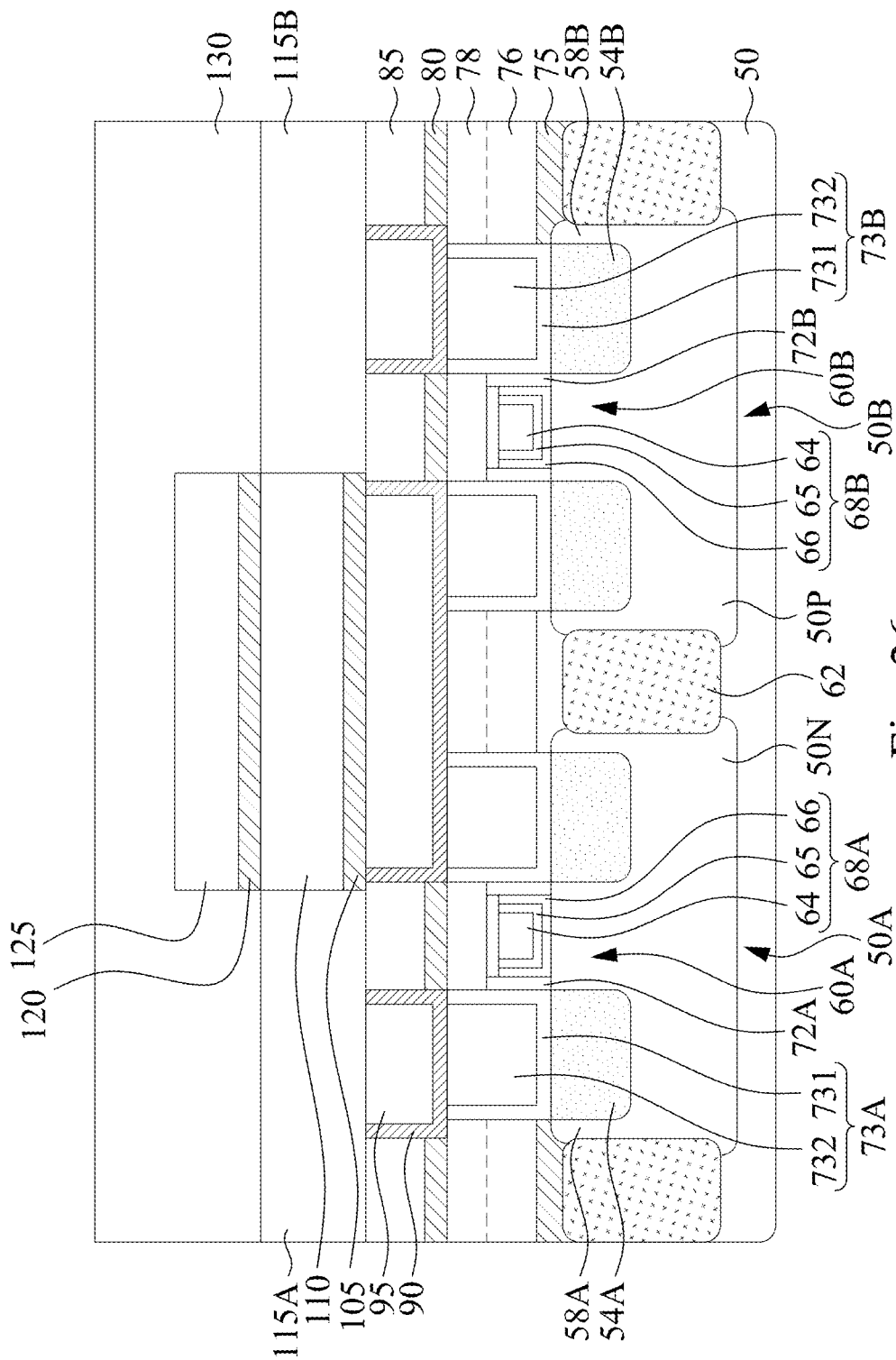

Reference is made to FIG. 26. A resistive material layer 130 is deposited over the ILD layer 125 and overfilling the openings O3. In some embodiments, material of the resistive material layer 130 may include metal halide materials, such as $PbI_2$, $CdI_2$, $PbCl_2$, $BiI_3$, or the like. In some embodiments, the resistive material layer 130 may be $BiI_3$. In some embodiments, the metal layer 115 may be formed by, for example, CVD, ALD, PVD, or the like.

Figure 27:
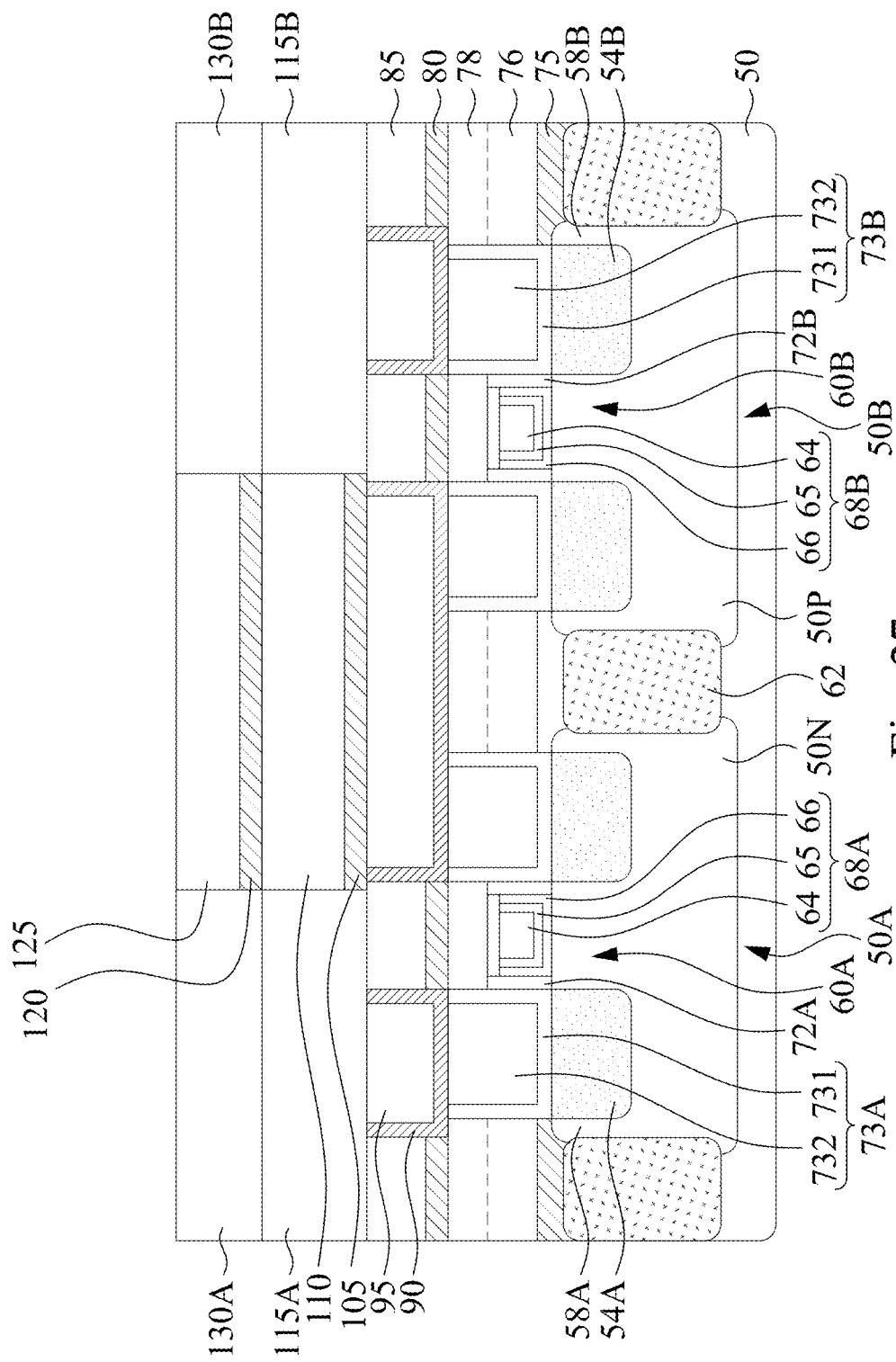

Reference is made to FIG. 27. A chemical mechanical polish (CMP) process is performed to remove excess materials of the resistive material layer 130 until the top surface of the ILD layer 125 is exposed. After the CMP process is completed, resistive switching layers 130A and 130B are formed, in which the resistive switching layers 130A and 130B each includes remaining portions of the resistive material layer 130. In some embodiments, the resistive switching layer 130A is over and in contact with the bottom electrode 115A, and the resistive switching layer 130B is over and in contact with the bottom electrode 115B.

Figure 28:
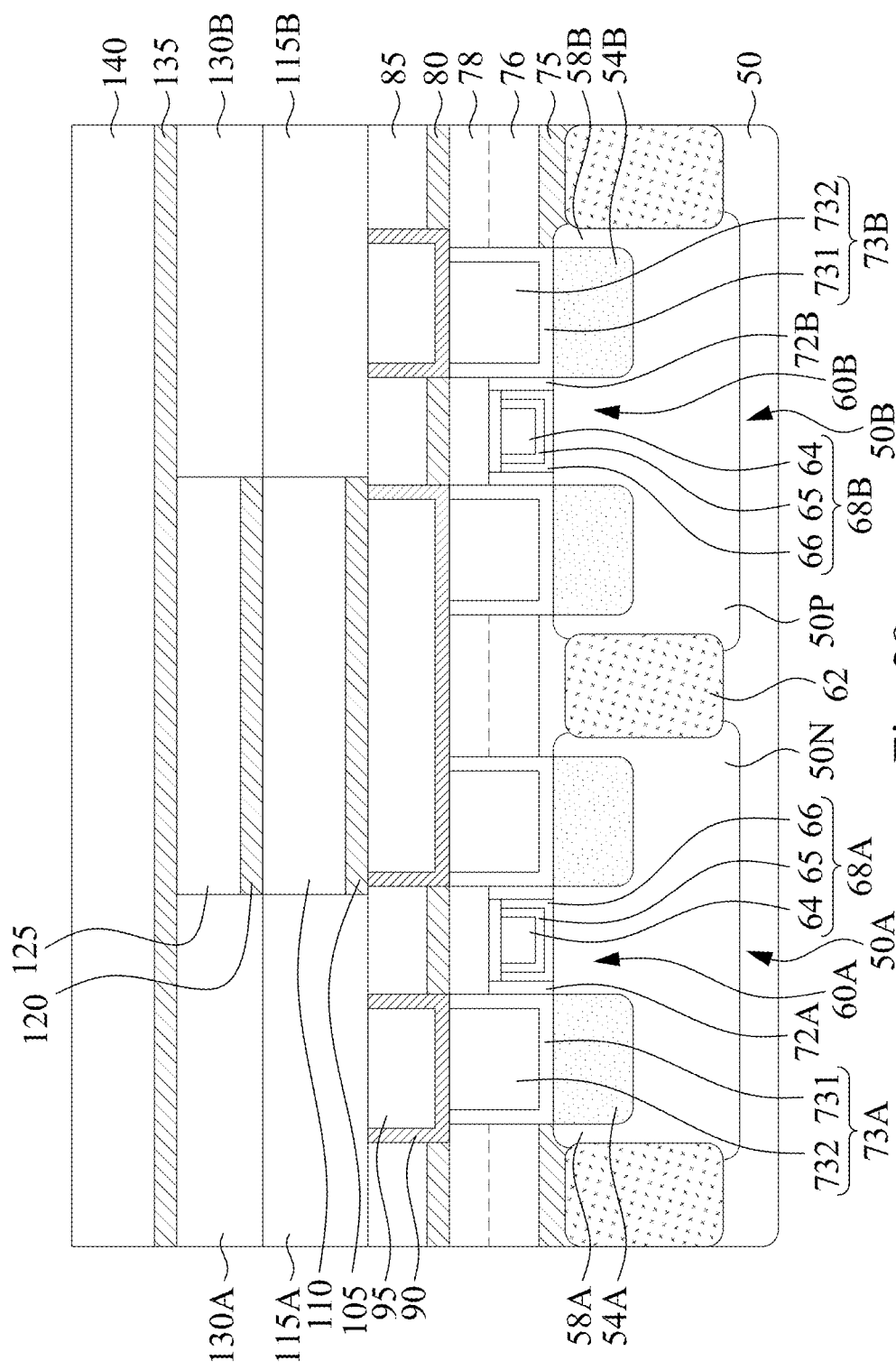

Reference is made to FIG. 28. An etch stop layer (ESL) 135 is deposited over ILD layer 125, and an interlayer dielectric (ILD) layer 140 is deposited over the ESL 135. In some embodiments, the ESL 135 includes one or more insulator layers (e.g., SiN, SiC, SiCN, SiCO, CN, combinations thereof, or the like) having an etch rate different than an etch rate of an overlying ILD layer 140. In some embodiments, the ILD layer 140 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ESL 135 and the ILD layer 140 may be deposited using suitable method, such as CVD, physical vapor deposition (PVD), ALD, PEALD, PECVD, SACVD, FCVD, spin-on, and/or the like, or a combination thereof.

Figure 29:
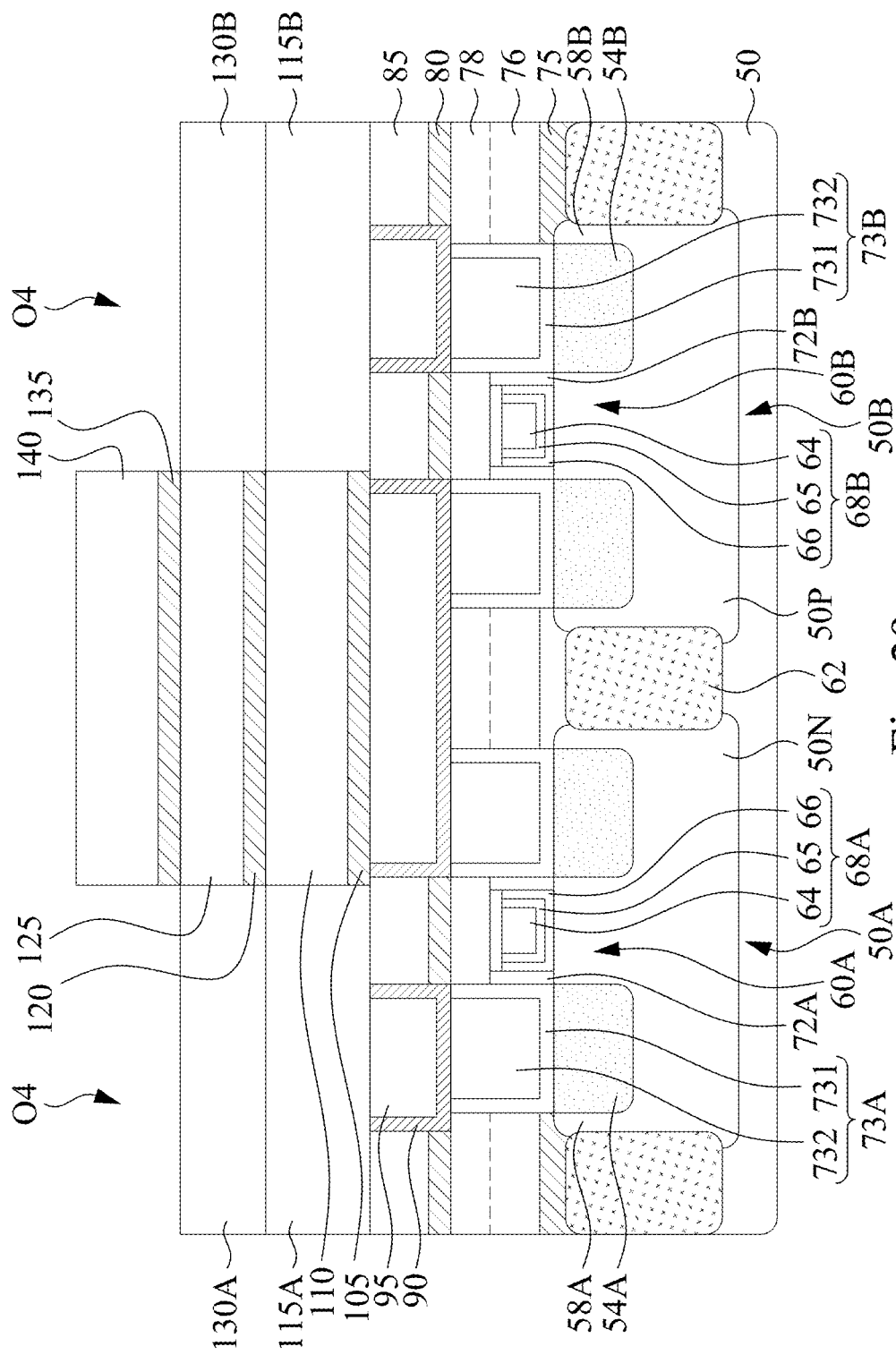

Reference is made to FIG. 29. The ESL 135 and the ILD layer 140 are patterned to form openings O4. The openings O4 may expose resistive switching layers 130A and 130B, respectively. In some embodiments, the openings O4 may be formed by, for example, forming a mask layer over the ILD layer 140, patterning the mask layer to expose unwanted portions of the ILD layer 140, and then performing an etching process to remove the unwanted portions of the ILD layer 140 and portions of the underlying ESL 135.

Figure 30:
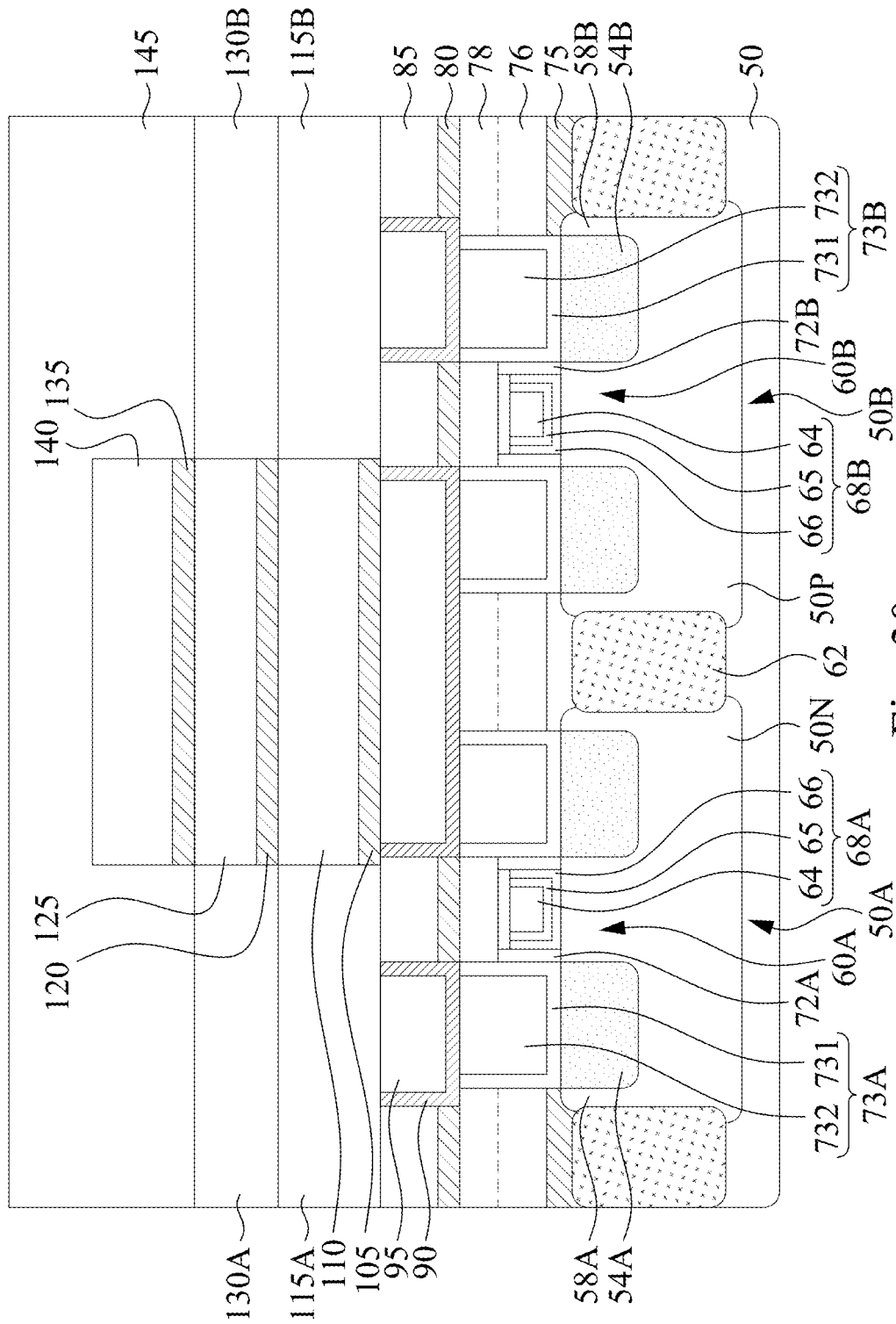

Reference is made to FIG. 30. A metal layer 145 is deposited over the ILD layer 110 and overfilling the openings O4. In some embodiments, material of the metal layer 145 may be made of gold (Au). In some embodiments, the metal layer 145 may be formed by, for example, CVD, ALD, PVD, or the like.

Figure 31:
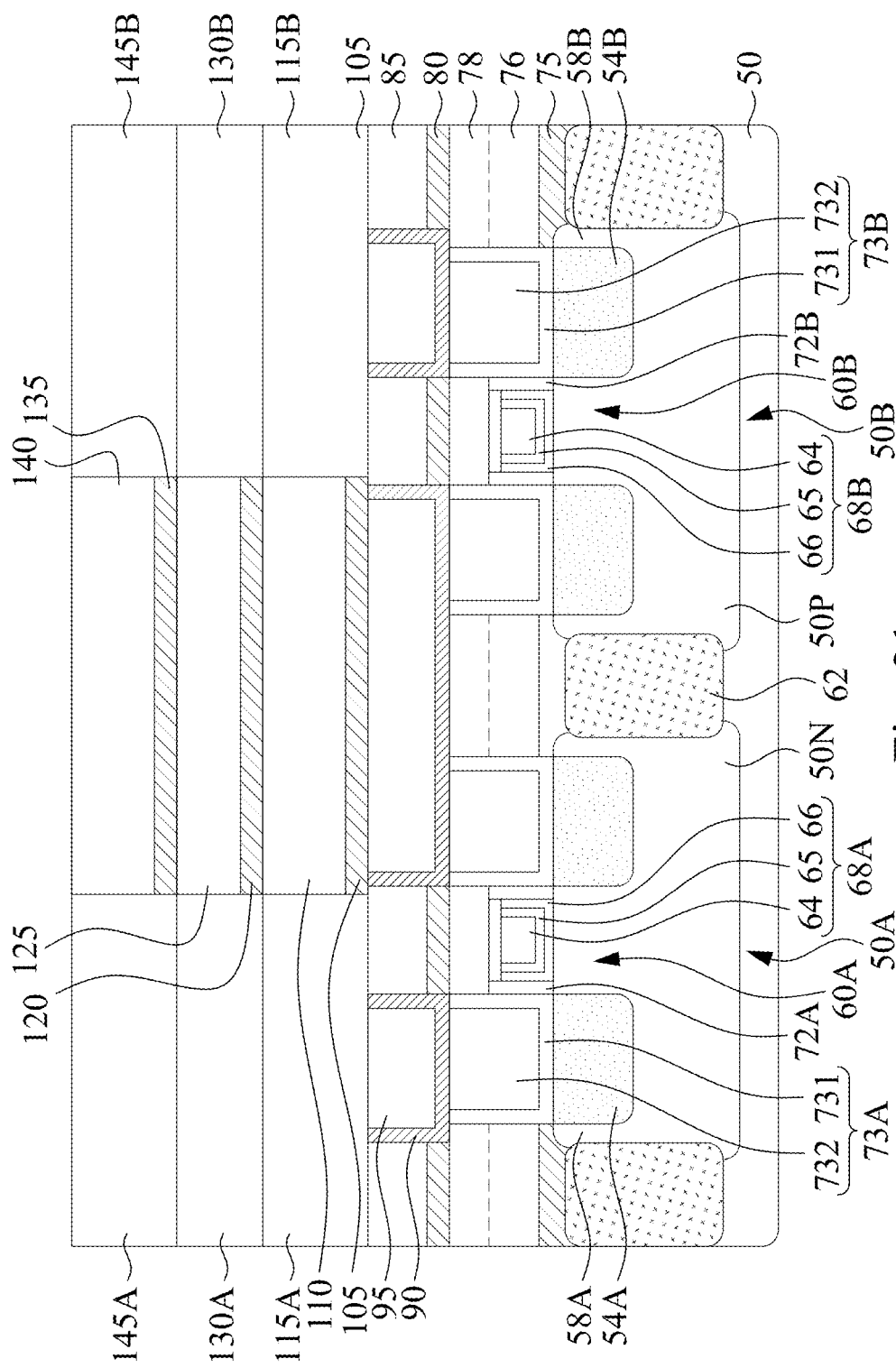

Reference is made to FIG. 31. A chemical mechanical polish (CMP) process is performed to remove excess materials of the metal layer 145 until the top surface of the ILD layer 140 is exposed. After the CMP process is completed, top electrodes 145A and 145B are formed, in which the top electrodes 145A and 145B each includes remaining portions of the metal layer 145. In some embodiments, the top electrode 145A is over and in contact with the resistive switching layer 130A, and the top electrode 145B is over and in contact with the resistive switching layer 130B.

FIGS. 32 to 41 illustrate a method in various stages of fabricating a memory device in accordance with some embodiments of the present disclosure. It is noted that the FIGS. 32 to 41 illustrate a method for forming the memory device 20 of FIGS. 2A and 2B. It is noted that some elements described in FIGS. 32 to 41 may be similar to those described in FIGS. 16 to 31, such elements are labeled the same, and relevant details will not be repeated for brevity.

Figure 32:
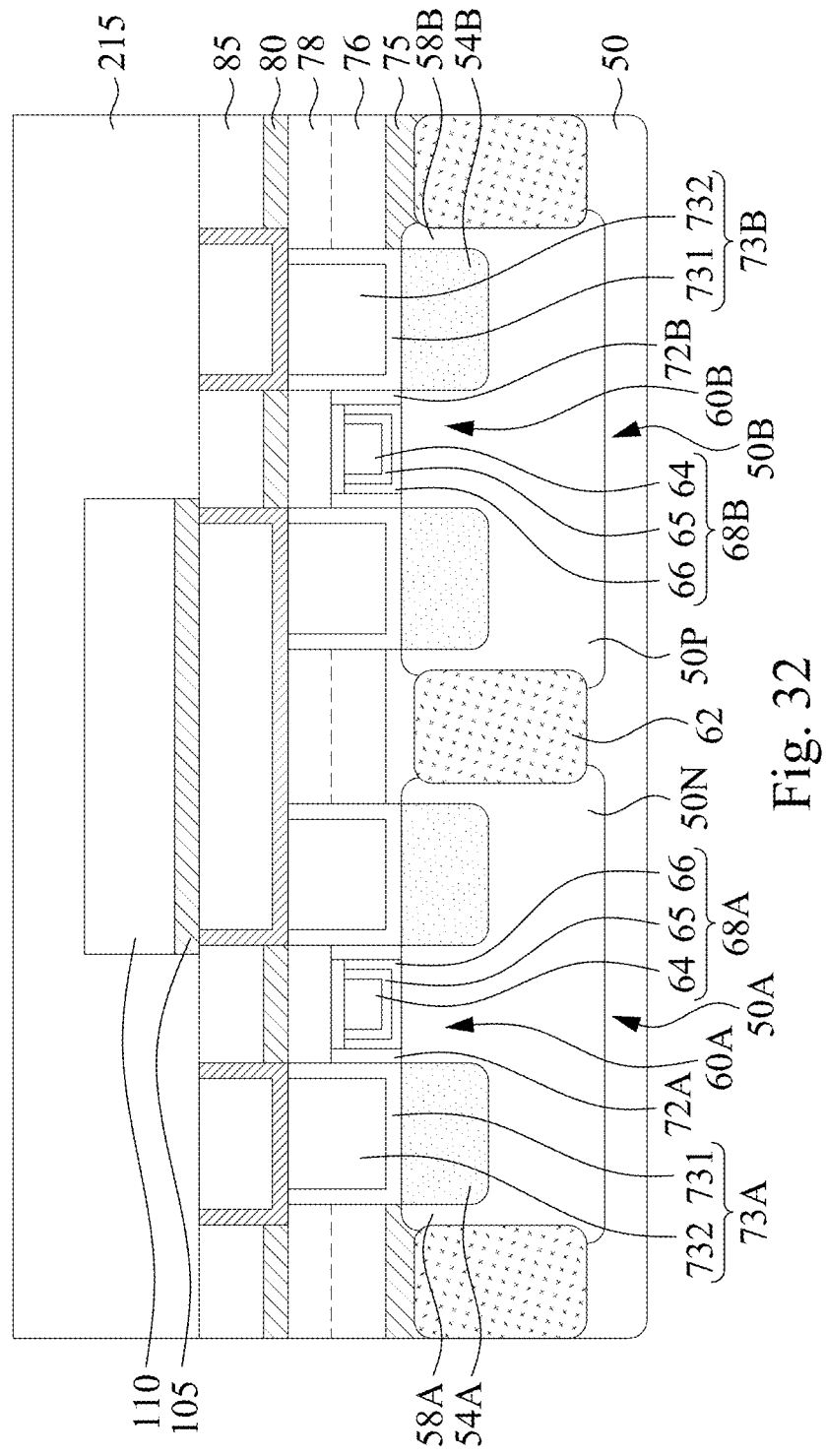
FIGS. 32 to 41 illustrate a method in various stages of fabricating a memory device in accordance with some embodiments of the present disclosure.

Reference is made to FIG. 32. A metal layer 215 is deposited over the structure of FIG. 21. In particular, the metal layer 215 is deposited over the ILD layer 110 and overfilling the openings O2 (see FIG. 21). In some embodiments, material of the metal layer 215 may be made of silver (Ag). In some embodiments, the metal layer 215 may be formed by, for example, CVD, ALD, PVD, or the like.

Figure 33:
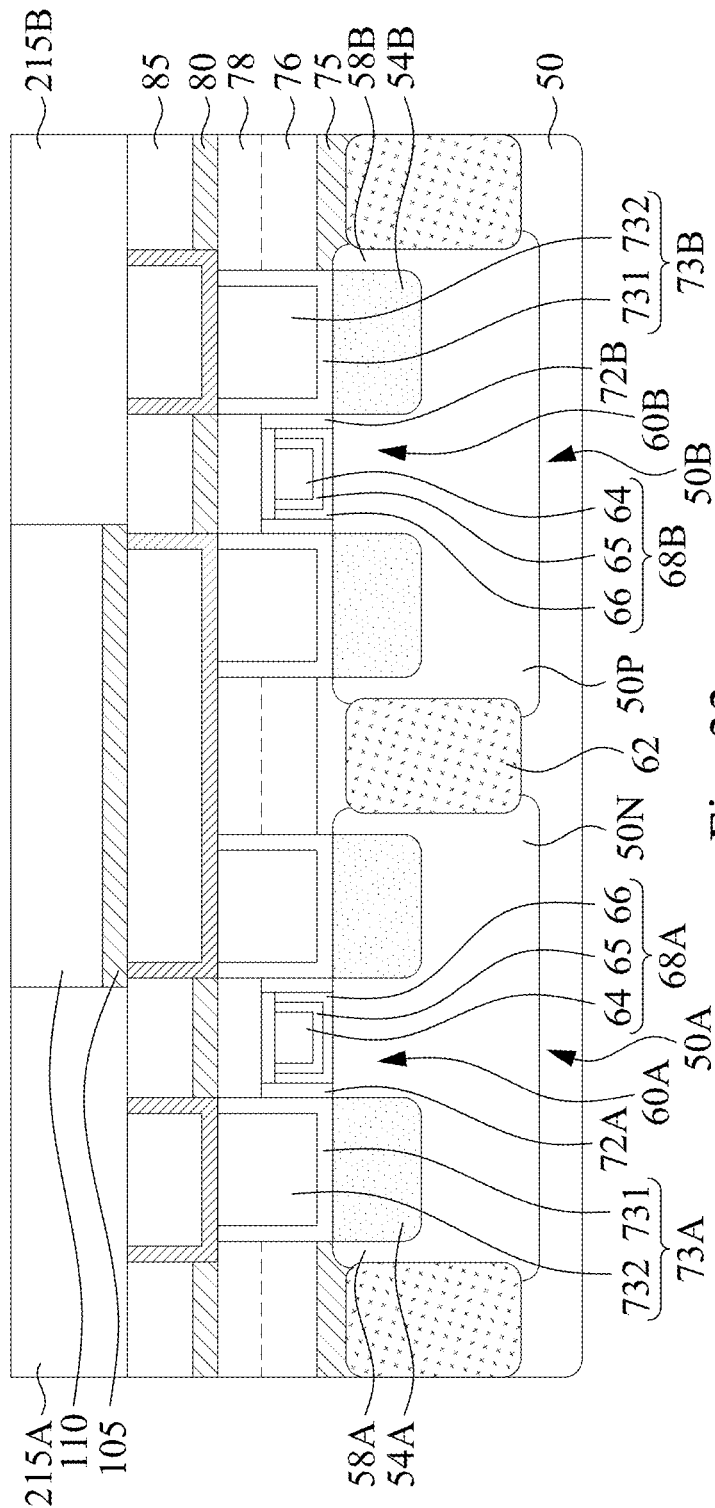

Reference is made to FIG. 33. A chemical mechanical polish (CMP) process is performed to remove excess materials of the metal layer 215 until the top surface of the ILD layer 110 is exposed. After the CMP process is completed, bottom electrodes 215A and 215B are formed, in which the bottom electrodes 215A and 215B each includes remaining portions of the metal layer 215. In some embodiments, the bottom electrode 215A is over and in contact with the interconnect structure 100A, and the bottom electrode 215B is over and in contact with the interconnect structure 100C.

Figure 34:
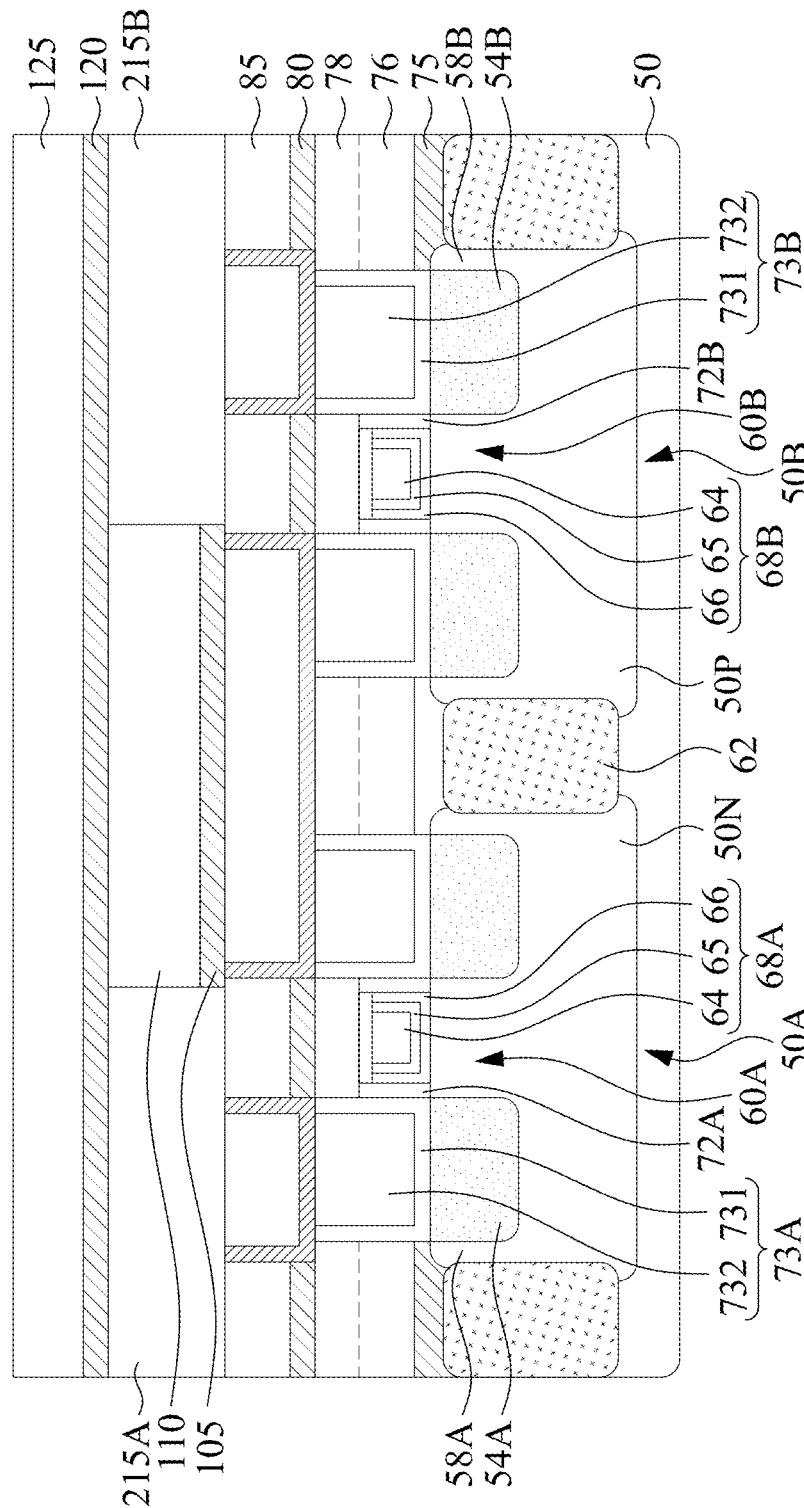

Reference is made to FIG. 34. An etch stop layer (ESL) 120 is deposited over ILD layer 110, and an interlayer dielectric (ILD) layer 125 is deposited over the ESL 120.

Figure 35:
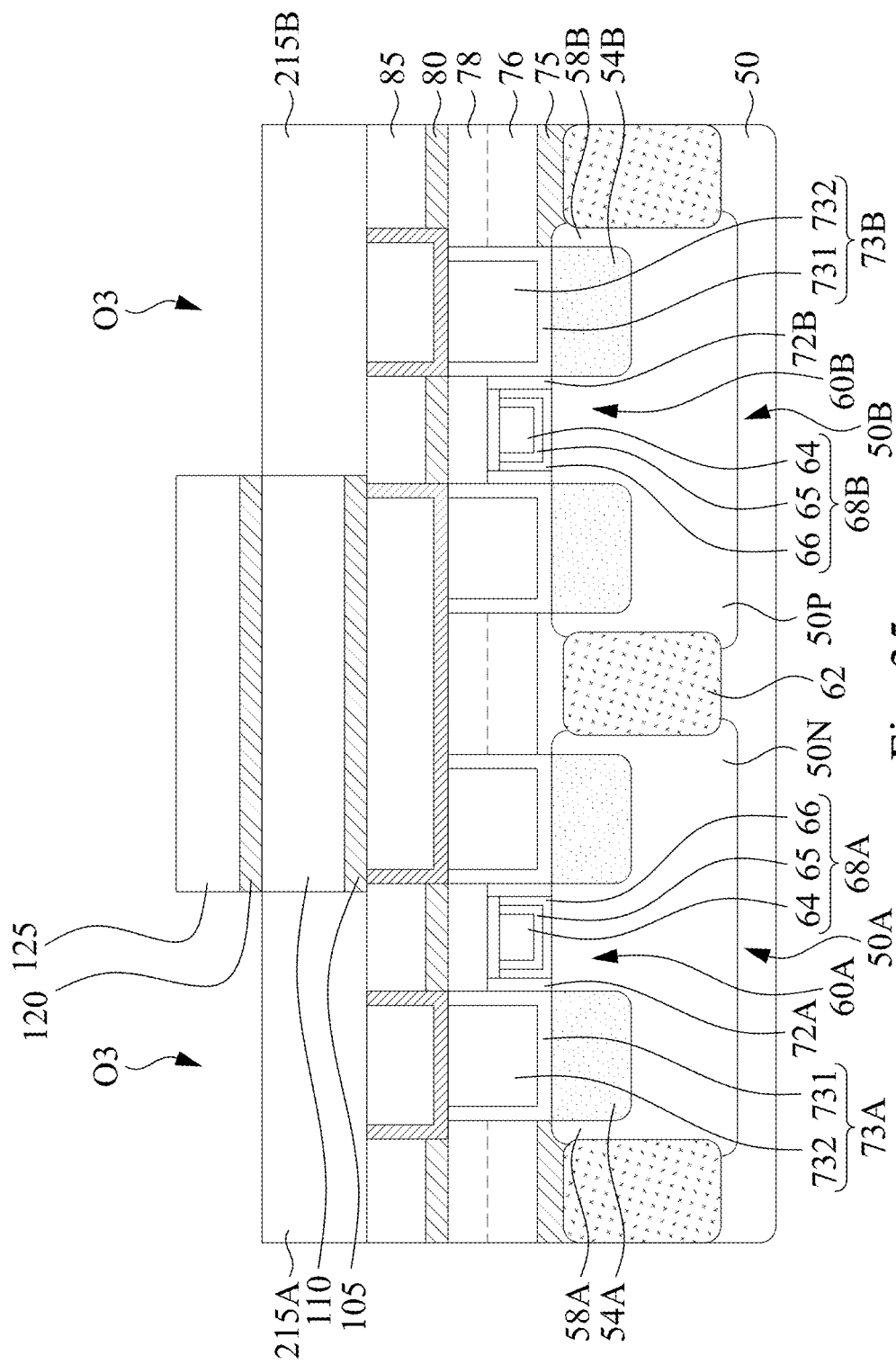

Reference is made to FIG. 35. The ESL 120 and the ILD layer 125 are patterned to form openings O3. The openings O3 may expose bottom electrodes 215A and 215B, respectively.

Figure 36:
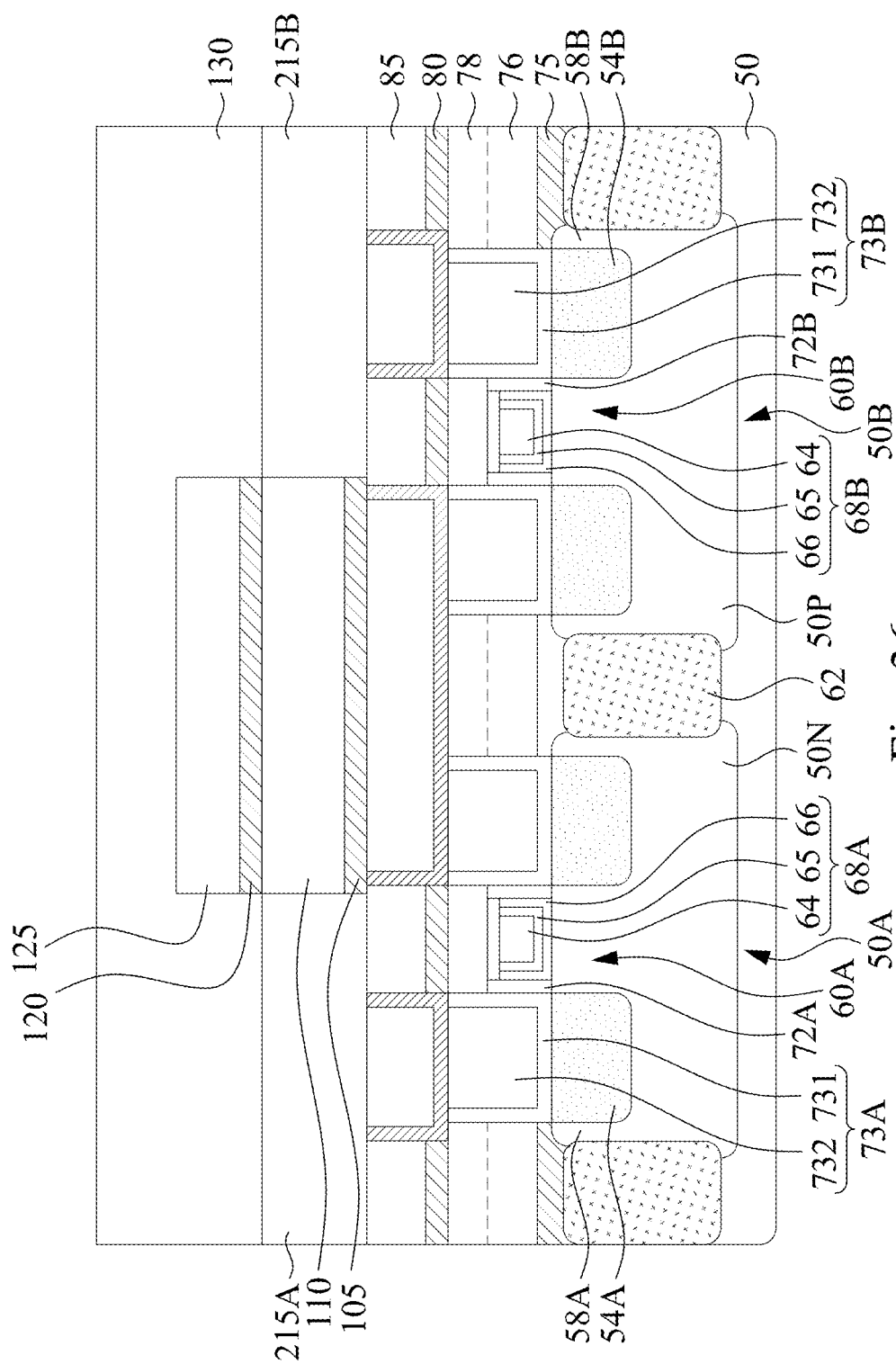

Reference is made to FIG. 36. A resistive material layer 130 is deposited over the ILD layer 125 and overfilling the openings O3. In some embodiments, material of the resistive material layer 130 may include metal halide materials, such as $PbI_2$, $CdI_2$, $PbCl_2$, $BiI_3$, or the like. In some embodiments, the resistive material layer 130 may be $BiI_3$.

Figure 37:
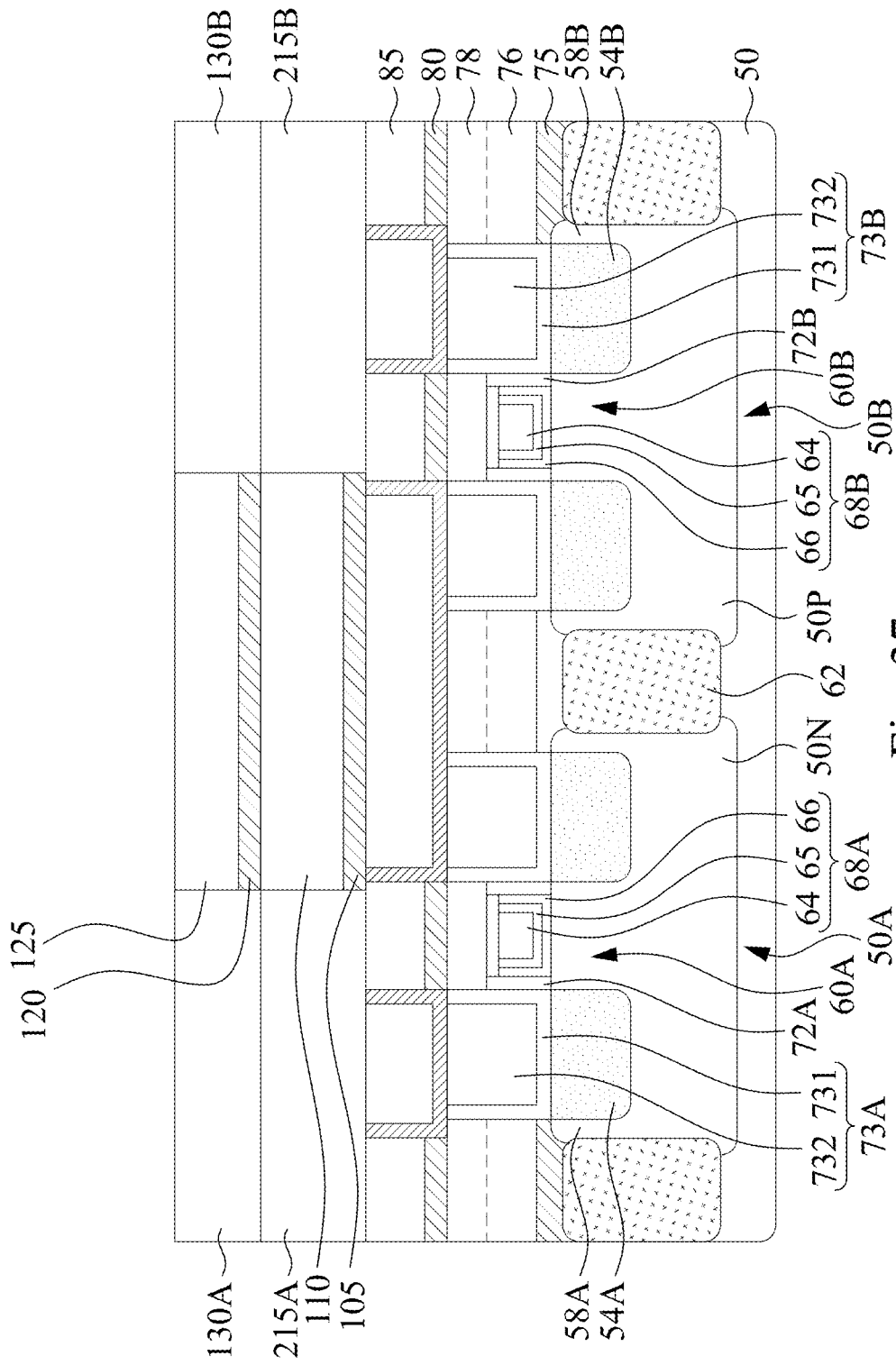

Reference is made to FIG. 37. A chemical mechanical polish (CMP) process is performed to remove excess materials of the resistive material layer 130 until the top surface of the ILD layer 125 is exposed. After the CMP process is completed, resistive switching layers 130A and 130B are formed, in which the resistive switching layers 130A and 130B each includes remaining portions of the resistive material layer 130. In some embodiments, the resistive switching layer 130A is over and in contact with the bottom electrode 215A, and the resistive switching layer 130B is over and in contact with the bottom electrode 215B.

Figure 38:
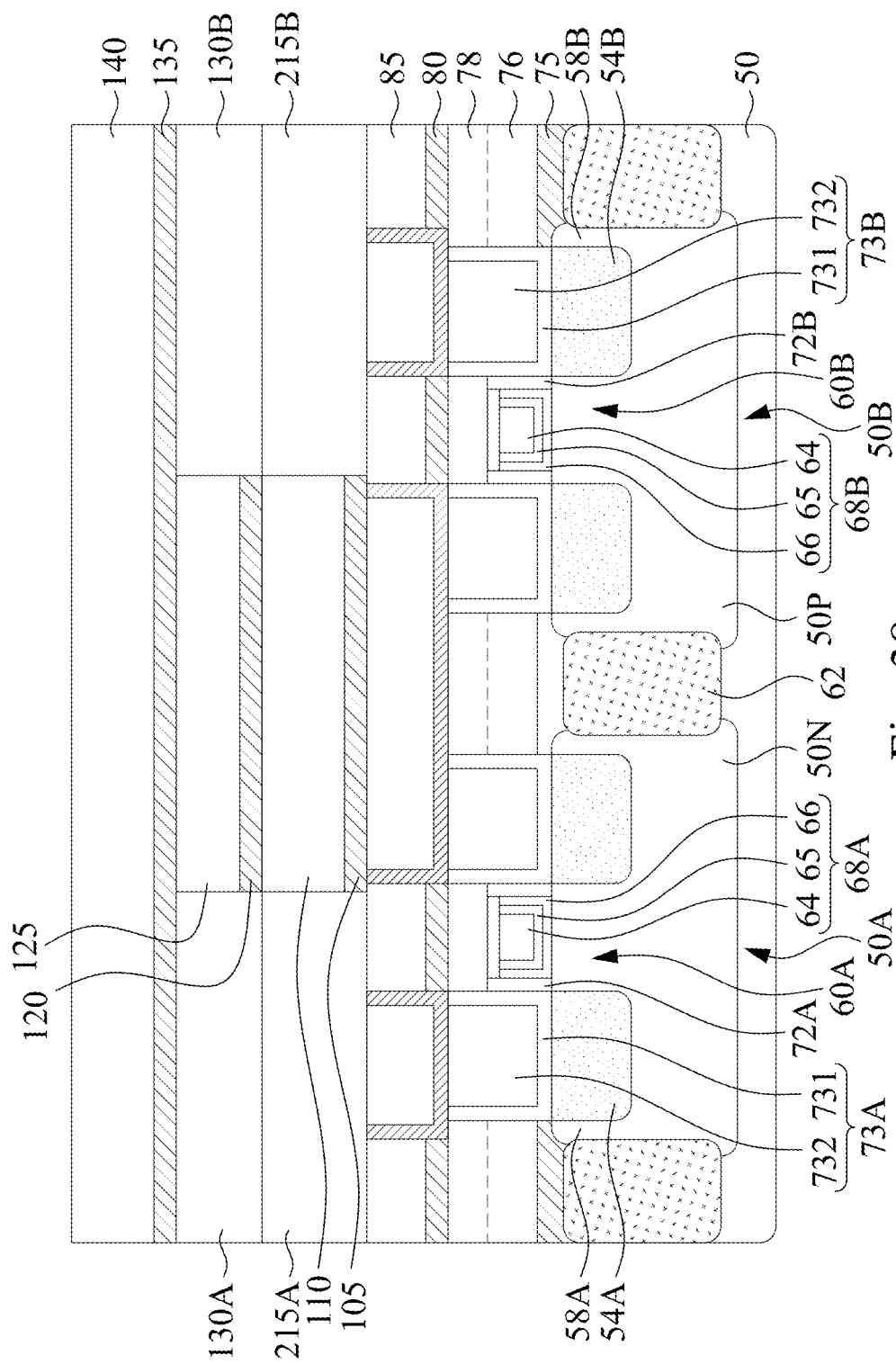

Reference is made to FIG. 38. An etch stop layer (ESL) 135 is deposited over ILD layer 125, and an interlayer dielectric (ILD) layer 140 is deposited over the ESL 135.

Figure 39:
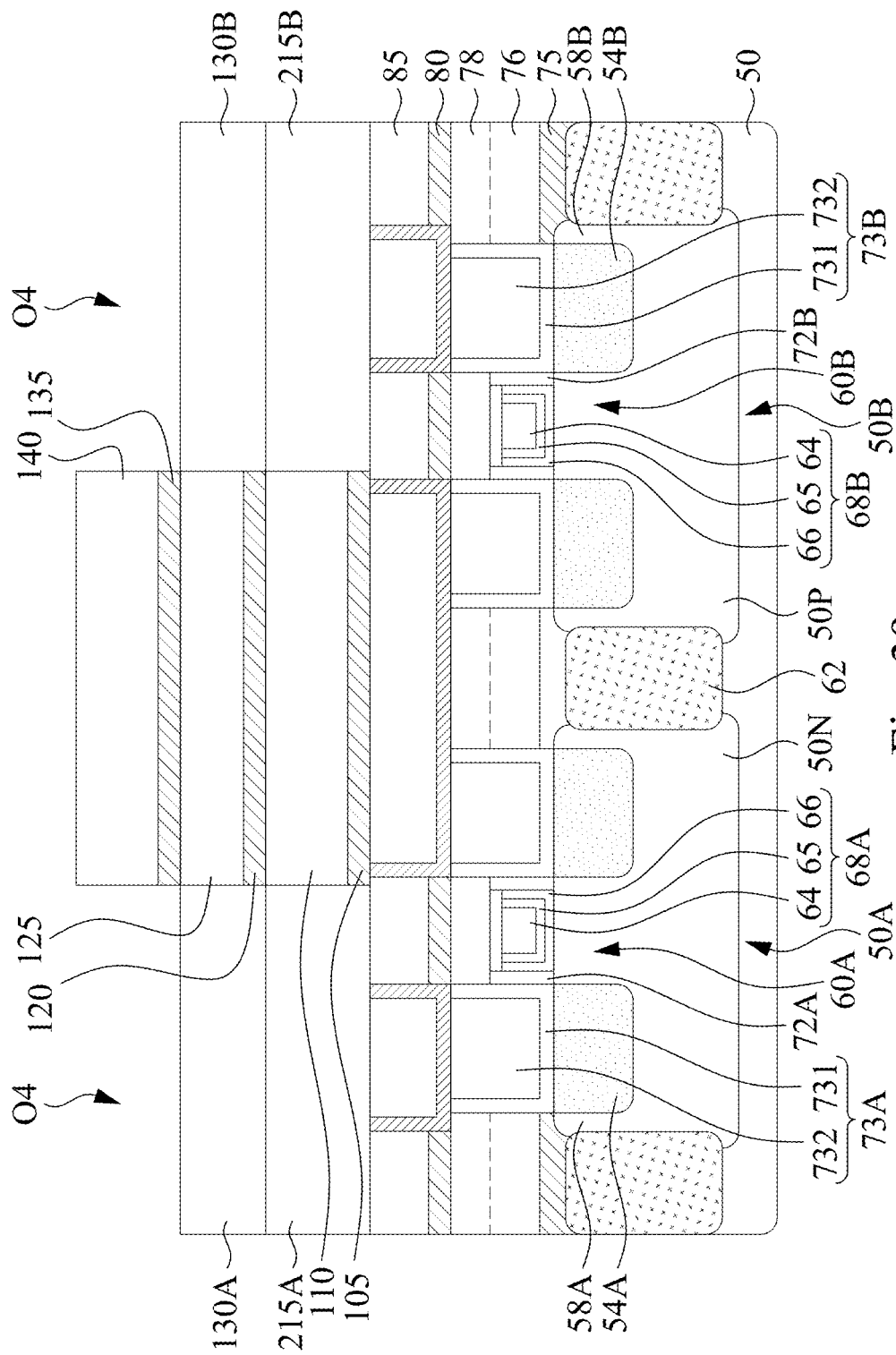

Reference is made to FIG. 39. The ESL 135 and the ILD layer 140 are patterned to form openings O4. The openings O4 may expose the resistive switching layers 130A and 130B, respectively.

Figure 40:
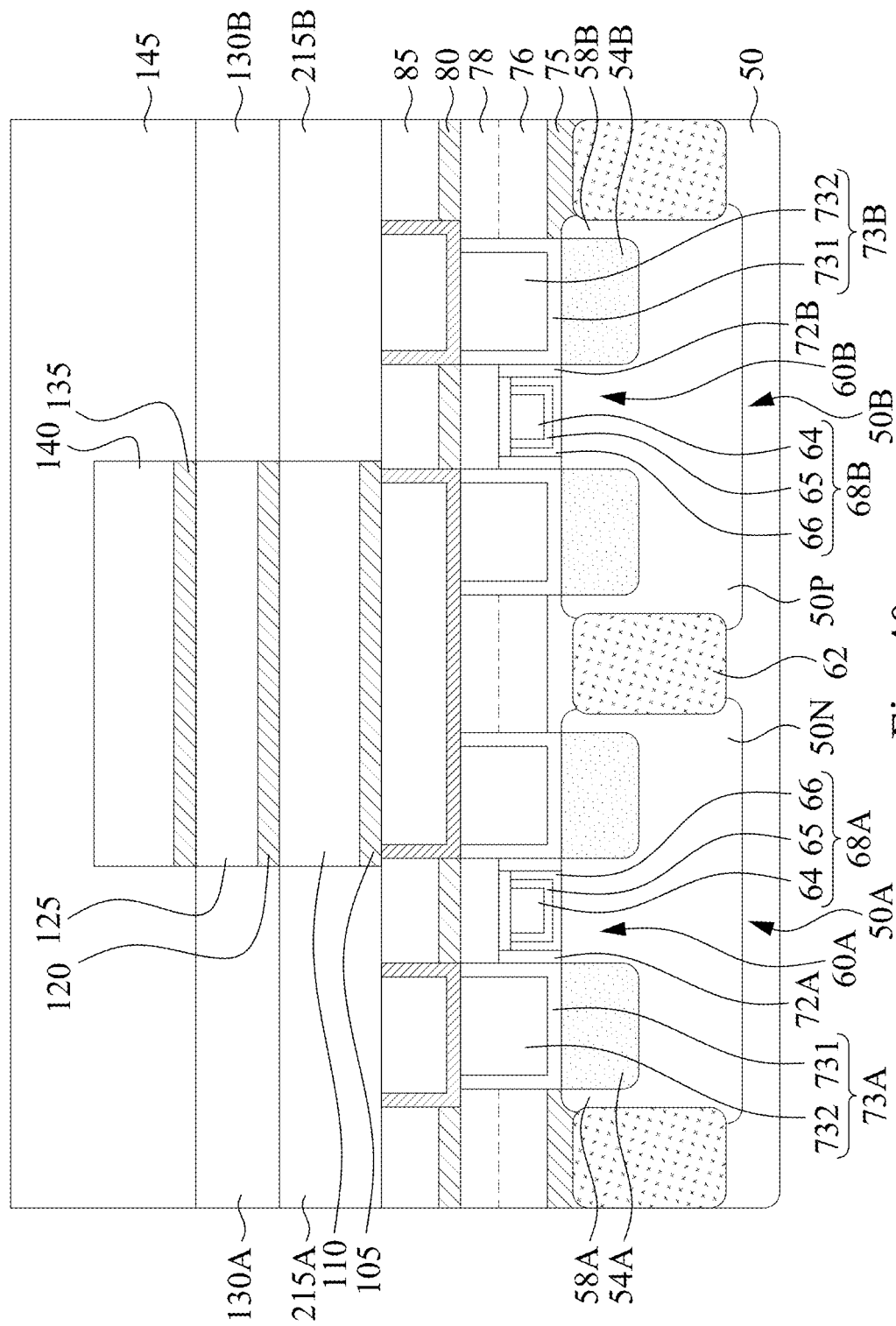

Reference is made to FIG. 40. A metal layer 145 is deposited over the ILD layer 110 and overfilling the openings O4. In some embodiments, the metal layer 145 may include a different metal from the metal layer 215. For example, material of the metal layer 145 may be made of gold (Au), while material of the metal layer 215 may be made of silver (Ag).

Figure 41:
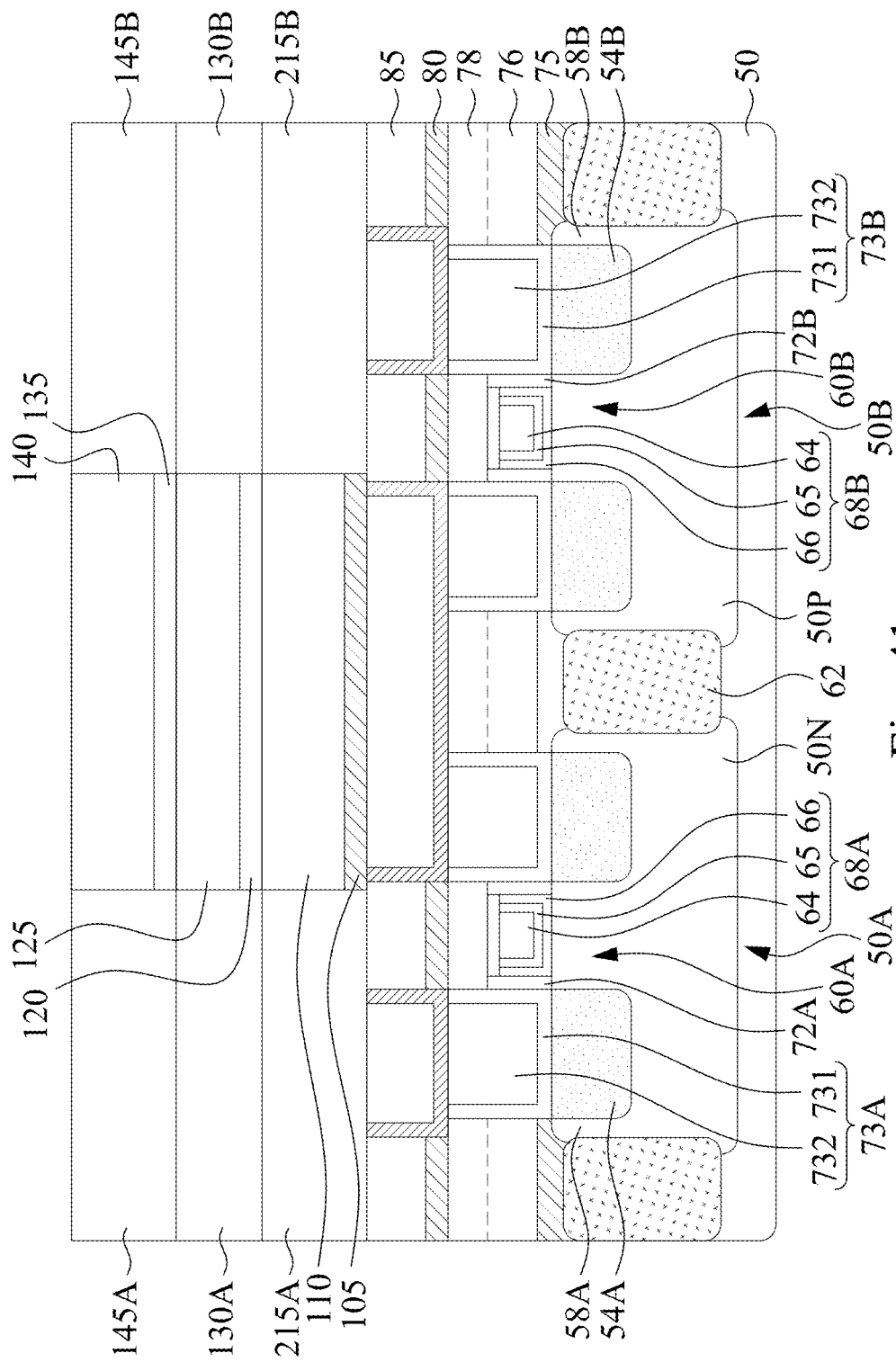

Reference is made to FIG. 41. A chemical mechanical polish (CMP) process is performed to remove excess materials of the metal layer 145 until the top surface of the ILD layer 140 is exposed. After the CMP process is completed, top electrodes 145A and 145B are formed, in which the top electrodes 145A and 145B each includes remaining portions of the metal layer 145. In some embodiments, the top electrode 145A is over and in contact with the resistive switching layer 130A, and the top electrode 145B is over and in contact with the resistive switching layer 130B.

FIGS. 42 to 53 illustrate a method in various stages of fabricating a memory device in accordance with some embodiments of the present disclosure. It is noted that the FIGS. 42 to 53 illustrate a method for forming the memory device 30 of FIGS. 3A and 3B. It is noted that some elements described in FIGS. 42 to 53 may be similar to those described in FIGS. 16 to 31, such elements are labeled the same, and relevant details will not be repeated for brevity.

Figure 42:
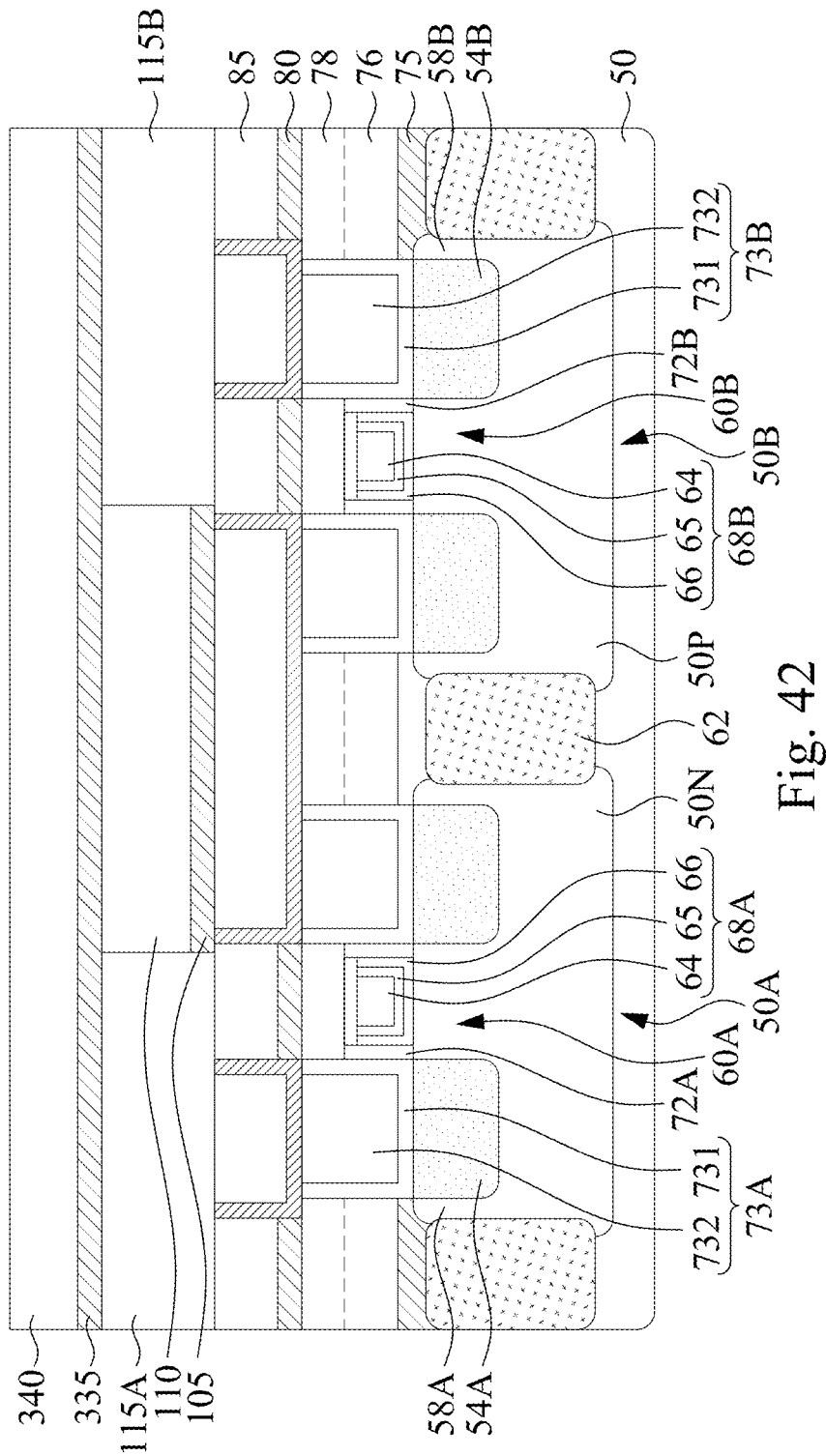
FIGS. 42 to 53 illustrate a method in various stages of fabricating a memory device in accordance with some embodiments of the present disclosure.

Reference is made to FIG. 42. An etch stop layer (ESL) 335 and an interlayer dielectric (ILD) layer 340 are deposited the structure of FIG. 23. In particular, the ESL 335 is deposited over ILD layer 110, and an interlayer dielectric (ILD) layer 340 is deposited over the ESL 335. In some embodiments, the ESL 335 includes one or more insulator layers (e.g., SiN, SiC, SiCN, SiCO, CN, combinations thereof, or the like) having an etch rate different than an etch rate of an overlying ILD layer 340. In some embodiments, the ILD layer 140 may include silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ESL 335 and the ILD layer 340 may be deposited using suitable method, such as CVD, physical vapor deposition (PVD), ALD, PEALD, PECVD, SACVD, FCVD, spin-on, and/or the like, or a combination thereof.

Figure 43:
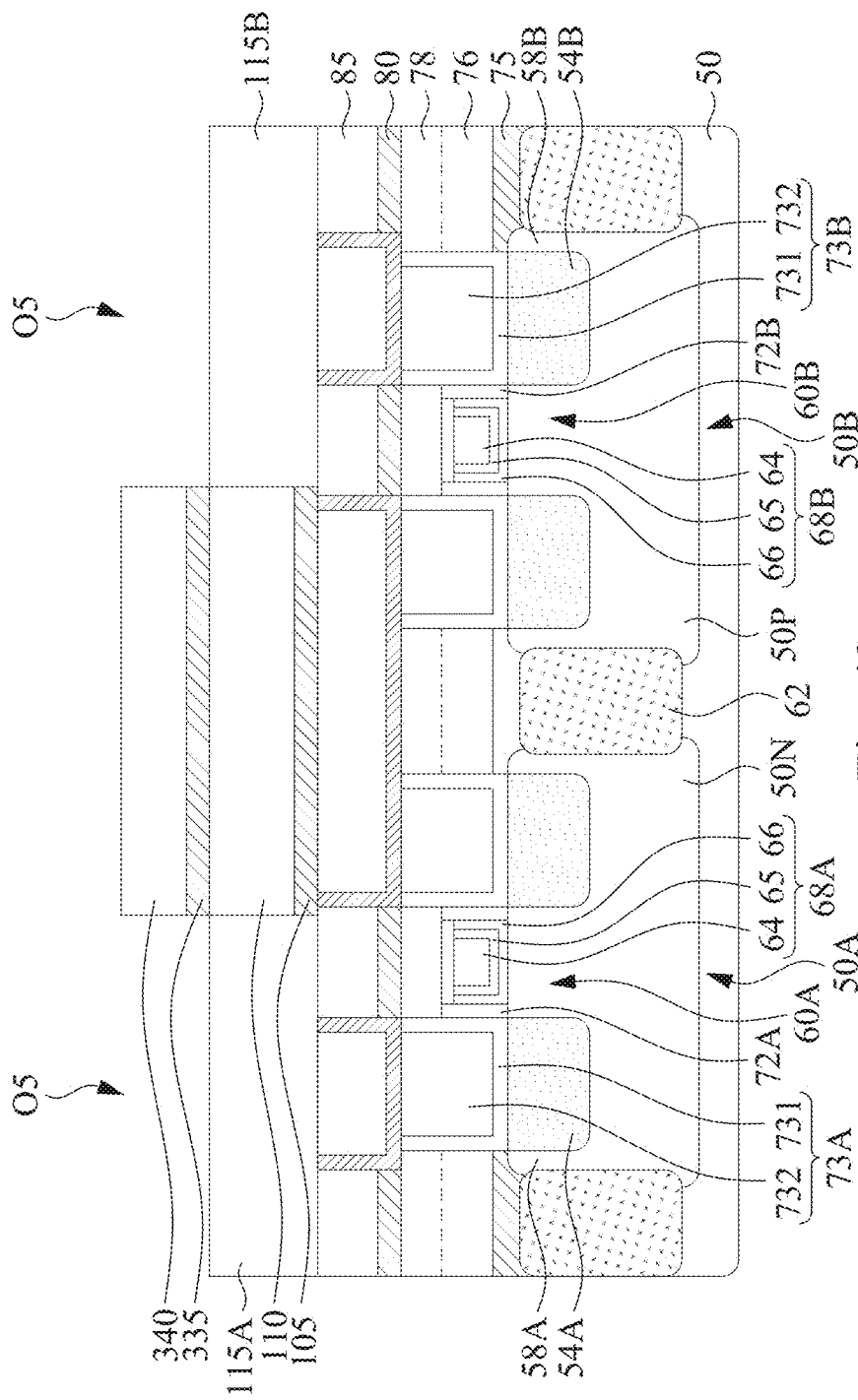

Reference is made to FIG. 43. The ESL 335 and the ILD layer 340 are patterned to form openings O5. The openings O5 may expose the metal layers 115A and 115B, respectively. In some embodiments, the openings O5 may be formed by, for example, forming a mask layer over the ILD layer 110, patterning the mask layer to expose unwanted portions of the ILD layer 110, and then performing an etching process to remove the unwanted portions of the ILD layer 110 and portions of the underlying ESL 115.

Figure 44:
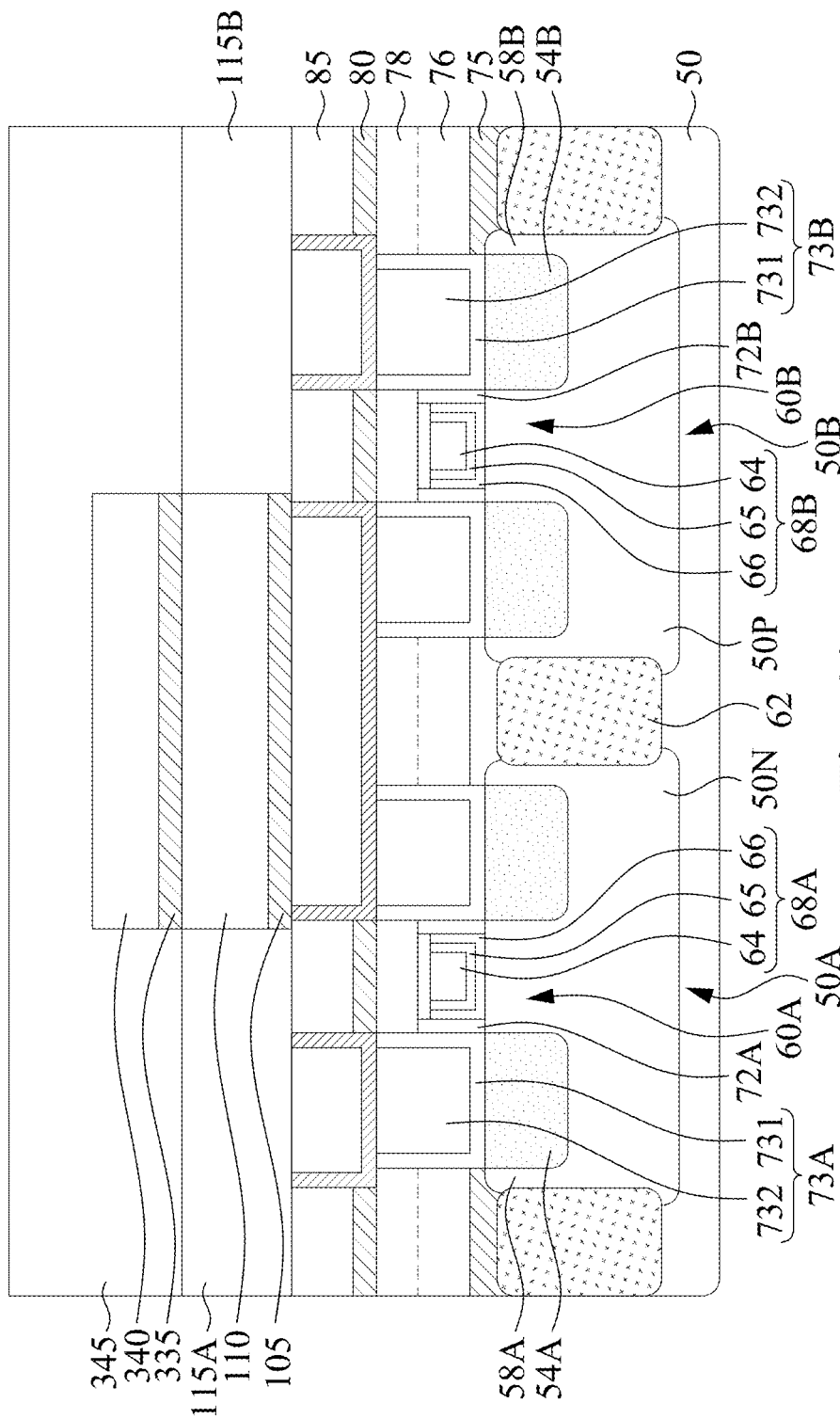

Reference is made to FIG. 44. A metal layer 345 is deposited over the ILD layer 340 and overfilling the openings O5. In some embodiments, the metal layer 345 may include a different metal from the metal layers 115A and 115B. For example, material of the metal layers 115A and 115B may be made of gold (Au), while material of the metal layer 345 may be made of silver (Ag).

Figure 45:
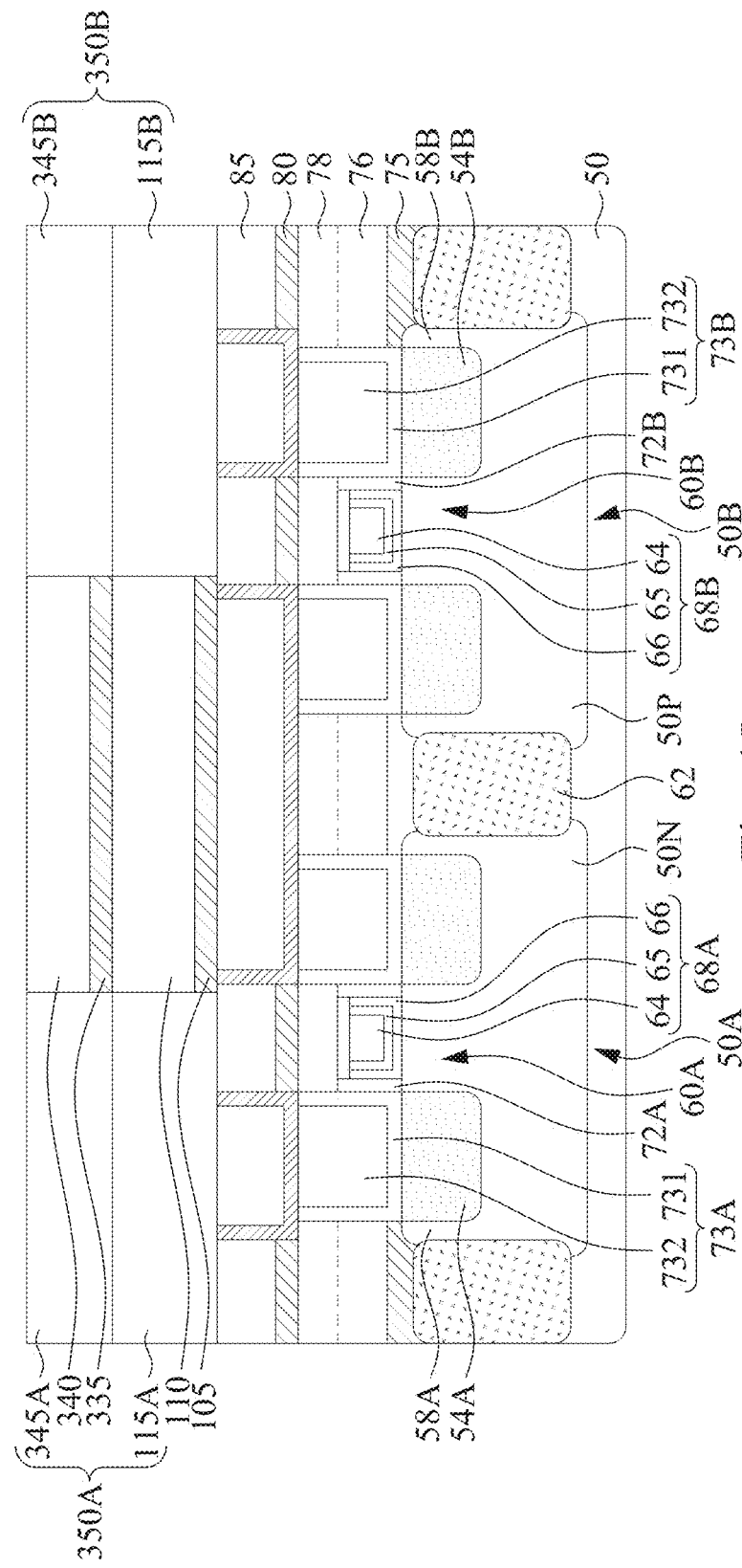

Reference is made to FIG. 45. A chemical mechanical polish (CMP) process is performed to remove excess materials of the metal layer 345 until the top surface of the ILD layer 340 is exposed. After the CMP process is completed, metal layers 345A and 345B are formed, in which the metal layers 345A and 345B each includes remaining portions of the metal layer 345. In some embodiments, the metal layer 345A is over and in contact with the metal layer 115A, and the metal layers 115A and 345A may be collectively referred to as a bottom electrode 350A. Similarly, the metal layer 345B is over and in contact with the metal layer 115B, and the metal layers 115B and 345B may be collectively referred to as a bottom electrode 350B.

Figure 46:
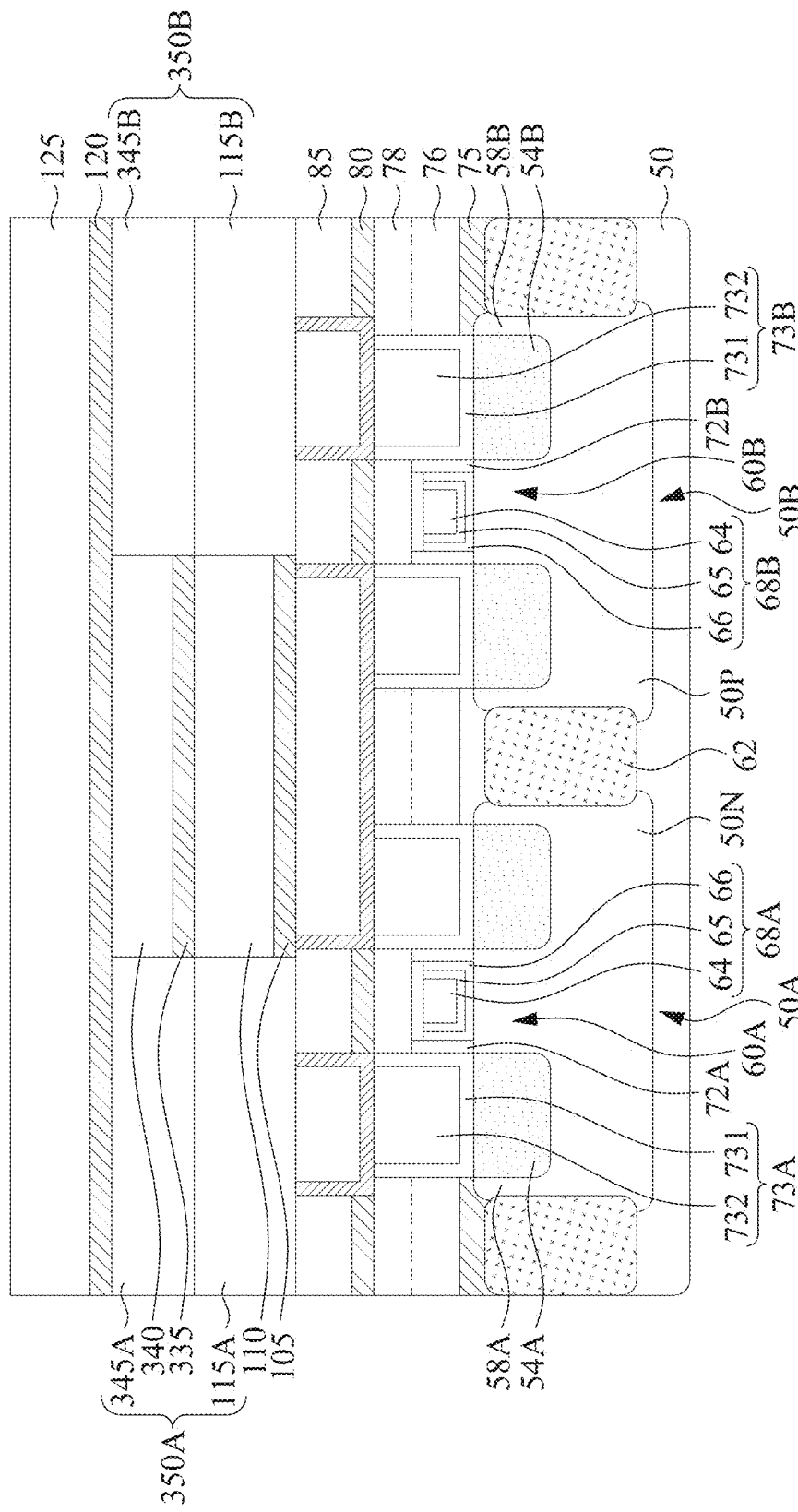

Reference is made to FIG. 46. An etch stop layer (ESL) 120 is deposited over ILD layer 340, and an interlayer dielectric (ILD) layer 125 is deposited over the ESL 120.

Figure 47:
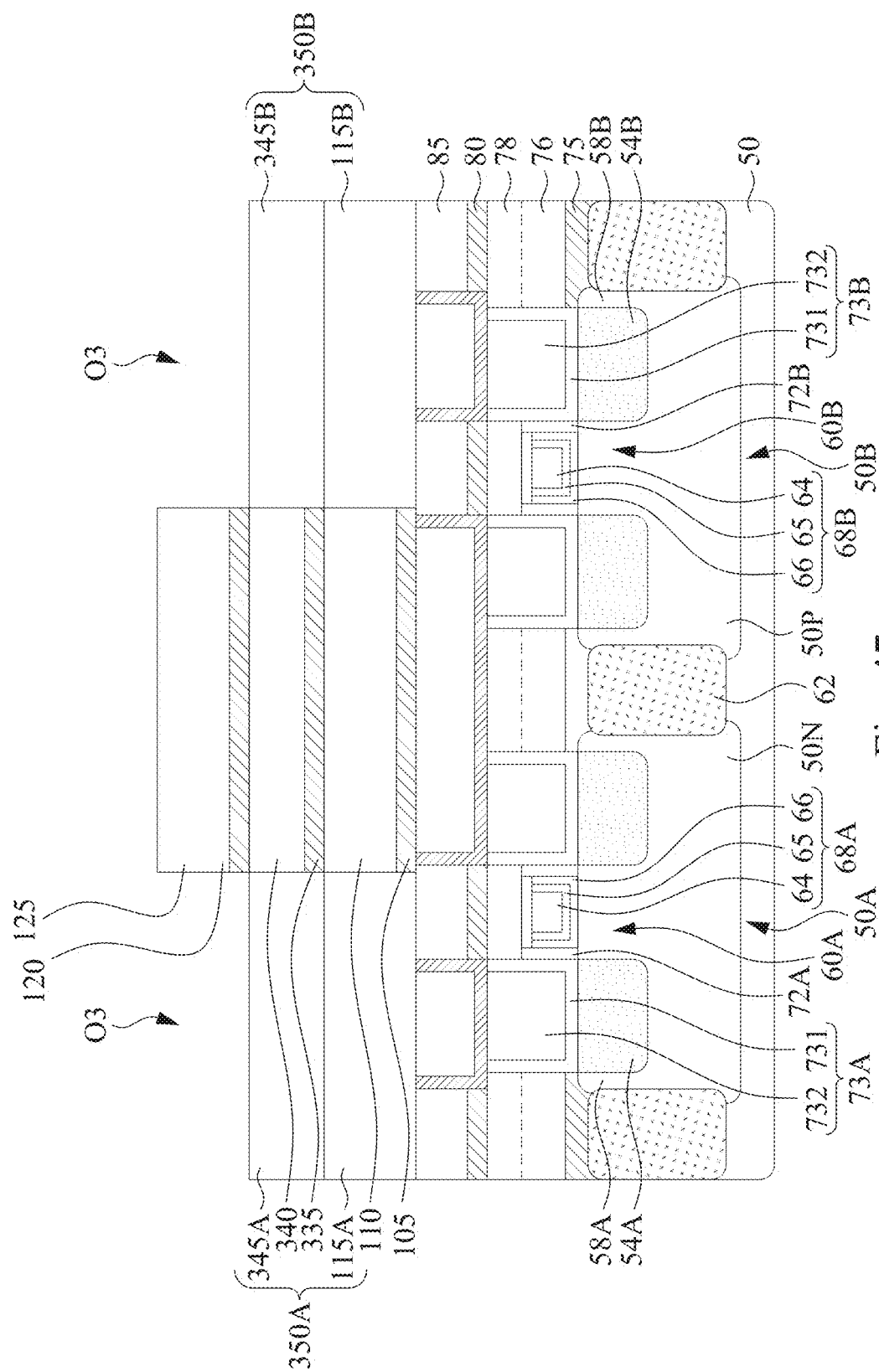

Reference is made to FIG. 47. The ESL 120 and the ILD layer 125 are patterned to form openings O3. The openings O3 may expose bottom electrodes 350A and 350B, respectively. In particular, the openings O3 expose the metal layers 345A and 345B, respectively.

Figure 48:
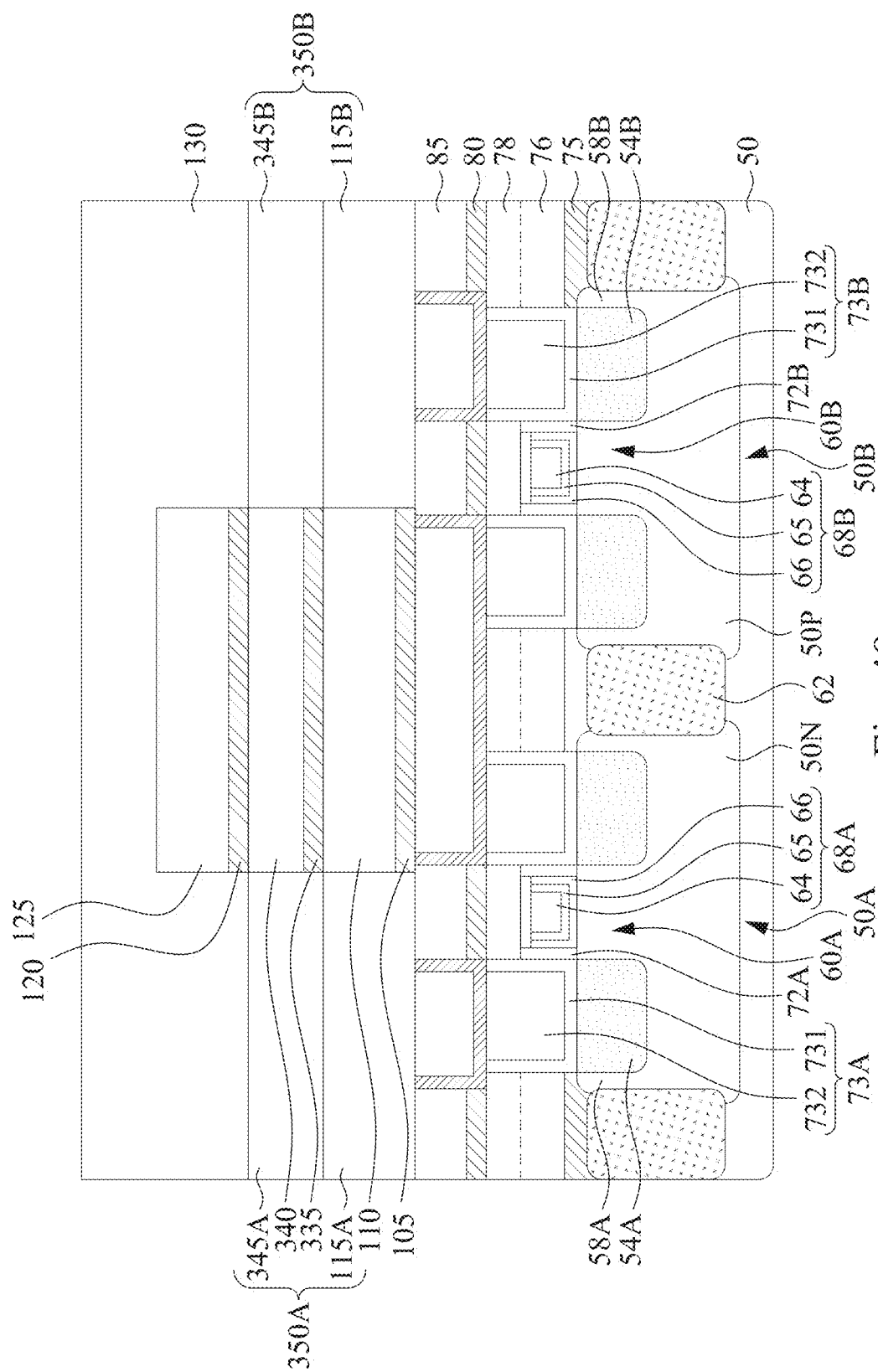

Reference is made to FIG. 48. A resistive material layer 130 is deposited over the ILD layer 125 and overfilling the openings O3. In some embodiments, material of the resistive material layer 130 may include metal halide materials, such as $PbI_2$, $CdI_2$, $PbCl_2$, $BiI_3$, or the like. In some embodiments, the resistive material layer 130 may be $BiI_3$.

Figure 49:
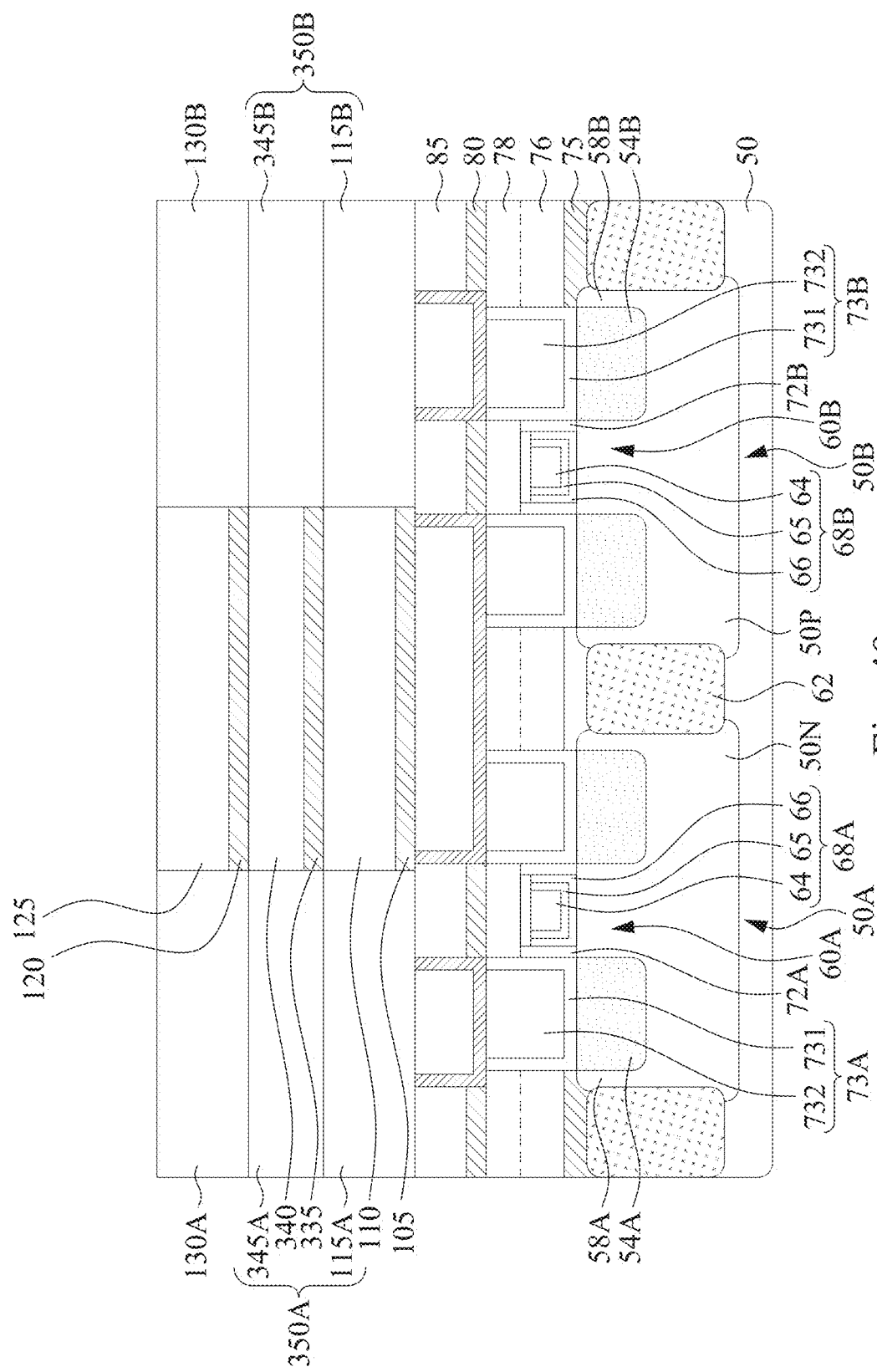

Reference is made to FIG. 49. A chemical mechanical polish (CMP) process is performed to remove excess materials of the resistive material layer 130 until the top surface of the ILD layer 125 is exposed. After the CMP process is completed, resistive switching layers 130A and 130B are formed, in which the resistive switching layers 130A and 130B each includes remaining portions of the resistive material layer 130. In some embodiments, the resistive switching layer 130A is over and in contact with the bottom electrode 350A, and the resistive switching layer 130B is over and in contact with the bottom electrode 350B. In particular, the resistive switching layer 130A is over and in contact with the metal layer 345A, and the resistive switching layer 130B is over and in contact with the metal layer 345B.

Figure 50:
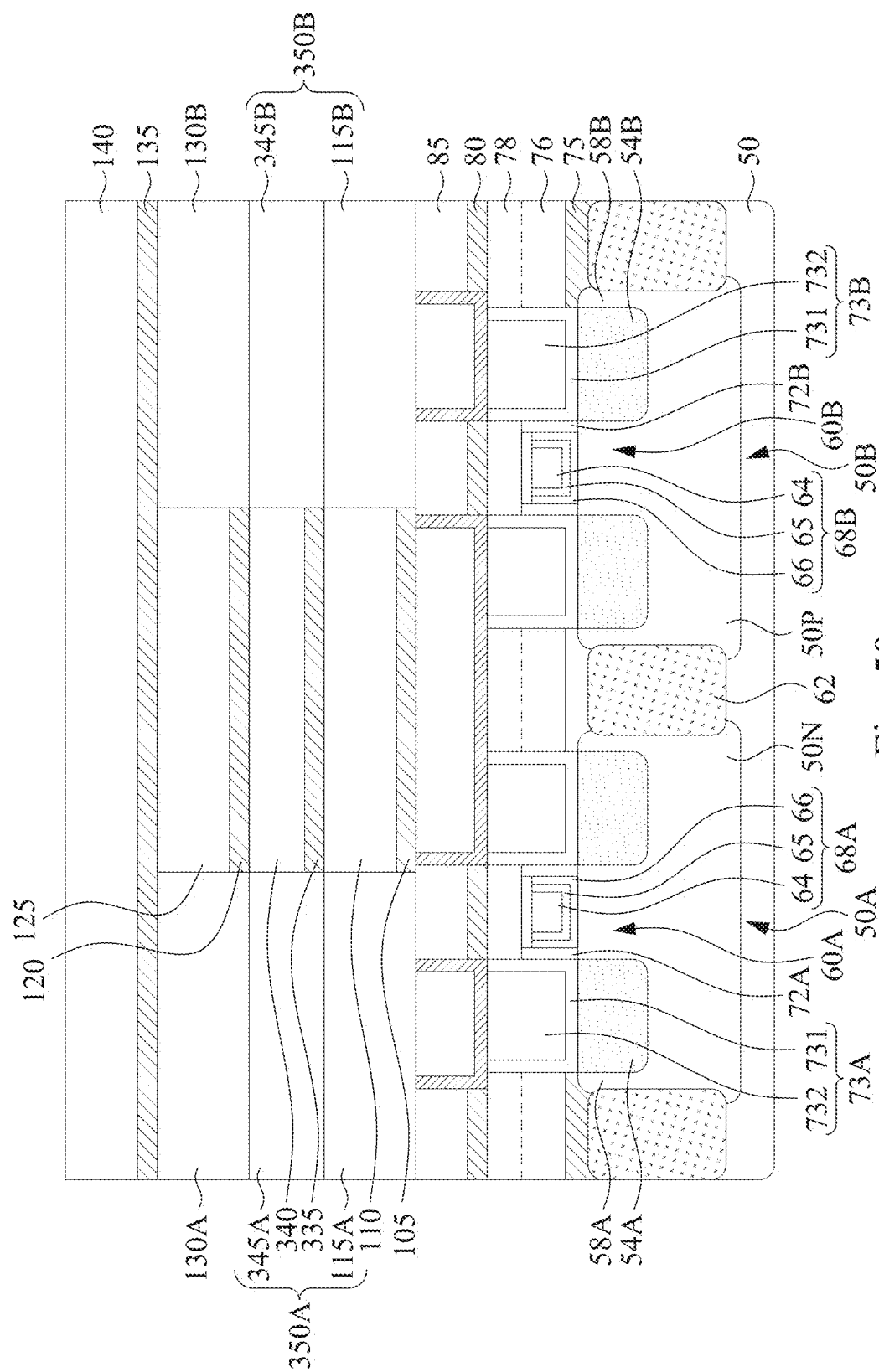

Reference is made to FIG. 50. An etch stop layer (ESL) 135 is deposited over ILD layer 125, and an interlayer dielectric (ILD) layer 140 is deposited over the ESL 135.

Figure 51:
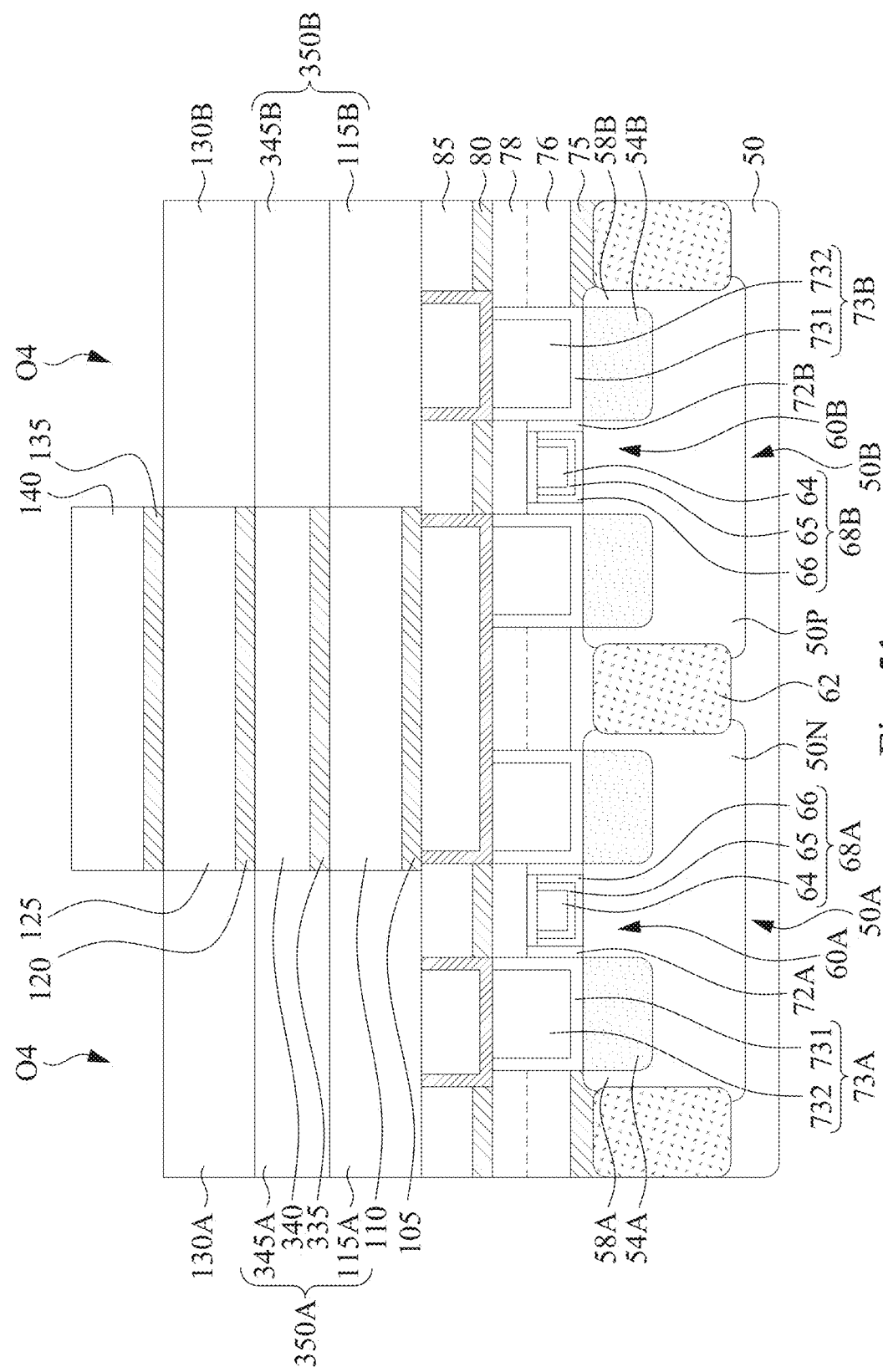

Reference is made to FIG. 51. The ESL 135 and the ILD layer 140 are patterned to form openings O4. The openings O4 may expose resistive switching layers 130A and 130B, respectively.

Figure 52:
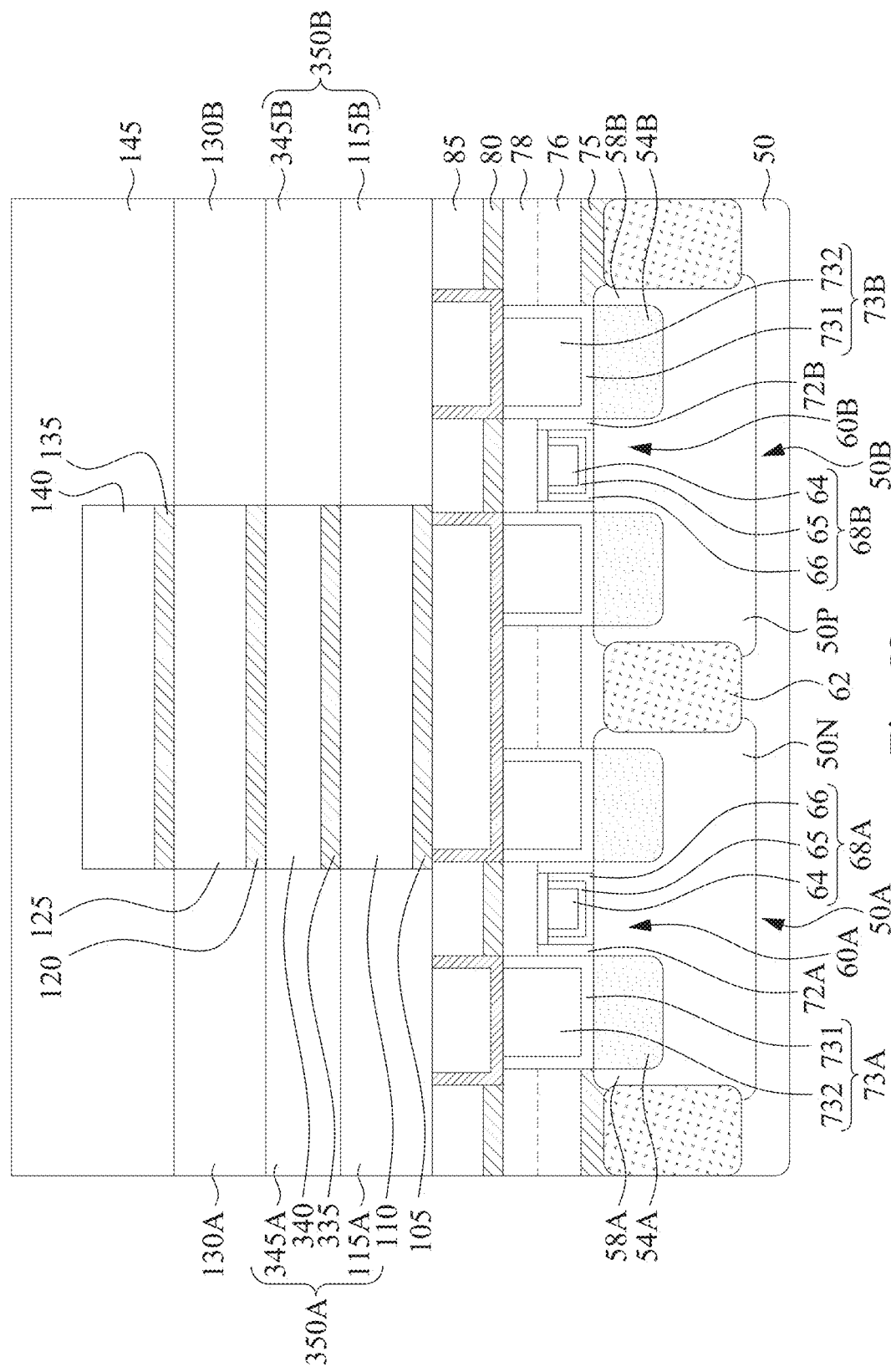

Reference is made to FIG. 52. A metal layer 145 is deposited over the ILD layer 110 and overfilling the openings O4. In some embodiments, the metal layer 145 may include a same material as the metal layers 115A and 115B, while the metal layer 145 may include a different metal from the metal layers 345A and 345B. For example, material of the metal layers 145, 115A, and 115B may be made of gold (Au), while material of the metal layers 345A and 345B may be made of silver (Ag).

Figure 53:
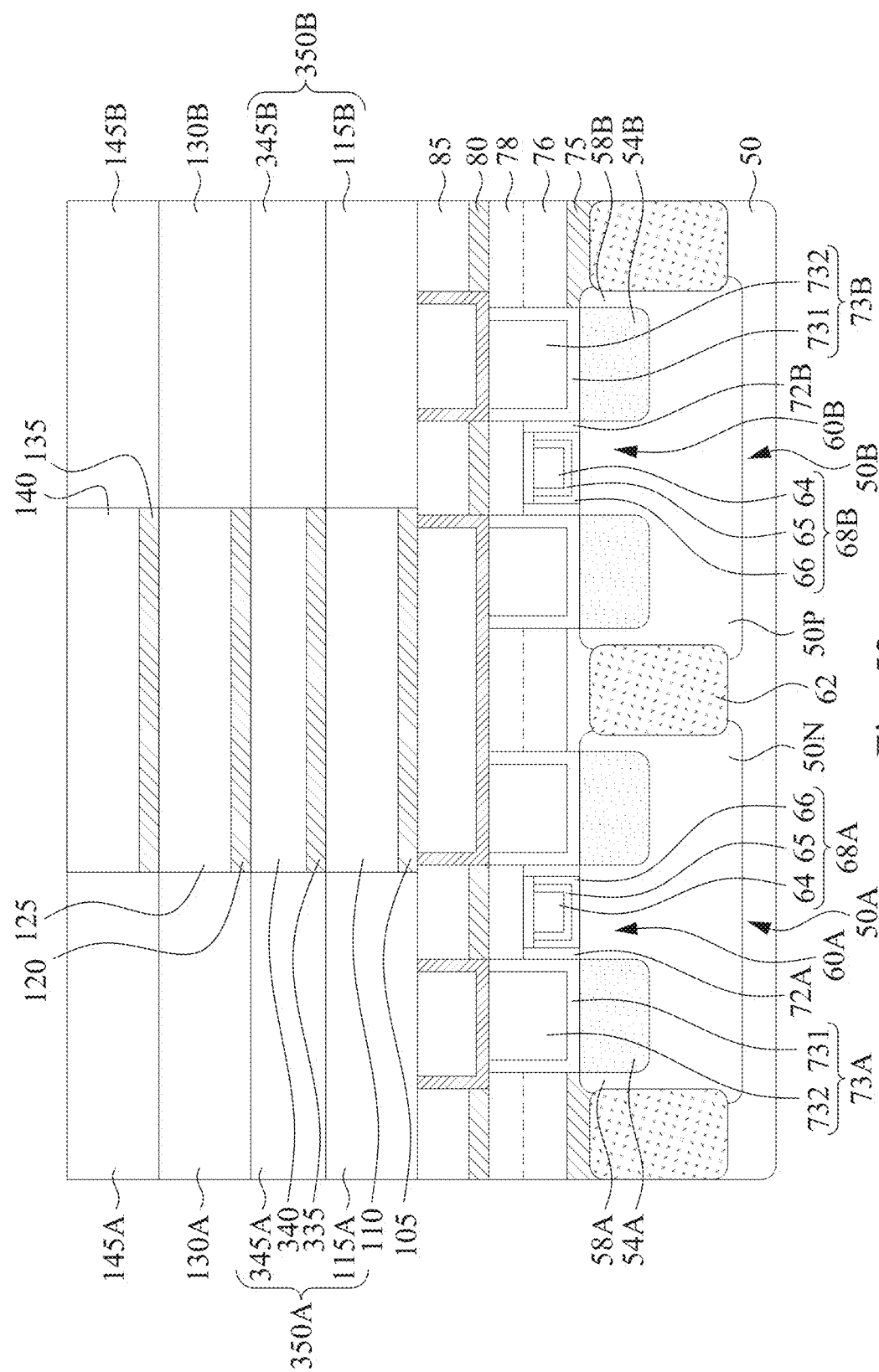

Reference is made to FIG. 53. A chemical mechanical polish (CMP) process is performed to remove excess materials of the metal layer 145 until the top surface of the ILD layer 140 is exposed. After the CMP process is completed, top electrodes 145A and 145B are formed, in which the top electrodes 145A and 145B each includes remaining portions of the metal layer 145. In some embodiments, the top electrode 145A is over and in contact with the resistive switching layer 130A, and the top electrode 145B is over and in contact with the resistive switching layer 130B.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that by using metal halide material as a resistive switching layer of a memory device, a nontoxic material application can be achieved. Furthermore, the resistive switching layer can be fabricated using thermal evaporation, which is an easy fabrication process. Moreover, the metal halide material includes a 2-D material structure, which provides mechanical flexibility. Another advantage is that by using silver (Ag) as a bottom electrode under the metal halide material, the film morphology can be improved, low operation voltage can be achieved, and the device performance can be improved.

In some embodiments of the present disclosure, a method includes forming a transistor over a substrate; and forming a resistive element over the transistor, in which forming the resistive element includes forming a bottom electrode electrically connected to a source/drain region of the transistor; forming a resistive switching layer over the bottom electrode, in which the resistive switching layer is made of metal halide; and forming a top electrode over the resistive switching layer.

In some embodiments, the bottom electrode chemically reacts with the resistive switching layer.

In some embodiments, forming the bottom electrode includes forming a first metal layer; and forming a second metal layer over the first metal layer, in which the second metal layer has a greater tendency to react with the metal halide of the resistive switching layer than the first metal layer.

In some embodiments, the first metal layer and the top electrode are made of a same material.

In some embodiments, a conductive filament is spontaneously formed in the resistive switching layer without applying bias to the bottom electrode and the top electrode.

In some embodiments, forming the resistive switching layer is performed such that a metal of the bottom electrode diffuses upwardly to a top surface of the resistive switching layer.

In some embodiments, the resistive switching layer is formed by a thermal deposition process.

In some embodiments of the present disclosure, a method includes forming a transistor over a substrate; forming a first interlayer dielectric (ILD) layer over the transistor; etching the first ILD layer to form a first opening; forming a first metal layer in the first opening, in which the first metal layer is electrically connected to the transistor; forming a second ILD layer over the first ILD layer and covering the first metal layer; etching the second ILD layer to form a second opening; forming a 2-D material resistive switching layer in the second opening and in contact with the first metal layer, in which the 2-D material resistive switching layer is a halogen-containing material; forming a third ILD layer over the second ILD layer; etching the third ILD layer to form a third opening; and forming a second metal layer in the third opening and in contact with the 2-D material resistive switching layer.

In some embodiments, the method further includes prior to forming the first ILD layer, forming a fourth ILD layer over the transistor; etching the fourth ILD layer to form a fourth opening; and forming a third metal layer in the fourth opening, in which the third metal layer and the second metal layer are made of a same material that is different from a material of the first metal layer.

In some embodiments, the first metal layer has a greater tendency to react with the 2-D material resistive switching layer than the second and third metal layers.

In some embodiments, forming the 2-D material resistive switching layer in the second opening including depositing a resistive material over the second ILD layer and overfilling the second opening; and performing a chemical mechanism polishing (CMP) to the resistive material until a top surface of the second ILD layer is exposed.

In some embodiments, the 2-D material resistive switching layer is made of metal halide.

In some embodiments, a conductive filament is spontaneously formed in the resistive switching layer prior to forming the second metal layer.

In some embodiments, the first metal layer is made of silver, the 2-D material resistive switching layer is made of $BiI_3$, and the second metal layer is made of gold.

In some embodiments of the present disclosure, a memory device includes a substrate, a transistor, and a resistive memory cell. The transistor is over the substrate, in which the transistor includes a gate structure and source/drain regions on opposite sides of the gate structure. The resistive memory cell is electrically connected to one of the source/drain regions of the transistors, in which the resistive memory cell includes a bottom electrode, a resistive switching layer over the bottom electrode, in which the resistive switching layer is made of metal halide, and a top electrode over the resistive switching layer.

In some embodiments, the resistive switching layer is a 2-D material.

In some embodiments, the bottom electrode is made of silver, and the top electrode is made of gold.

In some embodiments, the bottom electrode includes a first metal layer and a second metal layer over the first metal layer, the first metal layer and the top electrode are made of a same material that is different from a material of the second metal layer.

In some embodiments, the resistive switching layer is made of $BiI_3$.

In some embodiments, the memory device further includes a first etch stop layer and a first interlayer dielectric layer laterally surrounding the bottom electrode; a second etch stop layer and a second interlayer dielectric layer laterally surrounding the resistive switching layer; and a third etch stop layer and a third interlayer dielectric layer laterally surrounding the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a transistor over a substrate; and
forming a resistive element over the transistor, wherein forming the resistive element comprises:
  forming a bottom electrode electrically connected to a source/drain region of the transistor;
  forming a resistive switching layer over the bottom electrode, wherein the resistive switching layer is made of metal halide, wherein once the resistive switching layer is formed, a metal of the bottom electrode diffuses upwardly toward and reaches a top surface of the resistive switching layer; and
  forming a top electrode over the resistive switching layer.

2. The method of claim 1, wherein the bottom electrode chemically reacts with the resistive switching layer.

3. The method of claim 1, wherein forming the bottom electrode comprises:
forming a first metal layer; and
forming a second metal layer over the first metal layer, wherein the second metal layer has a greater tendency to react with the metal halide of the resistive switching layer than the first metal layer.

4. The method of claim 3, wherein the first metal layer and the top electrode are made of a same material.

5. The method of claim 1, wherein a conductive filament is spontaneously formed in the resistive switching layer without applying bias to the bottom electrode and the top electrode.

6. The method of claim 1, wherein the resistive switching layer is formed by a thermal deposition process.

7. A method, comprising:
forming a transistor over a substrate;
forming a first interlayer dielectric (ILD) layer over the transistor;
etching the first ILD layer to form a first opening;
forming a first metal layer in the first opening, wherein the first metal layer is electrically connected to the transistor;
forming a second ILD layer over the first ILD layer and covering the first metal layer;
etching the second ILD layer to form a second opening;
forming a 2-D material resistive switching layer in the second opening and in contact with the first metal layer, wherein the 2-D material resistive switching layer is a halogen-containing material, and wherein forming the 2-D material resistive switching layer is performed such that a metal of the first metal layer diffuses upwardly to a top surface of the 2-D material resistive switching layer;
forming a third ILD layer over the second ILD layer;
etching the third ILD layer to form a third opening; and
forming a second metal layer in the third opening and interfacing with the 2-D material resistive switching layer.

8. The method of claim 7, further comprising:
prior to forming the first ILD layer, forming a fourth ILD layer over the transistor;
etching the fourth ILD layer to form a fourth opening; and
forming a third metal layer in the fourth opening, wherein the third metal layer and the second metal layer are made of a same material that is different from a material of the first metal layer.

9. The method of claim 8, wherein the first metal layer has a greater tendency to react with the 2-D material resistive switching layer than the second and third metal layers.

10. The method of claim 7, wherein forming the 2-D material resistive switching layer in the second opening comprises:
depositing a resistive material over the second ILD layer and overfilling the second opening; and
performing a chemical mechanism polishing (CMP) to the resistive material until a top surface of the second ILD layer is exposed.

11. The method of claim 7, wherein the 2-D material resistive switching layer is made of metal halide.

12. The method of claim 7, wherein a conductive filament is spontaneously formed in the 2-D material resistive switching layer prior to forming the second metal layer.

13. The method of claim 7, wherein the first metal layer is made of silver, the 2-D material resistive switching layer is made of $BiI_3$, and the second metal layer is made of gold.

14. A memory device, comprising:
a substrate;
a transistor over the substrate, wherein the transistor comprises a gate structure and source/drain regions on opposite sides of the gate structure; and
a resistive memory cell electrically connected to one of the source/drain regions of the transistors, wherein the resistive memory cell comprises:
  a bottom electrode;
  a resistive switching layer over the bottom electrode, wherein the resistive switching layer is made of metal halide, and wherein a metal of the bottom electrode is detectable throughout the resistive switching layer; a top electrode over the resistive switching layer;
  a first etch stop layer and a first interlayer dielectric layer laterally surrounding the bottom electrode;
  a second etch stop layer and a second interlayer dielectric layer laterally surrounding the resistive switching layer; and
  a third etch stop layer and a third interlayer dielectric layer laterally surrounding the top electrode, wherein the top electrode interfaces with the resistive switching layer.

15. The memory device of claim 14, wherein the resistive switching layer is a 2-D material.

16. The memory device of claim 14, wherein the bottom electrode is made of silver and the top electrode is made of gold.

17. The memory device of claim 14, wherein the bottom electrode includes a first metal layer and a second metal layer over the first metal layer, the first metal layer and the top electrode are made of a same material that is different from a material of the second metal layer.

18. The memory device of claim 14, wherein the resistive switching layer is made of $BiI_3$.

19. The memory device of claim 14, wherein the resistive switching layer is made of $BiI_3$, and the bottom electrode comprises a silver (Ag) layer, wherein a thickness of the silver layer is at least 20 nm.

20. The memory device of claim 14, wherein the metal of the bottom electrode is detectable throughout the resistive switching layer prior to applying any bias to the resistive memory cell.

* * * * *